United States Patent
Yoshii et al.

(10) Patent No.: US 6,548,825 B1
(45) Date of Patent: Apr. 15, 2003

(54) SEMICONDUCTOR DEVICE INCLUDING BARRIER LAYER HAVING DISPERSED PARTICLES

(75) Inventors: Shigeo Yoshii, Osaka (JP); Kiyoshi Morimoto, Osaka (JP); Kiyoyuki Morita, Kyoto (JP); Haruyuki Sorada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/587,268

(22) Filed: Jun. 5, 2000

(30) Foreign Application Priority Data

| Jun. 4, 1999 | (JP) | 11-157511 |
| Jun. 4, 1999 | (JP) | 11-157516 |
| Dec. 6, 1999 | (JP) | 11-345775 |
| Feb. 3, 2000 | (JP) | 2000-025930 |
| Feb. 25, 2000 | (JP) | 2000-048820 |

(51) Int. Cl.$^7$ .................................. H01L 31/0328
(52) U.S. Cl. ............................. 257/24; 257/25
(58) Field of Search ............................. 257/9, 12–27, 257/321, 325, 314–326

(56) References Cited

U.S. PATENT DOCUMENTS

| 4,047,974 A | * 9/1977 | Harari ............... 438/288 |
| 4,104,675 A | * 8/1978 | DiMaria et al. ....... 257/325 |
| 5,670,790 A | * 9/1997 | Katoh et al. .......... 257/14 |
| 5,714,766 A | 2/1998 | Chen et al. |
| 5,952,692 A | 9/1999 | Nakazato et al. |
| 6,090,666 A | * 7/2000 | Ueda et al. .......... 438/257 |

FOREIGN PATENT DOCUMENTS

| EP | 0 843 361 | * 5/1998 |
| EP | 0 915 479 | * 5/1999 |
| JP | 7-111295 | 4/1995 |
| JP | 8-167662 | 6/1996 |
| JP | 9-116106 | 5/1997 |
| JP | 9-148462 | 6/1997 |
| JP | 10-65024 | 3/1998 |
| JP | 10-173181 | 6/1998 |
| JP | 10-200001 | 7/1998 |
| JP | 10-335499 | 12/1998 |
| JP | 11-40809 | 2/1999 |
| JP | 11-111867 | * 4/1999 |
| JP | 11-330273 | * 11/1999 |

OTHER PUBLICATIONS

English translation of the japanese document previously cited as Fukushima (JP 11–111867).*

Hanafi et al., Fast and Long Retention–Time Nano–Crystal Memory, Sep. 1996, IEEE Transactions on Electron Devices, vol. 43, No. 9, pp. 1553–1558.*

Tiwari et al. (1996) *Appl. Phys. Lett.* vol. 68 (No. 10), pp. 1377–1379.

* cited by examiner

*Primary Examiner*—Wael Fahmy
*Assistant Examiner*—Marcos D. Pizarro-Crespo
(74) *Attorney, Agent, or Firm*—Nixon Peabody LLP; Donald R. Studebaker

(57) ABSTRACT

The semiconductor device of the present invention includes: particles or interface states for passing charge formed on a p-type silicon substrate via a barrier layer; and particles for holding charge formed above the charge-passing particles via another barrier layer. The charge-holding particles are different from the charge-passing particles in parameters such as the particle diameter, the capacitance, the electron affinity, and the sum of electron affinity and forbidden bandwidth, to attain swift charge injection and release as well as stable charge holding in the charge-holding particles.

37 Claims, 57 Drawing Sheets

SEMICONDUCTOR DEVICE INCLUDING BARRIER LAYER HAVING DISPERSED PARTICLES

BACKGROUND OF THE INVENTION

The present invention relates to a semiconductor device including microparticles and the like for holding charge to permit use of the semiconductor device as a memory.

Existing ultralarge-scale integrated circuits (ULSI) have a memory section where a number of memory devices each composed of a MOS transistor are integrated. In recent years, demands have increased on the memory devices for higher operation speed, reduced power consumption, and prolonged recording retention. To respond to these demands, development of MOS transistors satisfying these demands is in progress.

Memory devices proposed and trial-produced so far employ a technique that quite a small amount of charge is injected into a microparticle of a semiconductor or the like during write or erase operation of the memory and the charge is held therein. An example of this conventional technique is a study by S. Tiwari et al. on a memory using a plurality of silicon microparticles (dots) (Appl. Phys. Lett. 68 (1996) 1377).

FIG. 57 is a cross-sectional view of the conventional semiconductor memory device functioning as a memory using a plurality of silicon microparticles. The semiconductor memory device includes a tunnel oxide film 6202 made of $SiO_2$ and a $SiO_2$ film 6204 deposited in this order on a p-type silicon substrate 6201. An n-type polysilicon electrode 6205 is formed on the $SiO_2$ film 6204. Silicon microparticles 6203 are buried between the tunnel oxide film 6202 and the $SiO_2$ film 6204. Source/drain regions 6206 are formed in portions of the p-type silicon substrate 6201 located below both sides of the n-type polysilicon electrode 6205.

In the above conventional semiconductor memory device, by applying a positive voltage to the n-type polysilicon electrode 6205, electrons can be injected into the silicon microparticles 6203 via the tunnel oxide film 6202. By applying a negative voltage to the n-type polysilicon electrode 6205, electrons in the silicon microparticles 6203 can be released. This enables the threshold voltage of the device to change depending on whether or not electrons exist in the silicon microparticles 6203. The levels (high or low) of the threshold voltage are made associated with information H (high) and information L (low), respectively. In this way, information writing/reading is realized.

The thickness of the tunnel oxide film 6202 is extremely small (about 1.5 nm to 4 nm). Therefore, the above electron injection process is by direct tunneling, not Fowler-Nordheim (FN) tunneling.

According to a study by the inventors of the present invention, a highly sophisticated and fine fabrication technique is required to attempt to implement the above proposed semiconductor device with practical performance.

For example, if the tunnel oxide film 6202 is too thick, charge injection by tunneling is difficult, resulting in difficulty in obtaining low-voltage operation and high-speed operation. On the contrary, if the tunnel oxide film 6202 is too thin, charge confinement is insufficient during charge holding, resulting in difficulty in long-term charge holding, that is, long-term information recording.

In addition, in order to provide practical characteristics for the conventional semiconductor device, required is a fabrication technique allowing for high-level control of the diameter of the silicon microparticles 6203 as well as the dispersion thereof. If the diameter of the silicon microparticles 6203 is too small or large to provide a sufficient surface density of the silicon microparticles 6203, the charge holding duration is too short or the allowable amount of charge held is too small, resulting in reduction of the reliability of the semiconductor device.

Moreover, in the case of an increase of thermal energy due to temperature rise, for example, charge accumulated in the silicon microparticles 6203 is released spontaneously due to tunneling from the silicon microparticles 6203 to the p-type silicon substrate 6201.

In view of the above, in order to provide practical device characteristics for the above conventional semiconductor device, it is necessary to control the quality and thickness of the tunnel oxide film 6202 uniformly with markedly high precision. It is also necessary to provide the silicon microparticles 6203 at a high surface density in a uniform dispersion state while ensuring a uniform diameter of the silicon microparticles 6203. A highly sophisticated fabrication technique is required to realize the above control over the entire surface of the p-type silicon substrate. In consideration of the above, if the conventional semiconductor device is actually fabricated in the above fabrication process, the possibility that the resultant semiconductor device has practical characteristics is small. Further, the fabricated conventional semiconductor device will be poor in reliability. In short, according to the study by the inventors of the present invention, it is difficult for the conventional semiconductor device to realize high-speed charge injection and release and long-term charge holding.

SUMMARY OF THE INVENTION

An object of the present invention is providing a semiconductor device with high reliability that can be easily fabricated, and a method for fabricating such a semiconductor device.

The first semiconductor device according to the present invention include: a substrate having a conductive layer; and charge holding region including a barrier layer formed on the conductive layer for functioning as a barrier against charge transfer and a plurality of particles dispersed in the barrier layer so that the particles have different distances from the conductive layer from each other. The capacitance of the particles is larger as the distance from the conductive layer is smaller.

As the capacitance is larger, potential rise during charge holding is smaller and thus charge transfer is easier. Therefore, it becomes easy for the particles located farther from the conductive layer to hold charge, or to release charge upon application of a voltage. This charge holding state can be used as information.

In the first semiconductor device, the capacitance is larger and charge transfer is easier as the particles are dispersed at a higher dispersion density or as the mean diameter of the particles is larger. Therefore, by varying these factors depending on the distance from the conductive layer, spontaneous release of accumulated charge can be effectively suppressed, resulting in prolonged charge holding in the charge holding region. This increases the reliability.

In the first semiconductor device, the particles are quantized. This facilitates control of charge injection and release with a voltage.

Preferably, the plurality of particles are divided into a plurality of particle groups each composed of a plurality of particles common in the distance from the conductive layer.

The semiconductor device further includes: an insulating layer formed on the barrier layer; a gate electrode formed on the insulating layer; and source/drain regions formed by introducing an impurity into regions of the substrate located below both sides of the gate electrode. The resultant semiconductor device functions as a MIS transistor.

The second semiconductor device according to the present invention includes: a substrate having a conductive layer; and a charge holding region including a barrier layer formed on the conductive layer for functioning as a barrier against charge transfer and a plurality of particles dispersed in the barrier layer so that the particles have different distances from the conductive layer from each other. The barrier height of inter-particle portions of the charge holding region is smaller as the distance from the conductive layer is smaller.

As the barrier height is smaller, charge transfer is easier. Therefore, it becomes easy for the particles located farther from the conductive layer to hold charge, or to release charge upon application of a voltage. This charge holding state can be used as information.

The particles may have a smaller electron affinity or a larger sum of the electron affinity and the forbidden bandwidth as the distance from the conductive layer is smaller. This makes it possible to easily provide a difference in barrier height among the inter-particle portions.

Alternatively, the barrier layer may have a larger electron affinity or a smaller sum of the electron affinity and the forbidden bandwidth as the distance from the conductive layer is smaller. This also makes it possible to easily provide a difference in barrier height among the inter-particle portions.

Preferably, the plurality of particles are divided into a plurality of particle groups each composed of a plurality of particles common in the distance from the conductive layer.

The third semiconductor device according to the present invention includes: a substrate having a conductive layer; a first tunnel barrier film formed on the conductive layer; a quantized semiconductor layer formed on the first tunnel barrier film; a second tunnel barrier film formed on the first tunnel barrier film and the semiconductor layer; quantized semiconductor particles formed on the second tunnel barrier film in the state of being isolated from one another; and an insulating film formed on the second tunnel barrier film and the semiconductor particles.

The formation of the quantized semiconductor layer permits control of electron transfer between the quantized semiconductor particles and the conductive layer. That is, since charge transfer occurs only when the potential at the energy level of the semiconductor particles and the potential at the energy level of the semiconductor layer match each other, spontaneous release of charge accumulated in the semiconductor particles can be effectively suppressed, allowing for prolonged charge holding in the semiconductor particles. In addition, under presence of an appropriate electric field, charge can be easily injected from the conductive layer into the semiconductor particles and released from the semiconductor particles toward the conductive layer. In this way, control of charge injection into, holding in, and release from the semiconductor particles is ensured. The resultant semiconductor device is a highly reliable device that responds to the request for prolonged recording retention while satisfying the request for high-speed operation and reduced power consumption.

The discrete energy width of the semiconductor layer is preferably smaller than the discrete energy width of the semiconductor particles.

The semiconductor layer may be a particle group composed of particles in contact with one another.

The fourth semiconductor device according to the present invention includes; a substrate having a conductive layer; a first barrier layer formed on the conductive layer for functioning as a barrier for charge transfer; quantized first particles formed on the first barrier layer; a second barrier layer formed on the first particles for functioning as a barrier for charge transfer; and second particles formed on the second barrier layer. The diameter of the second particles is larger than the diameter of the first particles.

During charge holding, the particles having a large diameter have a higher charge holding ability and thus a lower charge release probability than the particles having a small diameter. Utilizing this characteristic, the second particles can be used as an information holder.

The ratio of the diameter of the second particles to the first particles is not less than 1.8 and not more than 300. This makes it possible to appropriately adjust the charge holding function of the second particles and the function of the first particles as a charge passing member.

The diameter of the first particles is preferably not less than 0.1 nm and not more than 5 nm. The diameter of the second particles is preferably not less than 1 nm and not more than 30 nm.

The fifth semiconductor device according to the present invention includes: a substrate having a conductive layer; a first barrier layer formed on the conductive layer for functioning as a barrier for charge transfer; first particles formed on the first barrier layer; a second barrier layer formed on the first particles for functioning as a barrier for charge transfer; and second particles formed on the second barrier layer. The potential at the second particles against charge to be held or released is lower than the potential at the first particles.

The second particles having a lower potential have a charge holding ability higher than the first particles. Utilizing this characteristic, the second particles can be used as an information holder.

When the charge to be held or released is electrons, the electron affinity of the second particles is preferably larger than the electron affinity of the first particles. Further, when the conductive layer is a semiconductor layer, the electron affinity of the second particles is preferably larger than the electron affinity of the semiconductor layer When the charge to be held or released is holes, the sum of the electron affinity and the forbidden bandwidth of the second particles is preferably smaller than the sum of the electron affinity and the forbidden bandwidth of the first particles. Further, when the conductive layer is a semiconductor layer, the sum of the electron affinity and the forbidden bandwidth of the second particles is preferably smaller than the sum of the electron affinity and the forbidden bandwidth of the semiconductor layer.

The sixth semiconductor device according to the present invention includes: a substrate having a conductive layer; a first $SiO_2$ layer formed on the conductive layer; a $SiO_xN_y$ layer ($0 \leq x < 2$, $0 < y \leq 4/3$) formed on the first $SiO_2$ layer; a second $SiO_2$ layer formed on the $SiO_xN_y$ layer; and particles formed on the second $SiO_2$ layer.

Levels allowing for charge passing are generated in the vicinity of the interfaces between the $SiO_xN_y$ layer and the first and second $SiO_2$ layers and inside the $SiO_xN_y$ layer. This enables the particles to hold charge and thus be used as an information holder.

The seventh semiconductor device according to the present invention includes: a substrate having a conductive layer; a first insulating layer formed on the conductive layer; first particles formed on the first insulating layer; a first barrier layer formed on the first particles for functioning as a barrier for charge transfer; second particles formed on the first barrier layer; a second barrier layer formed on the second particles for functioning as a barrier for charge transfer; and third particles formed on the second barrier layer. The diameter of each of the first and third particles is larger than the diameter of the second particles.

The charge holding function of the first and third particles is higher than the charge holding function of the second particles. Utilizing this, charge exchange is possible between the first particles and the third particles via the second particles as a charge passing member. Thus, the first and third particles can be used as an information holder.

The ratio of the diameter of each of the first and third particles to the second particles is not less than 1.8 and not more than 300. This makes it possible to appropriately adjust the charge holding function of the first and third particles and the charge passing function of the second particles.

The diameter of the second particles is preferably not less than 0.1 nm and not more than 5 nm. The diameter of each of the first and third particles is preferably not less than 1 nm and not more than 30 nm.

The eighth semiconductor device according to the present invention includes: a substrate having a conductive layer; a first insulating layer formed on the conductive layer; first particles formed on the first insulating layer; a first barrier layer formed on the first particles for functioning as a barrier for charge transfer; second particles formed on the first barrier layer; a second barrier layer formed on the second particles for functioning as a barrier for charge transfer; and third particles formed on the second barrier layer. The potential at each of the first and third particles against charge to be held or released is lower than the potential at the second particles.

The charge holding function of the first and third particles is higher than the charge holding function of the second particles. Utilizing this, charge exchange is possible between the first particles and the third particles via the second particles as a charge passing member. Thus, the first and third particles can be used as an information holder.

When the charge to be held or released is electrons, the electron affinity of each of the first and third particles is preferably larger than the electron affinity of the second particles. When the charge to be held or released is holes, the sum of the electron affinity and the forbidden bandwidth of each of the first and third particles is preferably smaller than the sum of the electron affinity and the forbidden bandwidth of the second particles.

The ninth semiconductor device according to the present invention includes: a substrate having a conductive layer; an insulating layer formed on the conductive layer; first particles formed on the insulating layer; a first $SiO_2$ layer formed on the first particles; a $SiO_xN_y$ layer ($0 \leq x < 2$, $0 < y \leq 4/3$) formed on the first $SiO_2$ layer; a second $SiO_2$ layer formed on the $SiO_xN_y$ layer; and second particles formed on the second $SiO_2$ layer.

Levels allowing for passing charge are generated in the vicinity of the interfaces between the $SiO_xN_y$ layer and the first and second $SiO_2$ layers and inside the $SiO_xN_y$ layer. This enables the particles to hold charge and thus be used as an information holder.

The tenth semiconductor device according to the present invention includes: a substrate having a conductive layer; a barrier layer formed on the conductive layer for functioning as a barrier for charge transfer; a charge holder formed on the barrier layer; and quantized particles buried in at least part of the barrier layer.

It is possible to control charge transfer while using the particles as a charge passing member between the charge holder and the conductive layer. If quantized particles are used, in particular, the resultant semiconductor device is usable as a memory permitting high-speed writing and erasing.

The eleventh semiconductor device according to the present invention includes: a substrate having a conductive layer; a first $SiO_2$ layer formed on the conductive layer; a $SiO_xN_y$ layer ($0 \leq x < 2$, $0 < y \leq 4/3$) formed on the first $SiO_2$ layer; a second $SiO_2$ layer formed on the $SiO_xN_y$ layer; and a charge holder formed on the second $SiO_2$ layer.

Levels allowing for passing charge are generated in the vicinity of the interfaces between the $SiO_xN_y$ layer and the first and second $SiO_2$ layers and inside the $SiO_xN_y$ layer. Therefore, the resultant semiconductor device is usable as a memory permitting high-speed write/erase operations.

DESCRIPTION OF THE PREFERRED EMBODIMENTS

Embodiment 1

Structure of Semiconductor Device of Embodiment 1

Figure 1:
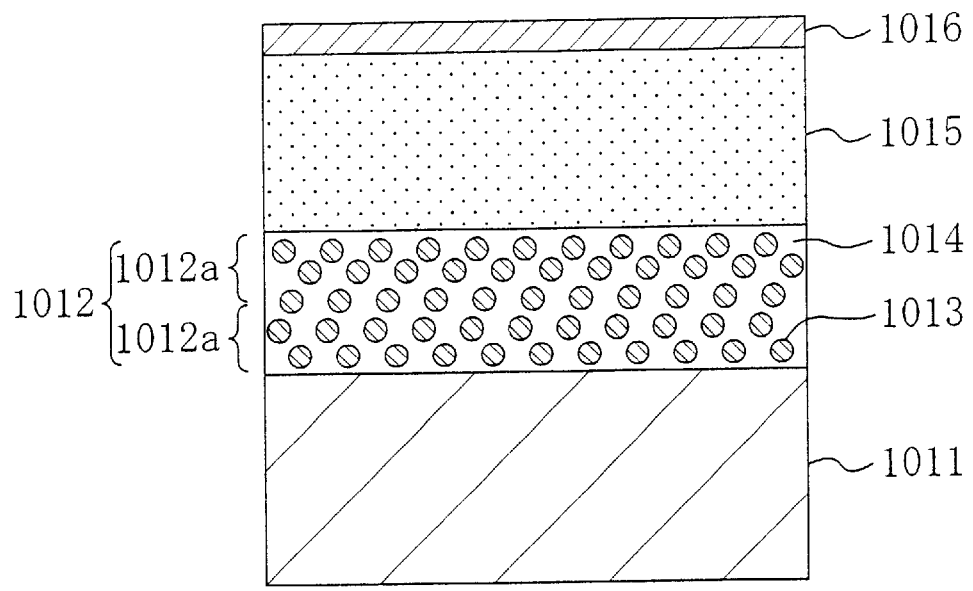
FIG. 1 is a cross-sectional view of a semiconductor device of EMBODIMENT 1 of the present invention.

FIG. 1 is a cross-sectional view of a semiconductor device of EMBODIMENT 1 of the present invention. The semiconductor device includes a charge holding region 1012 (thickness: about 20 nm) composed of a plurality of microparticle dispersed portions 1012a, a $SiO_2$ film 1015 (thickness: 20 nm) functioning as the insulating film, and an n-type polysilicon electrode 1016 functioning as the upper electrode, which are formed in this order on a p-type silicon substrate 1011. In the respective microparticle dispersed portions 1012a, silicon microparticles 1013 (particle diameter: 5 nm) are dispersed in a $SiO_2$ insulator 1014. The portions (matrix) of the microparticle dispersed layers 1012a other than the dispersed microparticles may be a semiconductor having a band gap larger than the microparticles. Preferably, the thickness of the $SiO_2$ film 1015 is in the range of 5 to 20 nm, the diameter of the silicon microparticles 1013 is in the range of about 2 to 10 nm, and the dispersion density of the silicon microparticles 1013 is in the range of about $1 \times 10^{17}$ cm$^{-3}$ to $1 \times 10^{20}$ cm$^{-3}$.

Fabrication Process of Semiconductor Device of Embodiment 1

Figure 13A:
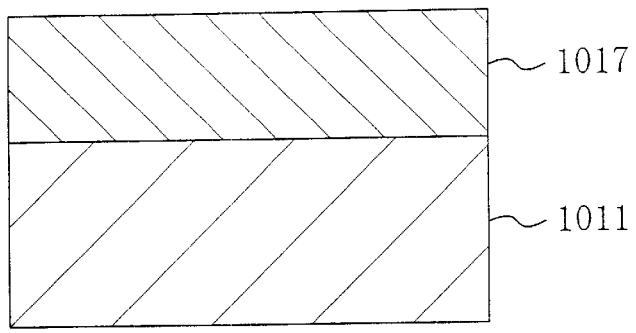
FIGS. 13(a), 13(b), and 13(c) are cross-sectional views illustrating the fabrication steps of the semiconductor device of EMBODIMENT 1.
Figure 13B:
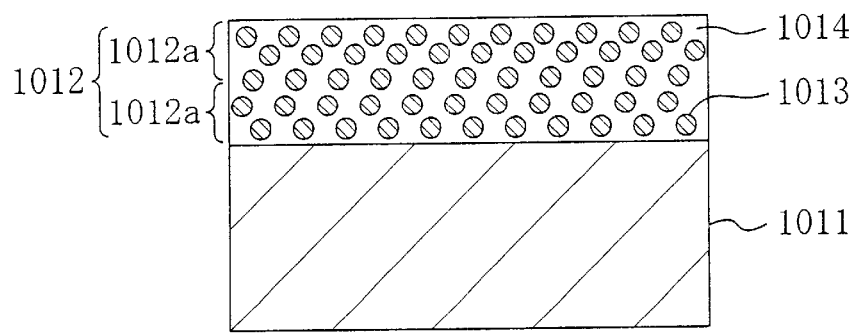
Figure 13C:
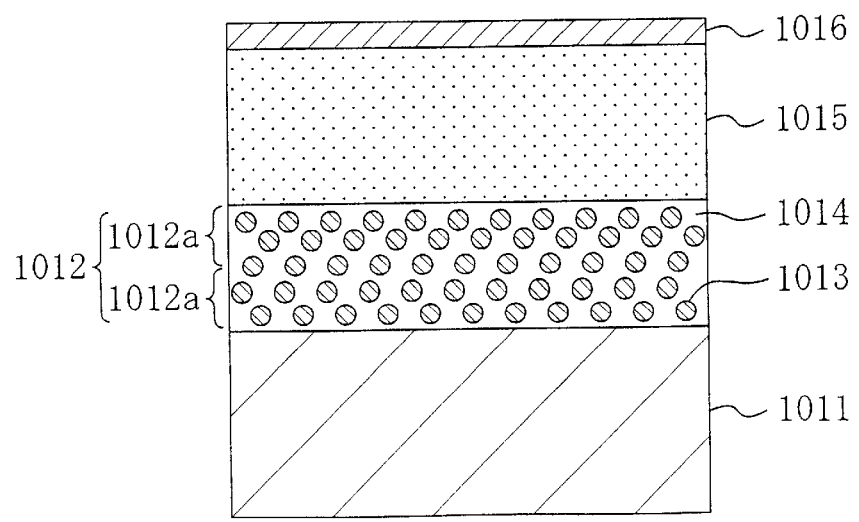

FIGS. 13(a), 13(b), and 13(c) are cross-sectional views showing the fabrication steps of the semiconductor device of EMBODIMENT 1.

In the step shown in FIG. 13(a), silicon tablets are put on a $SiO_2$ plate in a sputtering apparatus where the ptype silicon substrate 1011 is placed, and are subjected to bombardment by accelerated ions. Atoms and molecules of the silicon tablets released by the bombardment are deposited on the p-type silicon substrate 1011 forming a layer 1017.

In the step shown in FIG. 13(b), the resultant substrate is subjected to heat treatment. By these steps, there is formed a film where the silicon microparticles 1013 have separated out in the $SiO_2$ insulator 1014, that is, the charge holding region 1012 composed of a plurality of microparticles dispersed portions 1012a.

In the step shown in FIG. 13(c), the resultant substrate is placed on a susceptor in a chamber of a chemical vapor deposition (CVD) apparatus, to deposit the $SiO_2$ film 1015 on the charge holding region 1012. Subsequently, in the same chamber, the n-type polysilicon electrode 1016 is deposited on the $SiO_2$ film 1015.

Figure 57:
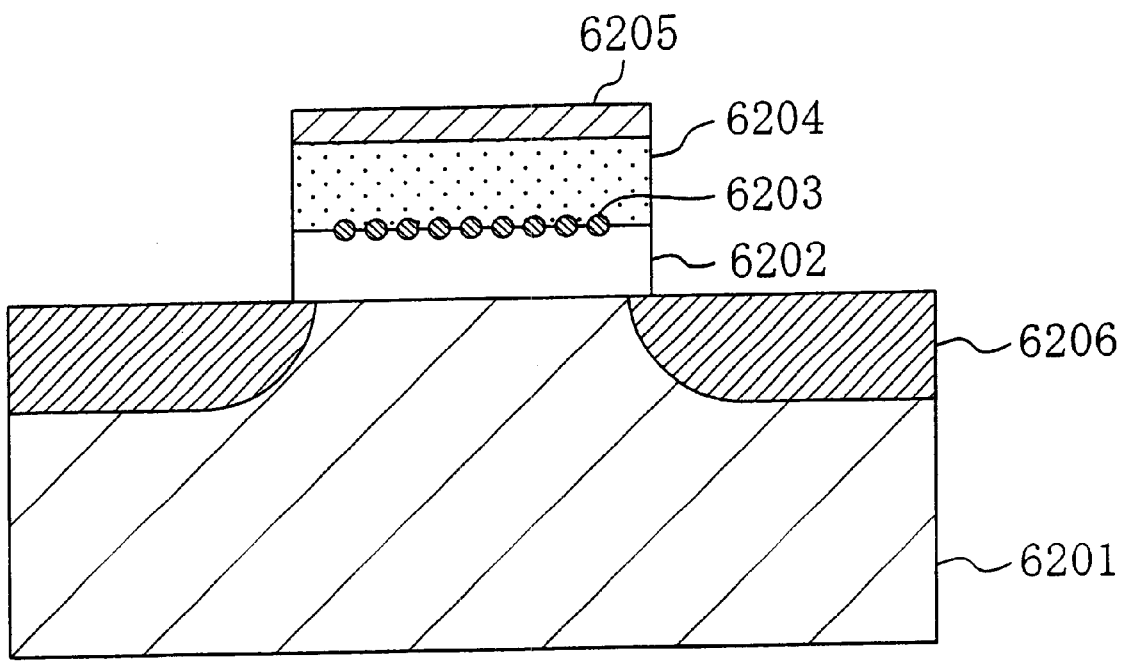
FIG. 57 is a cross-sectional view of a conventional semiconductor memory device using a plurality of silicon microparticles functioning as a memory.

Electron Injection, Holding, and Release Mechanism of Conventional Semiconductor Device As described above, the conventional semiconductor device shown in FIG. 57 includes the tunnel oxide film 6202 made of a $SiO_2$ film and the $SiO_2$ film 6204 deposited in this order on the p-type silicon substrate 6201. The n-type polysilicon electrode 6205 is formed on the resultant substrate. The silicon microparticles 6203 are buried between the tunnel oxide film 6202 and the $SiO_2$ film 6204.

Figure 2:
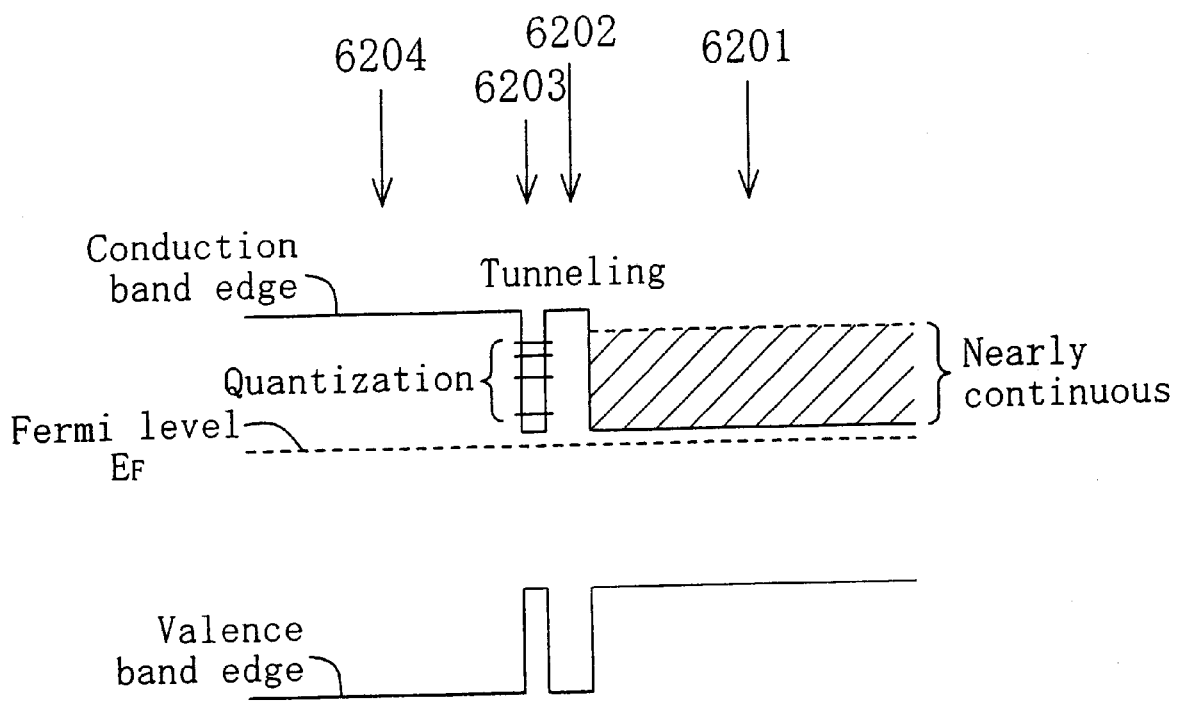
FIG. 2 is an energy band diagram of the $SiO_2$ film, the silicon microparticles, the tunnel oxide film, and the p-type silicon substrate of the conventional semiconductor device.

FIG. 2 is an energy band diagram of the $SiO_2$ film 6204, the silicon microparticles 6203, the tunnel oxide film 6202, and the p-type silicon substrate 6201 of the conventional semiconductor device shown in FIG. 57. Since the diameter of the silicon microparticles 6203 is extremely small, the energy states (energy levels) to be given by electrons in the silicon microparticle 6203 have been quantized. In this conventional semiconductor device, electron injection into and electron release from the silicon microparticles 6203 occur by tunneling between the p-type silicon substrate 6201 and the silicon microparticles 6203.

Figure 3A:
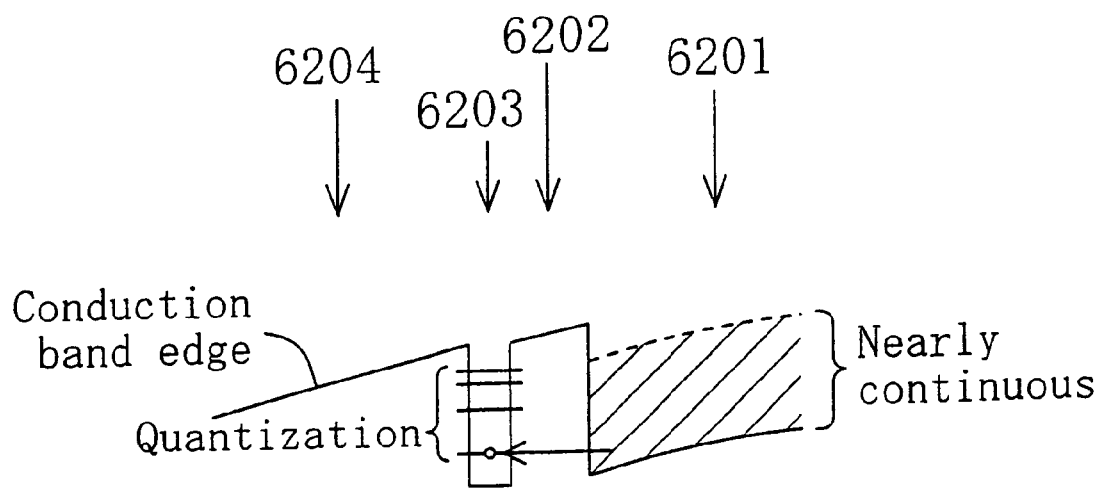
FIGS. 3(a) and 3(b) are partial band diagrams showing the energy band states during electron injection and holding in the conventional semiconductor device.
Figure 3B:
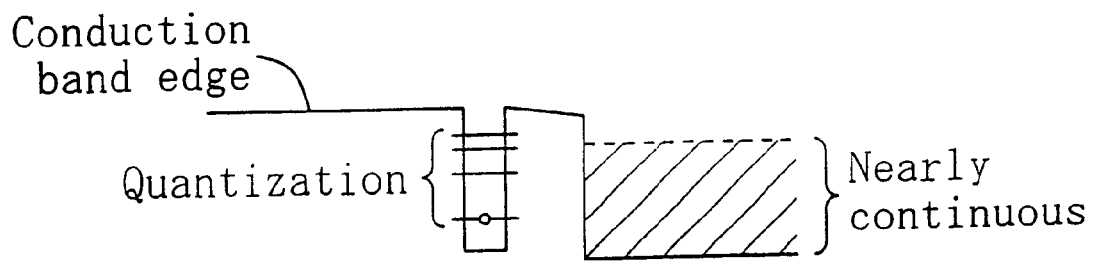

FIGS. 3(a) and 3(b) are partial band diagrams showing the energy band states during electron injection and holding, respectively, in the conventional semiconductor device. In FIG. 3(a) and 3(b), the valence band is omitted for easy understanding.

Referring to FIG. 3(a), when a positive voltage of a certain value or more is applied to the n-type polysilicon electrode 6205, an external electric field is generated, raising the potential at the silicon microparticles 6203 compared with the potential at the p-type silicon substrate 6201. At this moment, electrons are injected into the silicon microparticles 6203 by tunneling from the conduction band of the p-type silicon substrate 6201 via the tunnel oxide film 6202.

Referring to FIG. 3(b), when the application of the positive voltage to the n-type polysilicon electrode 6205 is terminated, the potential at the silicon microparticles 6203 themselves rises due to electrons accumulated therein. At this time, therefore, contrary to the electron injection, there is generated a force that facilitates spontaneous release of electrons from the silicon microparticles 6203 toward the p-type silicon substrate 6201 via the tunnel oxide film 6202. If the potential rise is sufficiently small, electrons will be held in the silicon microparticles 6203.

When a negative voltage is applied to the n-type polysilicon electrode 6205, electrons are released from the silicon microparticles 6203 toward the p-type silicon substrate 6201 via the tunnel oxide film 6202.

The detailed mechanism of the tunneling between the energy level of the semiconductor substrate and the energy levels of the microparticles, as well as the probability of the tunnel transition, are not known. However, it has been observed that injection of electrons into the microparticles occurs upon application of a voltage, that electrons are kept held in the microparticles after the application of a voltage is terminated, and that electrons are gradually spontaneously released from the microparticles at room temperature. It is therefore evident that the tunneling as described above functions.

Electron Injection, Holding, and Release Mechanism of Semiconductor Device of Embodiment 1

Referring to FIG. 1, when a certain positive voltage is applied to the n-type polysilicon electrode 1016, electrons are injected from the p-type silicon substrate 1011 into the silicon microparticles 1013 located adjacent to the p-type silicon substrate 1011 via the $SiO_2$ insulator 1014 by tunneling as in the conventional semiconductor device. Unlike the conventional semiconductor device, however, in the semiconductor device of EMBODIMENT 1 that has the charge holding region 1012 where the silicon microparticles 1013 are dispersed in the thickness direction, the electrons in the silicon microparticles 1013 located adjacent to the p-type silicon substrate 1011 attempt to further migrate to other silicon microparticles 1013 located closer to the n-type polysilicon electrode 1016 (upward as is viewed from FIG. 1).

The respective silicon microparticles 1013 are isolated from one another by the $SiO_2$ insulator 1014. By the existence of the $SiO_2$ insulator 1014, an electron from a certain silicon microparticle 1013 is not easily injected into a remote isolated silicon microparticle 1013, but easily injected into a nearby silicon microparticle 1013.

The capacitance of the silicon microparticles 1013 located adjacent to the p-type silicon substrate 1011 is larger than that of the silicon microparticles 1013 located farther from the p-type silicon substrate 1011. In the large-capacitance silicon microparticles 1013, potential rise due to charge injection is small, which facilitates electron transfer. In reverse, in the small-capacitance silicon microparticles 1013, potential rise due to charge injection is large, which makes electron transfer less easy. In short, charge transfer to the silicon microparticles 1013 is easier as the silicon microparticles 1013 are located closer to the p-type silicon substrate 1011.

Accordingly, since electron transfer is easy for the silicon microparticles 1013 located adjacent to the p-type silicon substrate 1011, many electrons tend to further migrate from the position adjacent to the p-type silicon substrate 1011 toward the n-type polysilicon electrode 1016. In this way, electrons migrate from the p-type silicon substrate 1011 toward the n-type polysilicon electrode 1016, selecting a route easy to migrate, finally to be stored in comparatively isolated silicon microparticles 1013 from which further migration is difficult.

The position at which electrons finally arrive depends on the voltage applied to the n-type polysilicon electrode 1016. By applying a larger voltage to the n-type polysilicon electrode 1016, a larger amount of electrons are accumulated in the silicon microparticles 1013 into which electron injection are more difficult, that is, the silicon microparticles 1013 located closer to the n-type polysilicon electrode 1016, via a larger number of routes.

Figure 4:
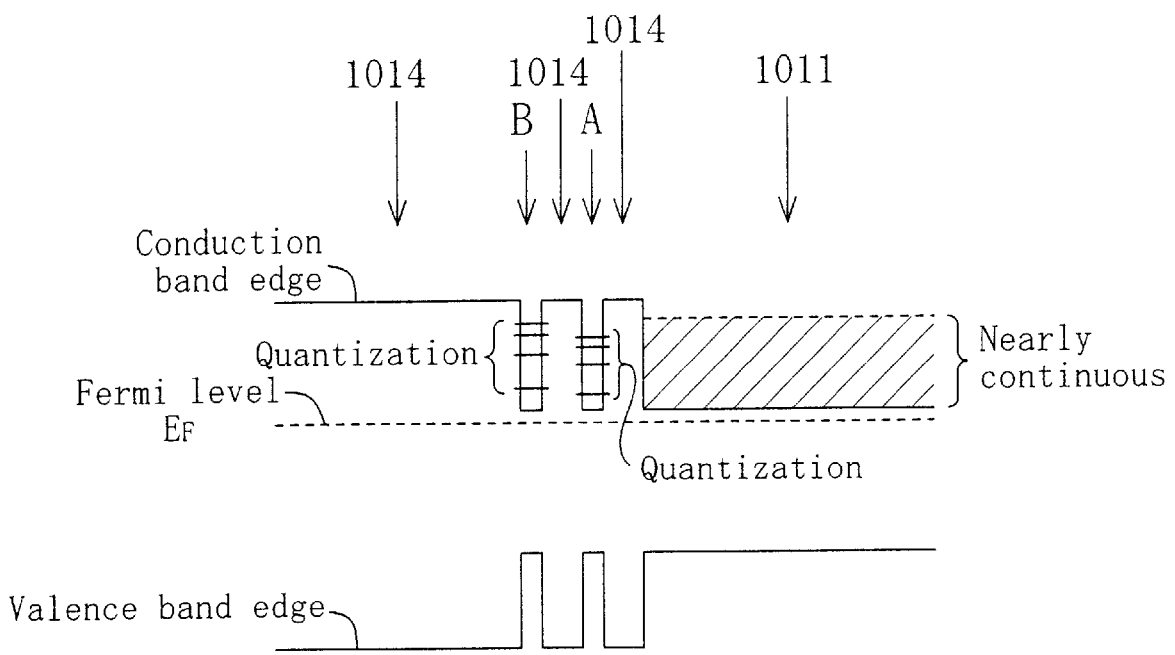
FIG. 4 is a band diagram of the semiconductor device of EMBODIMENT 1.

Next, the electron injection, holding, and release mechanism of the semiconductor device of EMBODIMENT 1 will be described with reference to the band diagram of the semiconductor device of this embodiment shown in FIG. 4. In FIG. 4, the energy levels of microparticles A and B are shown among a number of silicon microparticles 1013 in the charge holding region 1012 for simplification. The microparticle A is located adjacent to the p-type silicon substrate 1011, and the microparticle B is located adjacent to the $SiO_2$ film 1015 and holds charge. It would be understood that although tunneling between the silicon microparticles A and B is described for simplification, charge holding based on the same principle is also possible by electron transfer involving an additional number of silicon microparticles.

The energy states (energy levels) to be given by electrons in the silicon microparticles 1013 are quantized because the diameter of the silicon microparticles 1013 is extremely small. Accordingly, the energy levels of both the silicon microparticles A and B are quantized as shown in FIG. 4.

The distance between the energy levels of the silicon microparticles 1013 (hereinafter, referred to as the "discrete energy width") is larger as the energy levels are lower, and it is smaller as they are higher.

In normal tunneling, the potentials at the energy levels on both sides of a barrier layer to be tunneled through must be identical with each other. Therefore, when no voltage is applied, tunneling occurs between the silicon microparticles A and B only when one of the quantized energy levels of the silicon microparticle A and one of the quantized energy levels of the silicon microparticle B on both sides of the second tunnel barrier film 1014 have potentials identical with each other. The probability of tunneling is therefore very low. Only when a voltage is applied so that the potentials at the quantized energy levels of the silicon microparticles A and B are made identical with each other, electron transfer between these microparticles will be efficiently performed by resonant tunneling. Otherwise, electron transfer is suppressed. In other words, it is possible to control the electron transfer between the silicon microparticles A and B by an externally applied voltage, and moreover it is possible to hold electrons once injected into the silicon microparticle B over a prolonged period.

In the conduction band of the p-type silicon substrate 1011, the energy levels of electrons are nearly continuous at a high state density. It is therefore considered that the p-type silicon substrate 1011, has an energy level having the same potential as that at any quantized energy level of the silicon microparticle A. Accordingly, tunneling between the silicon microparticle A and the p-type silicon substrate 1011 will not be prohibited at least in terms of energy. Furthermore, the area of the silicon microparticle A is large enough to have a large spatial overlap of state functions between the levels of the silicon microparticle A and the p-type silicon substrate 1011 sandwiching the $SiO_2$ insulator 1014. Therefore, swift tunneling occurs between the silicon microparticle A and the p-type silicon substrate 1011 however the voltage applied to the n-type polysilicon electrode 1016 is varied, resulting in that the silicon microparticle A has the same potential as the p-type silicon substrate 1011. That is, electron transfer between the silicon microparticle A and the p-type silicon substrate 1011 is easy.

Figure 5A:
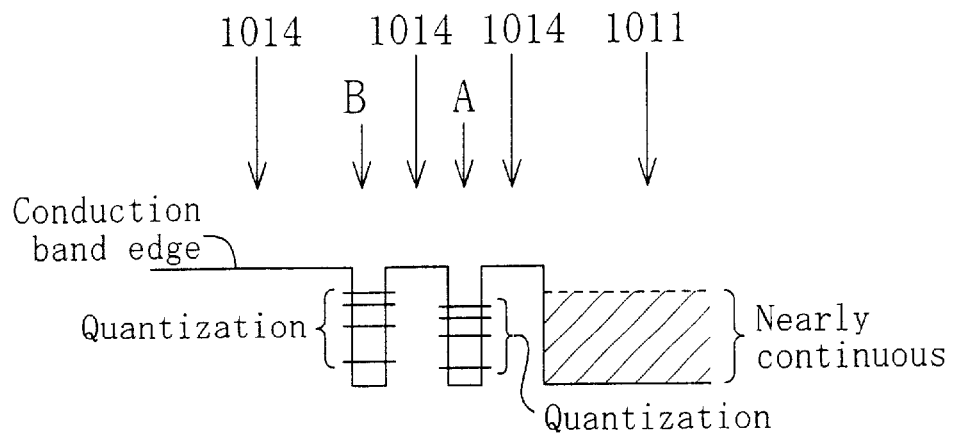
FIGS. 5(a), 5(b), and 5(c) are partial band diagrams showing the energy band states during electron injection and holding in the semiconductor device of EMBODIMENT 1.
Figure 5B:
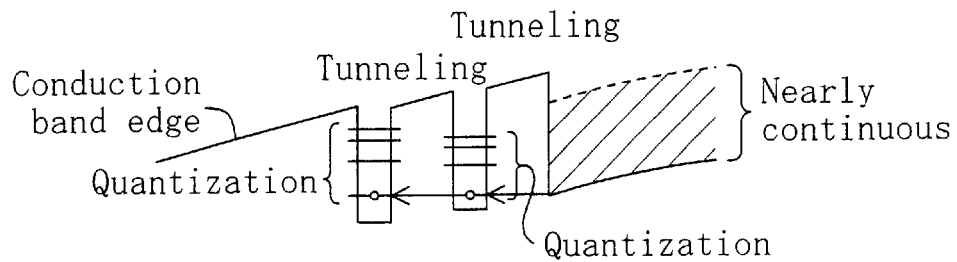
Figure 5C:
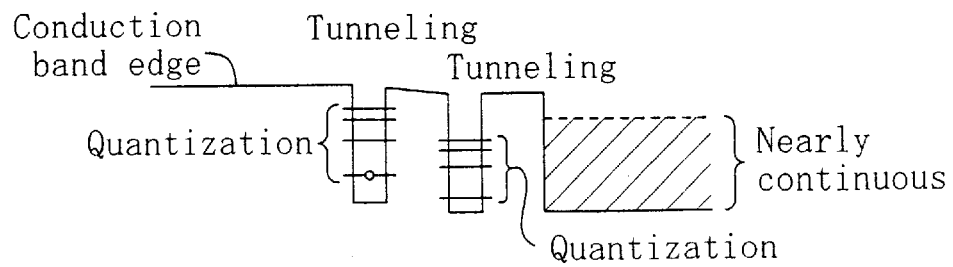

FIGS. 5(*a*), 5(*b*), and 5(*c*) are partial band diagrams of the semiconductor device of this embodiment during electron injection and holding. In FIGS. 5(*a*), 5(*b*), and 5(*c*), the valence band is omitted for easy understanding.

Referring to FIG. 5(*a*), no electron transfer occurs between the p-type silicon substrate 1011 and the silicon microparticle A or B when no voltage is applied to the n-type polysilicon electrode 1016.

Referring to FIG. 5(*b*), when a certain positive voltage is applied to the n-type polysilicon electrode 1016, electron transfer easily occurs from the p-type silicon substrate 1011 to vacant energy levels of the silicon microparticle A and from the energy levels of the silicon microparticle A to vacant energy levels of the silicon microparticle B. In general, a plurality of silicon microparticles B have different particle diameters. Therefore, the quantized energy levels of the silicon microparticles B have different potentials. This means that by the application of a certain voltage some of the energy levels of electrons in the silicon microparticle A happen to be identical in potential with the energy levels of some silicon microparticles B without the necessity of special strict voltage control. Thus, once a positive voltage is applied to the n-type polysilicon electrode 1016, electrons are injected from the p-type silicon substrate 1011 to a plurality of silicon microparticles B via the silicon microparticle A.

The distance between the quantized energy levels (discrete energy width) is smaller as the potential is larger, as described above. By applying a higher voltage, therefore, high-level dense portions of the quantized energy level groups of the silicon microparticles A and B are likely to have the same potential, and the state density increases. As a result, electrons are injected into a larger number of silicon microparticles B having higher levels. Further, electron injection into a larger number of silicon microparticles B is also possible by sweeping the applied voltage within a fixed range or superimposing a radio frequency.

Referring to FIG. 5(*c*), when the application of the voltage to the n-type polysilicon electrode 1016 is terminated after the electron injection into a plurality of silicon microparticles B, the potential at the silicon microparticles B increases while the potential at the conduction band of the p-type silicon substrate 1011 decreases. In other words, upon termination of the voltage application, a change occurs in the hierarchical relationship in relative potential among the energy levels of the silicon microparticle A, the energy levels of the silicon microparticles B, and the conduction band of the p-type silicon substrate. Note that after the electron injection into the plurality of silicon microparticles B, the potential at the silicon microparticles B has increased from that before the electron injection (FIG. 5(*a*)).

When the voltage application is terminated, the energy levels of some of the silicon microparticles B may happen to be identical in potential with some energy levels of the silicon microparticle A, permitting tunneling therebetween.

This results in losing electrons in the silicon microparticles B as in the conventional semiconductor device. In the semiconductor device of this embodiment, however, the energy levels of many of the silicon microparticles B subjected to electron injection are not identical in potential with the energy levels of the silicon microparticle A, whereby electron transfer by tunneling between the silicon microparticles A and B is prohibited. Electrons are therefore held stably in the majority of the silicon microparticles B. Thus, the semiconductor of this embodiment allows for long-term electron holding.

Charge release can be done by applying a negative voltage to the n-type polysilicon electrode 1016. Specifically, when a sufficiently large negative voltage is applied to the n-type polysilicon electrode 1016, and the energy levels of the silicon microparticle B become identical in potential with some energy levels of the silicon microparticle A, electrons are released from the silicon microparticle B to the silicon microparticle A. Like the electron injection into the silicon microparticle B, more efficient charge release is possible by applying a comparatively large negative voltage, sweeping the applied voltage, or superimposing a high frequency.

In the semiconductor device of this embodiment, the large-capacitance silicon microparticles 1013 exist between the small-capacitance silicon microparticles 1013 and the p-type silicon substrate 1011 as described above. This makes easy charge transfer between the small-capacitance silicon microparticles 1013 and the p-type silicon substrate 1011 by intervention of the large-capacitance silicon microparticles 1013. Therefore, by applying a voltage for charge injection between the n-type polysilicon electrode 1016 and the p-type silicon substrate 1011, charge injection into the small-capacitance silicon microparticles 1013 located close to the n-type polysilicon electrode 1016 is easily done.

In particular, in the semiconductor device of this embodiment, unlike the conventional semiconductor device using a plurality of silicon microparticles, a number of quantized silicon microparticles 1013 with a large discrete energy width are dispersed in the charge holding region 1012. This effectively suppresses spontaneous release of accumulated electrons, and enables electrons to be held in the silicon microparticles 1013 located close to the n-type polysilicon electrode 1016 over a prolonged period. In addition, since ,the silicon microparticles 1013 are quantized, the charge injection and release can be controlled with the voltage.

Due to the effective suppression of spontaneous release of accumulated charge, the charge can be held in the charge holding region 1012 over a prolonged period. This provides high reliability. Thus, the semiconductor device of this embodiment is a highly reliable device that responds to the request for prolonged recording retention, compared with the conventional semiconductor device.

In the conventional semiconductor device, in order to realize easy electron injection, the diameter of the silicon microparticles 6203 must be made small and uniform with high precision, and the thickness of the tunnel oxide film 6202 must be controlled in uniform with high precision. On the contrary, in the semiconductor device of this embodiment, the silicon microparticles 1013 having various diameters are randomly dispersed in the $SiO_2$ isolator 1014. During voltage application, therefore, electron injection starts automatically and selectively from the silicon microparticles 1013 into which electrons are easily injected, and electrons are held in the silicon microparticles 1013 in which electrons are most easily held. Thus, the semiconductor device of this embodiment requires no control of the thickness of the tunnel oxide film and the diameter of the silicon microparticles 1013, which makes easy the fabrication process, compared with the fabrication process for the conventional semiconductor device.

Moreover, in the semiconductor device of this embodiment, the silicon microparticles 1013 having various capacitances exist in the charge holding region 1012. This makes it possible to apply only the minimum required voltage for electron injection in order to obtain a certain electron holding period (recording duration). For charge release, also, only the minimum required voltage of the same magnitude may be applied.

In the conventional semiconductor device, tunneling is used only between the p-type silicon substrate 6201 and the silicon microparticles 6203 shown in FIG. 57. Therefore, the silicon microparticles 6203 must be arranged on the single plane. This limits the allowable amount of electrons held by the semiconductor device by the number of the silicon microparticles 6203 allowed to be formed on the single plane. On the contrary, in the semiconductor device of this embodiment, not only the tunneling between the p-type silicon substrate 1011 and the silicon microparticles 1013, but also the tunneling between the silicon microparticles 1013 are used. This allows for arrangement of the silicon microparticles 1013 in the thickness direction. As a result, a larger amount of electrons can be held in the semiconductor device of this embodiment compared with the conventional semiconductor device.

Thus, as described above, EMBODIMENT 1 of the present invention provides a semiconductor device that is highly reliable in charge injection into, holding in, and release from the microparticles and can be easily fabricated, compared with the conventional semiconductor device.

It would be understood that this embodiment is applicable to various types of semiconductor devices that control transfer and accumulation of minute charge.

Embodiment 2

Structure of Semiconductor Device of Embodiment 2

Figure 6:
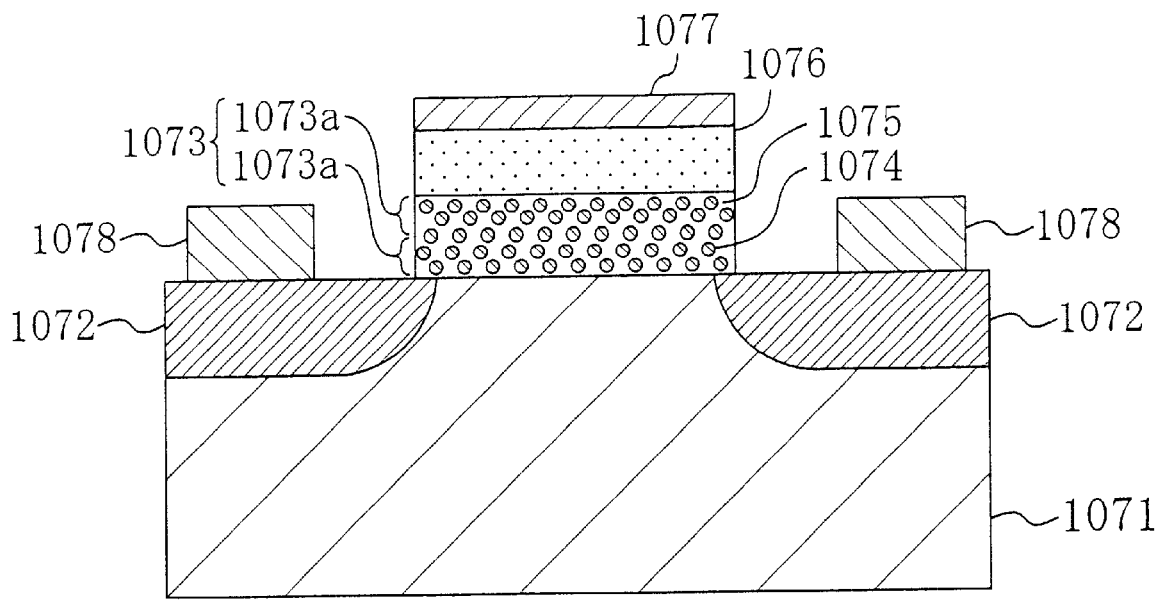
FIG. 6 is a cross-sectional view of a semiconductor device of. EMBODIMENT 2 of the present invention.

FIG. 6 is a cross-sectional view of a semiconductor device of EMBODIMENT 2 of the present invention. The semiconductor device of this embodiment has a MIS transistor structure as shown in FIG. 6, which includes a charge holding region 1073 composed of a plurality of microparticle dispersed portions 1073a, a gate insulating film 1076 made of a $SiO_2$ film, and an n-type polysilicon electrode 1077 functioning as the gate electrode, formed in this order on a p-type silicon substrate 1071. In the respective microparticle dispersed portions 1073a, silicon microparticles 1074 are dispersed in a $SiO_2$ insulator 1075. N-type diffusion regions (source/drain regions) 1072 are formed in portions of the p-type silicon substrate 1071 located below both sides of the n-type polysilicon electrode 1077. Metal electrodes 1078 functioning as the source/drain electrodes are formed on the n-type diffusion regions 1072. The portions (matrix) of the charge holding region 1073 other than the dispersed microparticles may be a semiconductor having a band gap larger than the microparticles.

Fabrication Process of Semiconductor Device of Embodiment 2

First, the same semiconductor substrate as that in EMBODIMENT 1 is formed and subjected to film formation, photolithography, and etching, to form the charge holding region 1073, the gate insulating film 1076, and the n-type polysilicon electrode 1077 on the p-type silicon substrate 1071. Thereafter, the n-type diffusion regions 1072 are formed by ion implantation, and the metal electrodes 1078 are formed by sputtering and etching. Thus, the semiconductor device of EMBODIMENT 2 is fabricated.

Characteristics of Semiconductor Device of Embodiment 2

In this embodiment, as in EMBODIMENT 1, the silicon microparticles 1074 located closer to the p-type silicon substrate 1071 have larger capacitance than those located farther therefrom. Therefore, in this embodiment, also, electron injection into, holding in, and release from the silicon microparticles 1074 are possible based on the principle described in EMBODIMENT 1. In addition, the semiconductor device of this embodiment has the MIS transistor structure, and the silicon microparticles 1074 for holding electrons are dispersed in the $SiO_2$ insulator 1075 formed between the p-type silicon substrate 1071 and the n-type polysilicon electrode 1077. This enables the threshold voltage of the device to change depending on whether or not electrons exist in the silicon microparticles 1074. The levels (high or low) of the threshold voltage are made associated with information H (high) and information L (low), respectively. In this way, information writing/reading is realized.

In the semiconductor device of this embodiment, the large-capacitance silicon microparticles 1074 exist between the small-capacitance silicon microparticles 1074 and the p-type silicon substrate 1071. Therefore, by intervention of the large-capacitance silicon microparticles 1074, charge transfer between the small-capacitance silicon microparticles 1074 and the p-type silicon substrate 1071 is facilitated.

In particular, in the semiconductor device of this embodiment, as in EMBODIMENT 1, a number of quantized silicon microparticles 1074 with a large discrete energy width are dispersed in the charge holding region 1073. This effectively suppresses spontaneous release of accumulated electrons, and enables electrons to be held in the silicon microparticles B over a prolonged period. In addition, since the silicon microparticles 1074 are quantized, the charge injection and release can be controlled with the voltage.

Due to the effective suppression of spontaneous release of accumulated charge, the charge can be held in the charge holding region 1073 over a prolonged period, thereby providing high reliability. Thus, the semiconductor device of EMBODIMENT 2 is a highly reliable device that responds to the request for prolonged recording retention while satisfying the request for high-speed operation and reduced operational power consumption. Moreover, in this embodiment, since the single device can realize basic memory operation, high-density integration is possible.

As in EMBODIMENT 1, the semiconductor device of this embodiment does not require control of the thickness of the tunnel oxide film. This makes the fabrication process easy, compared with the fabrication process for the conventional semiconductor device.

In this embodiment, a region that does not include the silicon microparticles 1074 may preferably be provided on or above at least one of the n-type diffusion regions 1072. This prevents a current short-circuited via the silicon microparticles 1074 from flowing between the n-type diffusion regions 1072 when a voltage is applied to the n-type diffusion regions 1072.

Also, the layer including the silicon microparticles 1074 may be divided into a plurality of portions in the direction vertical to the cross-section shown in FIG. 6. This also prevents a current short-circuited via the silicon microparticles 1074 from flowing between the n-type diffusion regions 1072 when a voltage is applied to the n-type diffusion regions 1072.

Embodiment 3

Structure of Semiconductor Device of Embodiment 3

Figure 7:
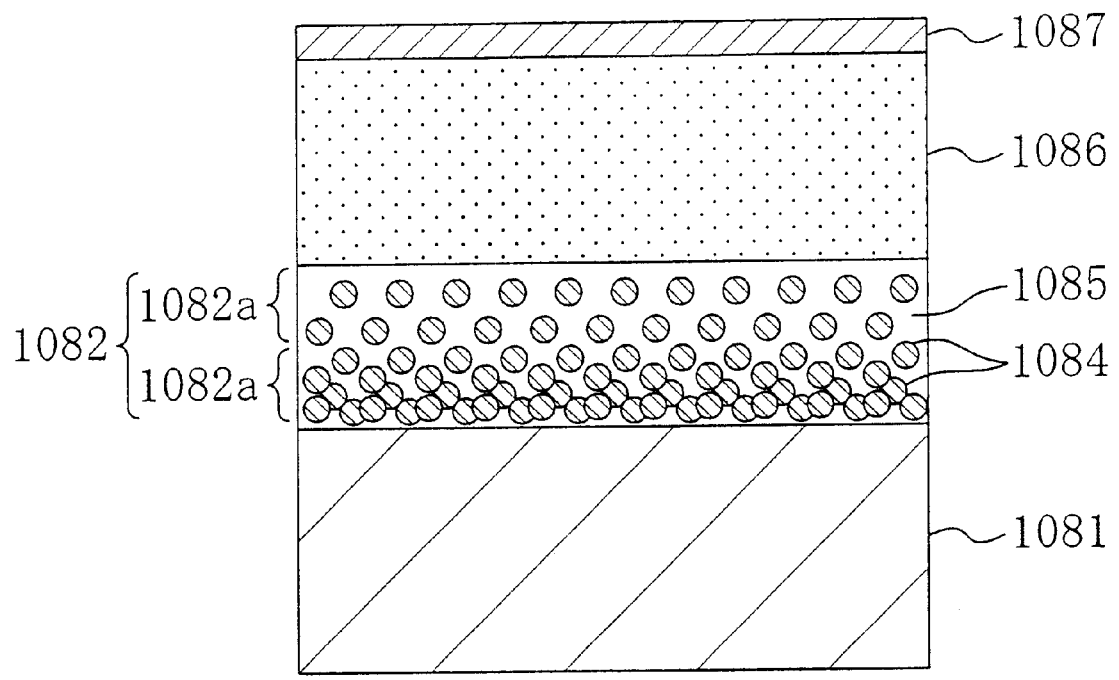
FIG. 7 is a cross-sectional view of a semiconductor device of EMBODIMENT 3 of the present invention.

FIG. 7 is a cross-sectional view of a semiconductor device of EMBODIMENT 3 of the present invention. The semiconductor memory device includes a charge holding region 1082 (thickness: about 20 nm) composed of a plurality of microparticle dispersed portions 1082a, a SiO$_2$ film 1086 (thickness: 20 nm) functioning as the insulating film, and an n-type polysilicon electrode 1087 functioning as the upper electrode, formed in this order on a p-type silicon substrate 1081. In the respective microparticle dispersed portions 1082a, silicon microparticles 1084 (particle diameter: 5 nm) are dispersed in a SiO$_2$ insulator 1085. The portions (matrix) of the charge holding region 1082 other than the dispersed microparticles may be a semiconductor having a band gap larger than the microparticles. Preferably, the thickness of the SiO$_2$ film 1086 is in the range of 5 to 20 nm, and the diameter of the silicon microparticles 1084 is in the range of about 2 to 10 cm.

As shown in FIG. 7, in this embodiment, unlike EMBODIMENT 1, the dispersion density of the silicon microparticles 1084 continuously decreases in the charge holding region 1082 as the location in the charge holding region 1082 is farther from the p-type silicon substrate 1081 and closer to the location adjacent to the SiO$_2$ film 1086. Specifically, the dispersion density of the silicon microparticles 1084 is $1\times10^{20}$ cm$^{-3}$ at the position in the charge holding region 1082 adjacent to the p-type silicon substrate 1081, and it is $1\times10^{15}$ cm$^{-3}$ at the position adjacent to the SiO$_2$ film 1086. No interface exists in the charge holding region 1082.

Fabrication Process of Semiconductor Device of Embodiment 3

First, silicon tablets are put on SiO$_2$ in a sputtering apparatus where the p-type silicon substrate 1081 is placed, and are subjected to bombardment by accelerated ions. Atoms and molecules of the silicon tablets released by the bombardment are then deposited on the p-type silicon substrate 1081. This sputtering is repeated under the condition that the amount of silicon tablets put on the SiO$_2$ is gradually reduced. After the sputtering, the resultant substrate is subjected to heat treatment. By these steps, formed on the ptype silicon substrate 1081 is the film where the dispersion density of the silicon microparticles 1084 continuously decreases in the SiO$_2$ 1085 as the location in the SiO$_2$ 1085 is farther from the p-type silicon substrate 1081 and closer to the SiO$_2$ film 1086, that is, the charge holding region 1082 composed of a plurality of microparticle dispersed portions 1082a. The resultant substrate is then placed on a susceptor in a chamber of a CVD apparatus, to deposit the SiO$_2$ film 1086 on the charge holding region 1082. Subsequently, in the same chamber, the n-type polysilicon electrode 1087 is deposited on the SiO$_2$ film 1086.

The dispersion density of the silicon microparticles in the portion of the charge holding region 1082 located closer to the n-type polysilicon electrode 1087 may be as small as $1\times10^{17}$ cm$^{-3}$ or less, so that this portion of the charge holding region 1082 can also function as the insulating film. In this case, part of the SiO$_2$ film 1086 may be omitted. In other words, the thickness of part of the SiO$_2$ film 1086 may be made substantially zero.

Electron Injection, Folding, and Release Mechanism of Semiconductor Device of Embodiment 3

In this embodiment, the dispersion density of the silicon microparticles 1084 decreases as the location in the charge holding region 1082 is closer to the SiO$_2$ film 1086. This means that the average distance between the silicon microparticles 1084 increases and thus the capacitance of the silicon microparticles 1084 decreases as the location in the charge holding region 1082 is closer to the SiO$_2$ film 1086. In other words, the capacitance of the silicon microparticles 1084 is larger as the distance of the silicon microparticles 1084 from the p-type silicon substrate 1081 is smaller. In addition, electron injection becomes less easy as the silicon microparticles 1084 are closer to the n-type polysilicon electrode 1087 since the tunnel barrier is thicker.

In the semiconductor device of this embodiment, unlike the conventional semiconductor device using a plurality of silicon microparticles, a number of quantized silicon microparticles 1084 with a large discrete energy width are dispersed in the charge holding region 1082. This effectively suppresses spontaneous release of accumulated electrons, and enables electrons to be held in the silicon microparticles 1084 over a prolonged period. In addition, since the silicon microparticles 1084 are quantized, the charge injection and release can be controlled with the voltage.

Thus, the semiconductor device of EMBODIMENT 3 is a highly reliable device that responds to the request for prolonged recording retention, compared with the conventional semiconductor device.

In the semiconductor device of this embodiment, as in EMBODIMENT 1, the silicon microparticles 1084 having various diameters are dispersed in the SiO$_2$ 1085. During voltage application, therefore, electron injection starts automatically and selectively from the silicon microparticles 1084 into which electrons are easily injected, and electrons are held in the silicon microparticles 1084 in which electrons are most easily held. Thus, the semiconductor device of this embodiment requires no control of the thickness of the tunnel oxide film and the diameter of the silicon microparticles 1084, which makes easy the fabrication process, compared with the fabrication process for the conventional semiconductor device.

Moreover, in the semiconductor device of this embodiment, the silicon microparticles 1084 having various capacitances exist in the charge holding region 1082. This makes it possible to apply only the minimum required voltage for electron injection in order to obtain a certain electron holding period (recording duration). For charge release, also, only the minimum required voltage of the same magnitude may be applied.

In the semiconductor device of this embodiment, the dispersion density of the silicon microparticles 1084 continuously decreases in the charge holding region 1082 as the location in the charge holding region 1082 is farther from the p-type silicon substrate 1081 and closer to the $SiO_2$ film 1086. No interface exists in the charge holding region 1082. Alternatively, it is possible to provide a portion in the charge holding region 1082 where the dispersion density of the silicon microparticles 1084 does not continuously change. It is also possible to provide in the charge holding region 1082 an interface such as an interface at which the composition of the portion other than the microparticles changes, and an interface at which the dispersion density or composition of the silicon microparticles 1084 changes. A plurality of such interfaces may be formed. The silicon microparticles 1084 may be divided into a plurality of microparticle groups each composed of the silicon microparticles 1084 located at the same distance from the p-type silicon substrate 1081. In these cases, also, the effect described above is obtained since the capacitance is not uniform among all the silicon microparticles 1084.

Embodiment 4

Structure of Semiconductor Device of Embodiment 4

Figure 8:
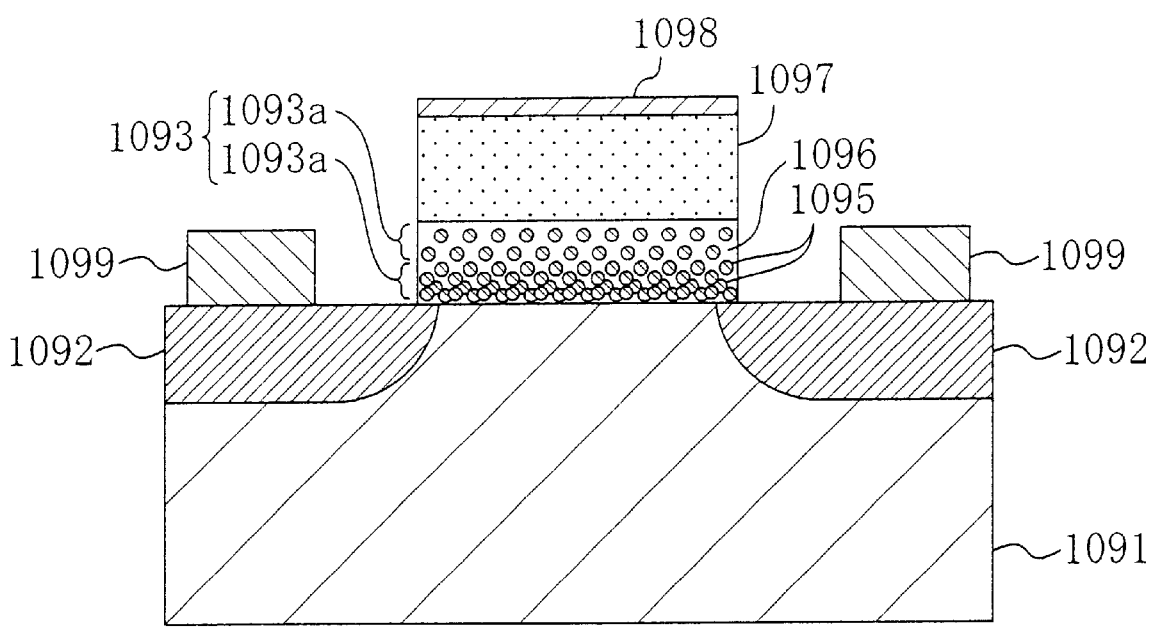
FIG. 8 is a cross-sectional view of a semiconductor device of EMBODIMENT 4 of the present invention.

FIG. 8 is a cross-sectional view of a semiconductor device of EMBODIMENT 4 of the present invention. The semiconductor device of this embodiment has a MIS transistor structure as shown in FIG. 8, which includes a charge holding region 1093 composed of a plurality of microparticle dispersed portions 1093a, a gate insulating film 1097 made of a $SiO_2$ film, and an n-type polysilicon electrode 1098 functioning as the gate electrode, formed in this order on a p-type silicon substrate 1091. In the respective microparticle dispersed portions 1093a, silicon microparticles 1095 are dispersed in a $SiO_2$ insulator 1096. This embodiment is different from EMBODIMENT 2 in that the dispersion density of the silicon microparticles 1095 continuously decreases in the charge holding region 1093 as the location in the charge holding region 1093 is farther from the p-type silicon substrate 1091 and closer to the gate insulating film 1097. N-type diffusion regions 1092 are formed in portions of the p-type silicon substrate 1091 located below both sides of the n-type polysilicon electrode 1098. Metal electrodes 1099 functioning as the source/drain electrodes are formed on the n-type diffusion regions 1092. The portions (matrix) of the charge holding region 1093 other than the dispersed microparticles may be a semiconductor having a band gap larger than the microparticles.

Fabrication Process of Semiconductor Device of Embodiment 4

First, the same semiconductor substrate as that in EMBODIMENT 3 is formed and subjected to film formation, photolithography, and etching, to form the charge holding region 1093, the gate insulating film 1096, and the n-type polysilicon electrode 1097 on the p-type silicon substrate 1091. Thereafter, the n-type diffusion regions 1092 are formed by ion implantation, and the metal electrodes 1099 are formed by sputtering and etching. Thus, the semiconductor device of EMBODIMENT 4 is fabricated.

Characteristics of Semiconductor Device of Embodiment 4

In this embodiment, as in EMBODIMENT 3, the silicon microparticles 1095 located closer to the p-type silicon substrate 1091 have larger capacitance than those located farther therefrom. Therefore, in this embodiment, also, electron injection into, holding in, and release from the silicon microparticles 1095 are possible based on the principle described in EMBODIMENT 3. In addition, the semiconductor device of this embodiment has the MIS transistor structure, and the silicon microparticles 1095 for holding electrons are dispersed in the $SiO_2$ insulator 1096 formed between the p-type silicon substrate 1091 and the n-type polysilicon electrode 1098. This enables the threshold voltage of the device to change depending on whether or not electrons exist in the silicon microparticles 1095. The levels (high or low) of the threshold voltage are made associated with information H (high) and information L (low), respectively. In this way, information writing/reading is realized.

In the semiconductor device of this embodiment, the large-capacitance silicon microparticles 1095 exist between the small-capacitance silicon microparticles 1095 and the p-type silicon substrate 1091. Therefore, by intervention of the large-capacitance silicon microparticles 1095, charge transfer between the small-capacitance silicon microparticles 1095 and the p-type silicon substrate 1091 is facilitated.

In particular, in the semiconductor device of this embodiment, a number of quantized silicon microparticles 1095 with a large discrete energy width are dispersed in the charge holding region 1093. This effectively suppresses spontaneous release of accumulated electrons, and enables electrons to be held in the silicon microparticles 1095 over a prolonged period. In addition, since the silicon microparticles 1095 are quantized, the charge injection and release can be controlled with the voltage.

Due to the effective suppression of spontaneous release of accumulated charge, the charge can be held in the charge holding region 1093 over a prolonged period, thereby providing high reliability. Thus, the semiconductor device of EMBODIMENT 4 is a highly reliable device that responds to the request for prolonged recording retention while satisfying the request for high-speed operation and reduced operational power consumption. Moreover, in this embodiment, since the single device can realize basic memory operation, high-density integration is possible.

As in EMBODIMENT 3, the semiconductor device of this embodiment requires no control of the thickness of the tunnel oxide film. This makes the fabrication process easy, compared with the fabrication process for the conventional semiconductor device.

In this embodiment, a region that does not include the silicon microparticles 1095 may preferably be provided on or above at least one of the n-type diffusion regions 1092. This prevents a current short-circuited via the silicon microparticles 1095 from flowing between the n-type diffusion regions 1092 when a voltage is applied to the n-type diffusion regions 1092.

In this embodiment, also, the layer including the silicon microparticles 1095 may be divided into a plurality of portions in the direction vertical to the cross-section shown in FIG. 8. This also prevents a current short-circuited via the silicon microparticles 1095 from flowing between the n-type diffusion regions 1092 when a voltage is applied to the n-type diffusion regions 1092.

Embodiment 5

Structure of Semiconductor Device of Embodiment 5

Figure 9:
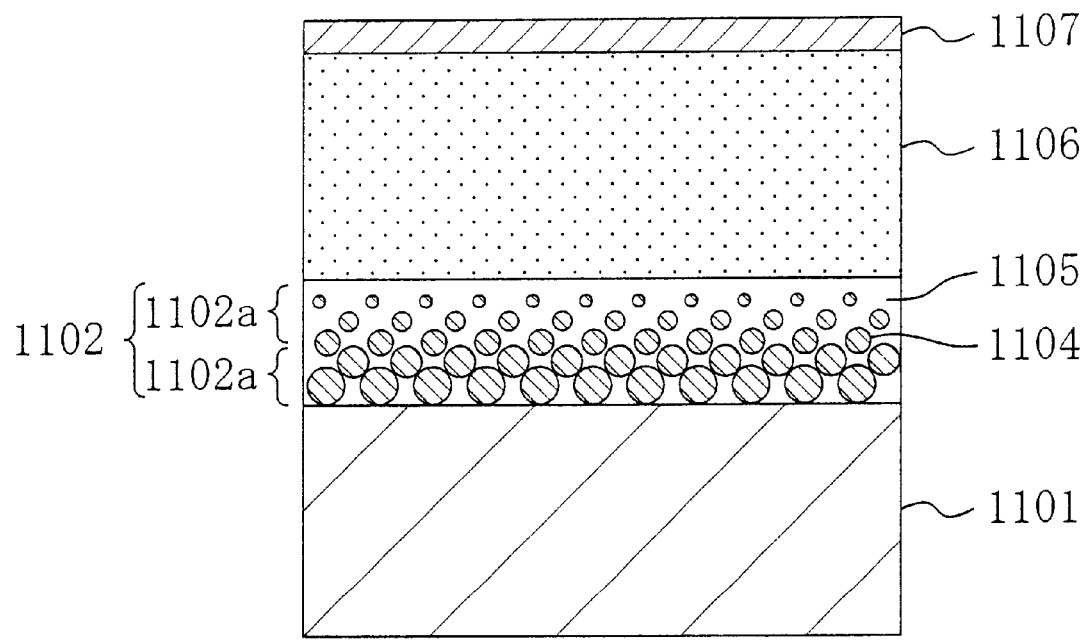
FIG. 9 is a cross-sectional view of a semiconductor device of EMBODIMENT 5 of the present invention.

FIG. 9 is a cross-sectional view of a semiconductor device of EMBODIMENT 5 of the present invention. The semiconductor device includes a charge holding region 1102 (thickness: about 30 nm) composed of a plurality of microparticle dispersed portions 1102a, a SiO$_2$ film 1106 (thickness: 20 nm) functioning as the insulating film, and an n-type polysilicon electrode 1107 functioning as the upper electrode, formed in this order on a p-type silicon substrate 1101. In the respective microparticle dispersed portions 1102a, silicon microparticles 1104 are dispersed in a SiO$_2$ insulator 1105. The portions (matrix) of the charge holding region 1102 other than the dispersed microparticles may be a semiconductor having a band gap larger than the microparticles. Preferably, the thickness of the SiO$_2$ film 1106 is in the range of 5 to 20 nm, and the dispersion density of the silicon microparticles 1104 is in the range of $1\times10^{15}$ cm$^{-3}$ to $1\times10^{20}$ cm$^{-3}$.

As shown in FIG. 9, in this embodiment, unlike EMBODIMENT 1, the diameter of the silicon microparticles 1104 in the charge holding region 1102 continuously decreases as the location in the charge holding region 1102 is farther from the p-type silicon substrate 1101 and closer to the SiO$_2$ film 1106. Specifically, preferably, the diameter of the silicon microparticles 1104 is about 20 nm at the position in the charge holding region 1102 adjacent to the p-type silicon substrate 1101, and it is about 1 nm at the position adjacent to the SiO$_2$ film 1106. No interface exists in the charge holding region 1102.

Fabrication Process of Semiconductor Device of Embodiment 5

First, silicon tablets are put on a SiO$_2$ in a sputtering apparatus where the p-type silicon substrate 1101 is placed, and are subjected to bombardment by accelerated ions. Atoms and molecules of the silicon tablets released by the bombardment are then deposited on the p-type silicon substrate 1101. The resultant substrate is subjected to heat treatment. The sputtering is performed again with a reduced amount of silicon tablets on the SiO$_2$ plate this time. The resultant substrate is subjected to heat treatment at a temperature lower than the substrate temperature at the preceding heat treatment. In this manner, the cycle of deposition of silicon by sputtering and growth of silicon microparticles by heat treatment is repeated. By these steps, formed on the p-type silicon substrate 1101 is the film where the diameter of the silicon microparticles 1104 in the SiO$_2$ insulator 1105 continuously decreases as the location in the SiO$_2$ insulator 1105 is farther from the p-type silicon substrate 1101 and closer to the SiO$_2$ film 1106, that is, the charge holding region 1102 composed of a plurality of microparticle dispersed portions 1102a. The resultant substrate is then placed on a susceptor in a chamber of a CVD apparatus, to deposit the SiO$_2$ film 1106 on the charge holding region 1102. Subsequently, in the same chamber, the n-type polysilicon electrode 1107 is deposited on the SiO$_2$ film 1106.

The charge holding region 1102 can also be formed by one CVD step so that the diameter of the silicon microparticles 1104 in the SiO$_2$ insulator 1105 continuously decreases as the location in the SiO$_2$ insulator 1105 is farther from the p-type silicon substrate 1101 and closer to the SiO$_2$ film 1106.

The diameter of the silicon microparticles in the portion of the charge holding region 1102 closer to the n-type polysilicon electrode 1107 may be as small as 3 nm or less, so that this portion of the charge holding region 1102 can also function as the insulating film. In this case, part of the SiO$_2$ film 1106 may be omitted. In other words, the thickness of the SiO$_2$ film 1106 may be made substantially zero.

Electron Injection, Holding, and Release Mechanism of Semiconductor Device of Embodiment 5

In EMBODIMENT 5, the diameter of the silicon microparticles 1104 decreases as the location in the charge holding region 1102 is closer to the SiO$_2$ film 1106. This means that the average distance between the silicon microparticles 1104 increases and thus the capacitance of the silicon microparticles 1104 decreases as the location in the charge holding region 1102 is closer to the SiO$_2$ film 1106. In other words, the capacitance of the silicon microparticles 1104 is larger as the distance of the silicon microparticles 1104 from the p-type silicon substrate 1101 is smaller. In addition, electron Injection becomes less easy as the silicon particles 1104 are closer to the n-type polysilicon electrode 1107 since the tunnel barrier is thicker.

In particular, the semiconductor device of this embodiment, unlike the conventional semiconductor device using a plurality of silicon microparticles, a number of quantized silicon microparticles 1104 with a large discrete energy width are dispersed in the charge holding region 1102. This effectively suppresses spontaneous release of accumulated electrons, and enables electrons to be held in the silicon microparticles 1104 over a prolonged period. In addition, since silicon microparticles 1104 are quantized, the charge injection and release can be controlled with the voltage.

Thus, the semiconductor device of EMBODIMENT 5 is a highly reliable device that responds to the request for prolonged recording retention, compared with the conventional semiconductor device.

In the semiconductor device of this embodiment, as in EMBODIMENT 1, the silicon microparticles 1104 having various diameters are dispersed in the SiO$_2$ insulator 1105. During voltage application, therefore, electron injection starts automatically and selectively from the silicon microparticles 1104 into which electrons are easily injected, and electrons are held in the silicon microparticles 1104 in which electrons are most easily held. Thus, as in EMBODIMENT 1, the semiconductor device of this embodiment requires no control of the thickness of the tunnel oxide film and the diameter of the silicon microparticles 1104, which makes the fabrication process easy, compared with the fabrication process for the conventional semiconductor device.

Moreover, in the semiconductor device of this embodiment, the silicon microparticles 1104 having various capacitances exist in the charge holding region 1102. This makes it possible to apply only the minimum required voltage for electron injection in order to obtain a certain electron holding period (recording duration). For charge release, also, only the minimum required voltage of the same magnitude may be applied.

In the semiconductor device of this embodiment, the diameter of the silicon microparticles 1104 continuously decreases in the charge holding region 1102 as the location in the charge holding region 1102 is farther from the p-type silicon substrate 1101 and closer to the SiO$_2$ film 1106. No interface exists in the charge holding region 1102. Alternatively, it is possible to provide a portion in the charge holding region 1102 where the diameter of the silicon microparticles 1104 does not continuously change. It is also possible to provide in the charge holding region 1102 an interface such as an interface at which the composition of the portion other than the microparticles changes, and an interface at which the diameter, dispersion density, or composition of the silicon microparticles 1104 changes. A plurality of such interfaces may be formed. The silicon microparticles 1104 may be divided into a plurality of microparticle groups each composed of the silicon microparticles 1104 located at the same distance from the p-type silicon substrate 1101. In these cases, also, the effect described above is obtained since the capacitance is not uniform among all the silicon microparticles 1104.

Embodiment 6

Structure of Semiconductor Device of Embodiment 6

Figure 10:
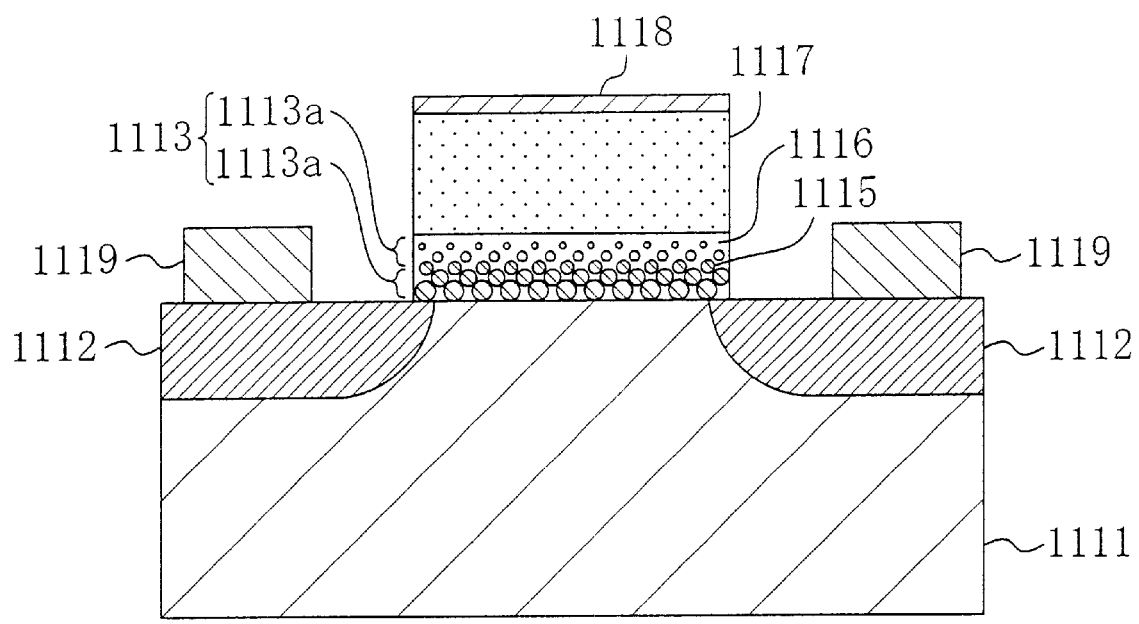
FIG. 10 is a cross-sectional view of a semiconductor device of EMBODIMENT 6 of the present invention.

FIG. 10 is a cross-sectional view of a semiconductor device of EMBODIMENT 6 of the present invention. The semiconductor device of EMBODIMENT 6 has a MIS transistor structure as shown in FIG. 10, which includes a charge holding region 1113 composed of a plurality of microparticle dispersed portions 1113a, a gate insulating film 1117 made of a $SiO_2$ film, and an n-type polysilicon electrode 1118 functioning as the gate electrode, formed in this order on a p-type silicon substrate 1111. In the respective microparticle dispersed portions 1113a, silicon microparticles 1115 are dispersed in a $SiO_2$ insulator 1116. This embodiment is different from EMBODIMENT 2 in that the diameter of the silicon microparticles 1115 in the charge holding region 1113 continuously decreases as the location in the charge holding region 1113 is farther from the p-type silicon substrate 1111 and closer to the gate insulating film 1117. N-type diffusion regions 1112 are formed in portions of the p-type silicon substrate 1111 located below both sides of the n-type polysilicon electrode 1118. Metal electrodes 1119 functioning as the source/drain electrodes are formed on the n-type diffusion regions 1112. The portions (matrix) of the charge holding region 1113 other than the dispersed microparticles may be a semiconductor having a band gap larger than the microparticles.

Fabrication Process of Semiconductor Device of Embodiment 6

First, the same semiconductor substrate as that in EMBODIMENT 5 is formed and subjected to film formation, photolithography, and etching, to form the charge holding region 1113, the gate insulating film 1117, and the n-type polysilicon electrode 1118 on the p-type silicon substrate 1111. Thereafter, the n-type diffusion regions 1112 are formed by ion implantation, and the metal electrodes 1119 are formed by sputtering and etching. Thus, the semiconductor device of EMBODIMENT 6 is fabricated.

Characteristics of Semiconductor Device of Embodiment 6

In this embodiment, as in EMBODIMENT 5, the silicon microparticles 1115 located closer to the p-type silicon substrate 1111 have smaller capacitance than those located farther therefrom. Therefore, in this embodiment, also, electron injection into, holding in, and release from the silicon microparticles 1115 are possible based on the principle described in EMBODIMENT 5. In addition, the semiconductor device of this embodiment has the MIS transistor structure, and the silicon microparticles 1115 for holding electrons are dispersed in the $SiO_2$ insulator 1116 formed between the p-type silicon substrate 1111 and the n-type polysilicon electrode 1118. This enables the threshold voltage of the device to change depending on whether or not electrons exist in the silicon microparticles 1115. The levels (high or low) of the threshold voltage are made associated with information H (high) and information L (low), respectively. In this way, information writing/reading is realized.

In particular, in the semiconductor device of this embodiment, a number of quantized silicon microparticles 1115 with a large discrete energy width are dispersed in the charge holding region 1113. This effectively suppresses spontaneous release of accumulated electrons, and enables electrons to be held in the silicon microparticles 1115 over a prolonged period. In addition, since the silicon microparticles 1115 are quantized, the charge injection and release can be controlled with the voltage.

Due to the effective suppression of spontaneous release of accumulated charge, the charge can be held in the charge holding region 1113 over a prolonged period, thereby providing high reliability. Thus, the semiconductor device of EMBODIMENT 6 will be a highly reliable device that responds to the request for prolonged recording retention while satisfying the request for high-speed operation and reduced operational power consumption of the device. Moreover, in this embodiment, since the single device can realize basic memory operation, high-density integration is possible.

As in EMBODIMENT 5, the semiconductor device of this embodiment requires no control of the thickness of the tunnel oxide film. This makes the fabrication process easy, compared with the fabrication process for the conventional semiconductor device.

In this embodiment, a region that does not include the silicon microparticles 1115 may preferably be provided on or above at least one of the n-type diffusion regions 1112. This prevents a current short-circuited via the silicon microparticles 1115 from flowing between the n-type diffusion regions 1112 when a voltage is applied to the n-type diffusion regions 1112.

In this embodiment, the layer including the silicon microparticles 1115 may be divided into a plurality of portions in the direction vertical to the cross-section shown in FIG. 8. This also prevents a current short-circuited via the silicon microparticles 1115 from flowing between the n-type diffusion regions 1112 when a voltage is applied to the n-type diffusion regions 1112.

Embodiment 7

Structure of Semiconductor Device of Embodiment 7

Figure 11:
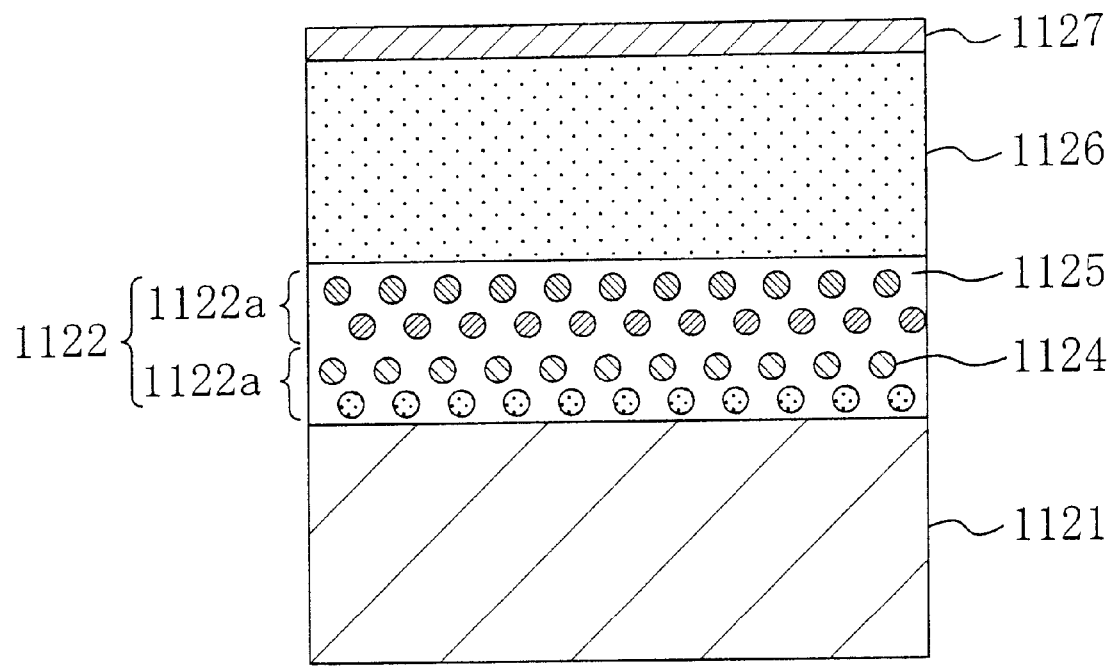
FIG. 11 is a cross-sectional view of a semiconductor device of EMBODIMENT 7 of the present invention.

FIG. 11 is a cross-sectional view of a semiconductor device of EMBODIMENT 7 of the present invention. The semiconductor memory device includes a charge holding region 1122 (thickness: about 30 nm) composed of a plurality of microparticle dispersed portions 1122a, a $SiO_2$ film 1126 (thickness: 20 nm) functioning as the insulating film, and an n-type polysilicon electrode 1127 functioning as the upper electrode, formed in this order on a p-type silicon substrate 1121. The portions (matrix) of the charge holding region 1122 other than dispersed microparticles may be a semiconductor having a band gap larger than the microparticles. Preferably, the thickness of the $SiO_2$ film 1126 is in the range of 5 to 20 nm.

As shown in FIG. 11, in this embodiment, unlike EMBODIMENTS 1, 3, and 5, the charge holding region 1122 includes SiGe microparticles 1124 (particle diameter: about 1 to 20 nm, dispersion density: about $1 \times 10^{15}$ cm$^{-3}$ to $1 \times 10^{20}$ cm$^{-3}$) dispersed in a $SiO_2$ insulator 1125. The proportion of Ge in the composition (Ge content) of the SiGe microparticles 1124 continuously increases as the location in the charge holding region 1122 is farther from the p-type silicon substrate 1121 and closer to the $SiO_2$ film 1126. Specifically, the Ge content of the SiGe microparticles 1124 is about 0% at the position adjacent to the p-type silicon substrate 1121, and it is about 100% at the position adjacent to the $SiO_2$ film 1126. No interface exists in the charge holding region 1122.

Fabrication Process of Semiconductor Device of Embodiment 7

First, SiO$_2$, Si, and Ge are put in a sputtering apparatus where the p-type silicon substrate 1121 is placed, and are subjected to bombardment by accelerated ions. Atoms and molecules of SiO$_2$, Si, and Ge released by the bombardment are then deposited on the p-type silicon substrate 1121. At this time, the ratio of the deposited amounts of SiO$_2$, Si, and Ge is adjusted by opening/closing shutters provided for the respective materials. In this embodiment, the ratio of the deposited amount of Ge to Si is gradually increased using these shutters. The resultant substrate is subjected to heat treatment. By these steps, formed on the p-type silicon substrate 1121 is the charge holding region 1122 composed of a plurality of microparticle dispersed portions 1122a where the Ge content of the SiGe microparticles 1124 continuously increases as the location in the charge holding region 1122 is farther from the p-type silicon substrate1121 and closer to the SiO$_2$ film 1126. The resultant substrate is then placed on a susceptor in a chamber of a CVD apparatus, to deposit the SiO$_2$ film 1126 on the charge holding region 1122. Subsequently, in the same chamber, the n-type polysilicon electrode 1127 is deposited on the SiO$_2$ film 1126.

Electron Injection, Holding, and Release Mechanism of Semiconductor Device of Embodiment 7

In EMBODIMENT 7, as the SiGe microparticles 1124 are located closer to the p-type silicon substrate 1121, the Ge content of the SiGe microparticles 1124 is smaller, and the electron affinity thereof is smaller while the sum of the electron affinity and the band gap thereof is larger. As a result, the barrier height of the surrounding SiO$_2$ insulator 1125 against electrons and holes is smaller as the SiGe microparticles 1124 are located closer to the p-type silicon substrate 1121. This relationship will be described in an embodiment hereinafter. In this embodiment, therefore, the SiGe microparticles 1124 having a small Ge content exist between the SiGe microparticles 1124 having a large Ge content and the p-type silicon substrate 1121. Accordingly, by intervention of the SiGe microparticles 1124 having a small Ge content, charge transfer between the SiGe microparticles 1124 having a large Ge content and the p-type silicon substrate 1121 is facilitated.

In particular, in the semiconductor device of this embodiment, unlike the conventional semiconductor device using a plurality of silicon microparticles, a number of quantized SiGe microparticles 1124 with a large discrete energy width are dispersed in the charge holding region 1122. This effectively suppresses spontaneous release of accumulated electrons, and enables electrons to be held in the SiGe microparticles 1124 over a prolonged period. In addition, since the SiGe microparticles 1124 are quantized, the charge injection and release can be controlled with the voltagecordingly, in the semiconductor device in this embodiment, as in EMBODIMENT 1, spontaneous release of accumulated electrons can be effectively suppressed, and electrons can be held in the SiGe microparticles 1124 over a prolonged period.

Figure 14:
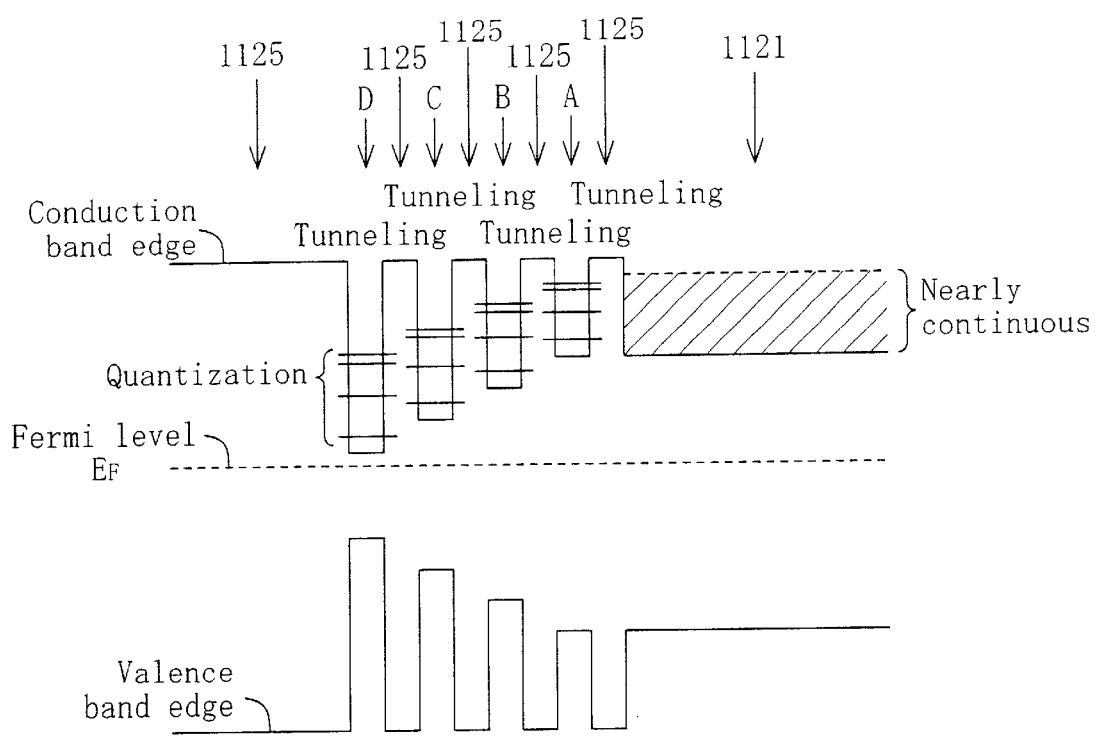
FIG. 14 is a band diagram of the semiconductor device of EMBODIMENT 7.

FIG. 14 is a band diagram of the semiconductor device of this embodiment. Although the charge holding region 1122 actually includes a number of SiGe microparticles 1124, shown in FIG. 14 as the SiGe microparticles 1124 are silicon microparticles A, B, C, and D located in this order from the position adjacent to the p-type silicon substrate 1121 toward the position adjacent to the SiO$_2$ film 1126, for simplification. In FIG. 14, therefore, the band structure in the region including the SiGe microparticles A, B, C, and D and the SiO$_2$ insulator 1125 is shown.

In general, as the Ge content of a SiGe composition is larger, the band gap is smaller. The band gap is the width of the forbidden band between the conduction band and the valence band. As described above, the Ge content of the composition of the SiGe microparticles 1124 continuously increases as the location in the charge holding region 1122 is farther from the p-type silicon substrate 1121 and closer to the SiO$_2$ film 1126. Therefore, the band gap decreases in the order of the silicon microparticles A, B, C, and D. Also, the electron affinity increases and the sum of the electron affinity and the band gap decreases in this order, resulting in increasing the tunnel barrier height against electrons and holes in this order. As a result, electron injection by tunneling is more difficult while the electron holding ability is higher in this order.

Accordingly, the semiconductor device of EMBODIMENT 7 is a highly reliable device that responds to the request for long-term recording retention, compared with the conventional semiconductor device and the semiconductor device of EMBODIMENT 1.

In the semiconductor device of this embodiment, as in EMBODIMENT 1, the SiGe microparticles 1124 having various diameters are dispersed in the SiO$_2$ isolator 1125. During voltage application, therefore, electron injection starts automatically and selectively from the SiGe microparticles 1124 into which electrons are easily injected, and electrons are held in the SiGe microparticles 1124 in which electrons are most easily held. Accordingly, as in EMBODIMENT 1, the semiconductor device of this embodiment requires no control of the thickness of the tunnel oxide film and the diameter of the SiGe microparticles 1124, which makes the fabrication process easy, compared with the fabrication process for the conventional semiconductor device.

Moreover, in the semiconductor device of this embodiment, the SiGe microparticles 1124 having various capacitances exist in the charge holding region 1122. This makes it possible to apply only the minimum required voltage for electron injection in order to obtain a certain electron holding period (recording duration). For charge release, also, only the minimum required voltage of the same magnitude may be applied.

In the above description, the Ge content of the SiGe microparticles was varied to change the energy level of the microparticles for control of the tunnel barrier height. Other material may also be used for this purpose. For example, mixed crystal such as ZnCdS and ZnSTe may be used to change the Cd content and the Te content, respectively.

The tunnel barrier height may otherwise be controlled by changing the electron affinity or conduction band energy of the material surrounding the microparticles. For example, Si$_x$O$_y$N$_z$ (4x=2y+3z) may be used, in place of the SiO$_2$ insulator 1125, and the N content thereof is changed. More specifically, by increasing the value y of Si$_x$O$_y$N$_z$, the band gap increases, the electron affinity decreases, the sum of the electron affinity and the band gap increases, and thereby the barrier height increases. Thus, substantially the same effect as that described above is obtained.

The dispersion density of the microparticles in the portion of the charge holding region 1122 located closer to the n-type polysilicon electrode 1127 may be as low as $1 \times 10^{17}$ cm$^{-3}$ or less, to enable this portion of the charge holding region 1122 to also function as the insulating film. In this case, part of the SiO$_2$ film 1126 may be omitted. In other words, the thickness of the SiO$_2$ film 1126 may be made substantially zero.

No interface exists in the charge holding region 1122. It is however possible to provide a portion in the charge holding region 1122 where the band gap does not continuously change. It is also possible to provide in the charge holding region 1122 an interface such as an interface at which the composition of the portion of the charge holding region 1122 other than the microparticles changes, and an interface at which the diameter, dispersion density, or composition of the microparticles 1124 changes. A plurality of such interfaces may be formed. The SiGe microparticles 1124 may be divided into a plurality of microparticle groups each composed of the SiGe microparticles 1124 located at the same distance from the p-type silicon substrate 1121. In these cases, also, the effect described above is obtained since the capacitance is not uniform among all the SiGe microparticles 1124.

Figure 15:
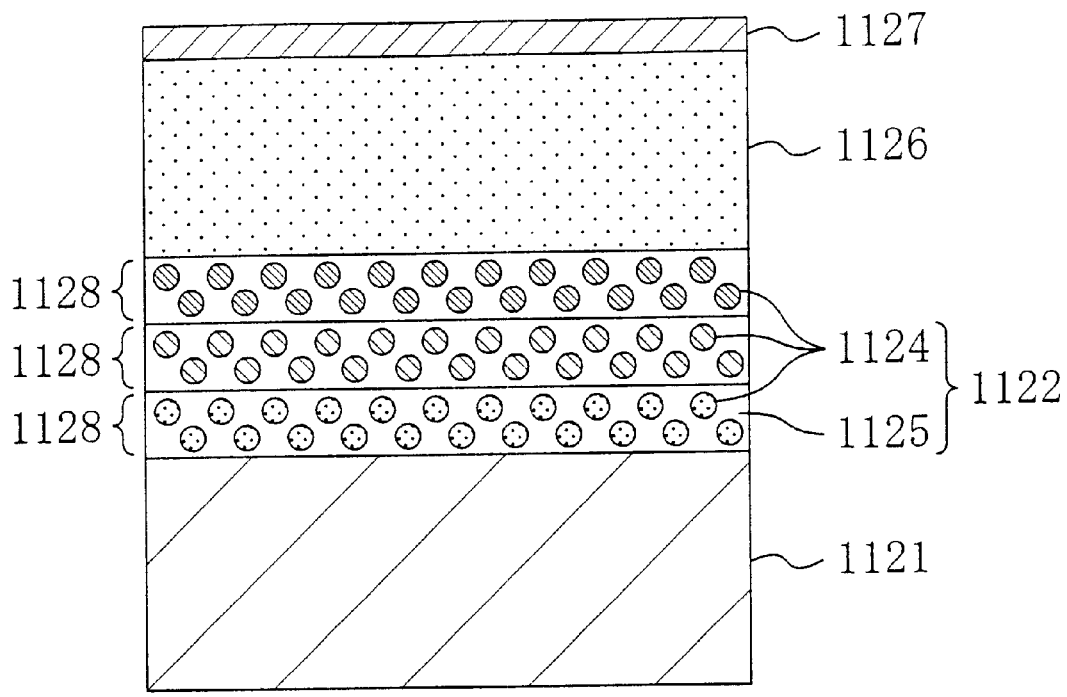
FIG. 15 is a cross-sectional view of a semiconductor device having a plurality of microparticle groups each composed of a plurality of SiGe microparticles, arranged in layers.

FIG. 15 illustrates an example of a semiconductor device having interfaces, in which the charge holding region 1122 includes a plurality of layered microparticle groups 1128 each composed of the SiGe microparticles 1124. In this semiconductor device, as the microparticle groups 1128 are located farther from the p-type silicon substrate 1121, the Ge content of the SiGe microparticles 1124 increases, and thus the tunnel barrier height increases.

Embodiment 8

Structure of Semiconductor Device of Embodiment 8

Figure 12:
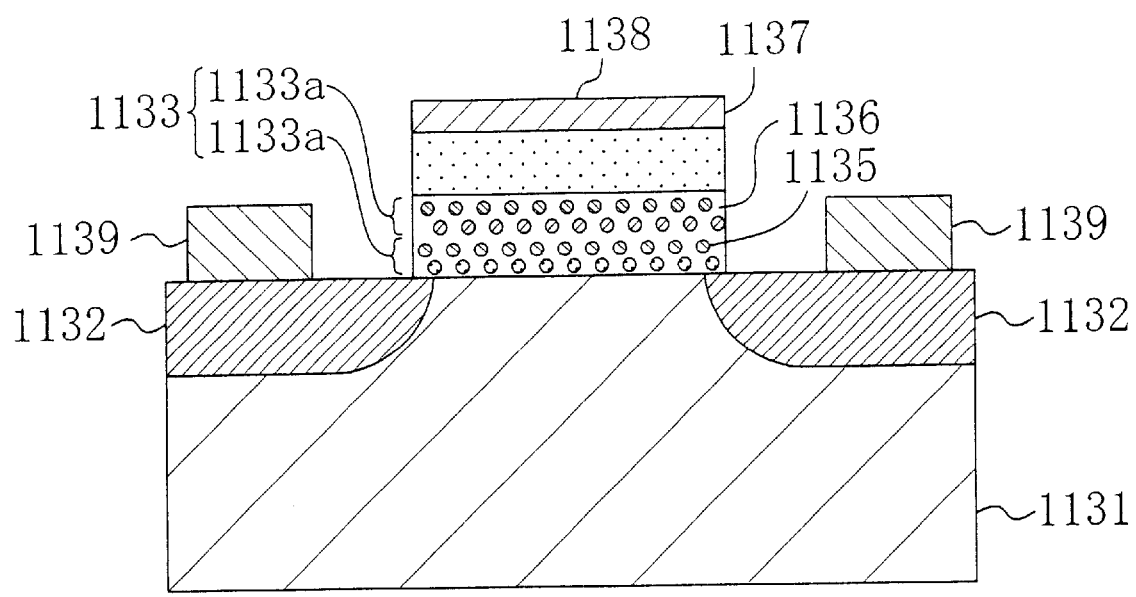
FIG. 12 is a cross-sectional view of a semiconductor device of EMBODIMENT 8 of the present invention.

FIG. 12 is a cross-sectional view of a semiconductor device of EMBODIMENT 8 of the present invention. The semiconductor device of EMBODIMENT 8 has a MIS transistor structure as shown in FIG. 12, which includes a charge holding region 1133 composed of a plurality of microparticle dispersed portions 1133a, a gate insulating film 1137 made of a $SiO_2$ film, and an n-type polysilicon electrode 1138 functioning as the gate electrode, formed in this order on a p-type silicon substrate 1131. In this embodiment, unlike EMBODIMENTS 2, 4, and 6, in the respective microparticle dispersed portions 1133a, SiGe microparticles 1135 are dispersed in a $SiO_2$ insulator 1136. The Ge content of the SiGe microparticles 1135 continuously increases as the location in the charge holding region 1133 is farther from the p-type silicon substrate 1131 and closer to the $SiO_2$ film 1137. N-type diffusion regions 1132 are formed in portions of the p-type silicon substrate 1131 located below both sides of the n-type polysilicon electrode 1138. Metal electrodes 1139 functioning as the source/drain electrodes are formed on the n-type diffusion regions 1132. The portions (matrix) of the charge holding region 1133 other than the dispersed microparticles may be a semiconductor having a band gap larger than the microparticles.

Fabrication Process of Semiconductor Device of Embodiment 8

First, the same semiconductor substrate as that in EMBODIMENT 7 is formed and subjected to film formation, photolithography, and etching, to form the charge holding region 1133, the gate insulating film 1137, and the n-type polysilicon electrode 1138 on the p-type silicon substrate 1131 in the shape shown in FIG. 12. Thereafter, the n-type diffusion regions 1132 are formed by ion implantation, and the metal electrodes 1139 are formed by sputtering and etching. Thus, the semiconductor device of this embodiment is fabricated.

Characteristics of Semiconductor Device of Embodiment 8

In this embodiment, as in EMBODIMENT 7, the Ge content of the SiGe microparticles 1135 is smaller as the microparticles are located closer to the p-type silicon substrate 1131. Therefore, in this embodiment, also, electron injection into, holding in, and release from the silicon microparticles 1135 are possible based on the principle described in EMBODIMENT 7. In addition, the semiconductor device of this embodiment has the MIS transistor structure, and the SiGe microparticles 1135 for holding electrons are dispersed in the $SiO_2$ insulator 1136 formed between the p-type silicon substrate 1131 and the n-type polysilicon electrode 1137. This enables the threshold voltage of the device to change depending on whether or not electrons exist in the silicon microparticles 1135. The levels (high or low) of the threshold voltage are made associated with information H (high) and information L (low), respectively. In this way, information writing/reading is realized.

In particular, in the semiconductor device of this embodiment, a number of quantized SiGe microparticles 1135 with a large discrete energy width are dispersed in the charge holding region 1133. This effectively suppresses spontaneous release of accumulated electrons, and enables electrons to be held in the SiGe microparticles B over a prolonged period. In addition, since the SiGe microparticles 1135 are quantized, the charge injection and release can be controlled with the voltage.

Due to the effective suppression of spontaneous release of accumulated charge, the charge can be held in the charge holding region 1133 over a prolonged period, thereby providing high reliability. Thus, the semiconductor device of this embodiment will be a highly reliable device that responds to the request for prolonged recording retention while satisfying the request for high-speed operation and reduced operational power consumption of the device. Moreover, in this embodiment, since the single device can realize basic memory operation, high-density integration is possible.

As in EMBODIMENT 7, the semiconductor device of this embodiment requires no control of the thickness of the tunnel oxide film. This makes the fabrication process easy, compared with the fabrication process for the conventional semiconductor device.

In this embodiment, a region that does not include the SiGe microparticles 1135 may be provided on or above at least one of the n-type diffusion regions 1132. This prevents a current short-circuited via the SiGe microparticles 1135 from flowing between the n-type diffusion regions 1132 when a voltage is applied to the n-type diffusion regions 1132.

In this embodiment, the layer including the SiGe microparticles 1135 may be divided into several portions in the direction vertical to the cross-section shown in FIG. 12. This also prevents a current short-circuited via the SiGe microparticles 1135 from flowing between the n-type diffusion regions 1132 when a voltage is applied to the n-type diffusion regions 1132.

(Modifications of Embodiments 1 to 8)

In EMBODIMENTS 1 to 8 above, electrons were used as the charge injected and accumulated in the silicon microparticles. Instead, holes may be used for injection and accumulation.

In EMBODIMENTS 1 to 8, a so-called LDD structure generally adopted in a fine MISFET may be utilized, where insulator sidewalls (for example, silicon oxide films) are formed on both sides of the gate electrode and the gate insulating film before the source/drain regions are formed. By this structure, a large distance is secured between the source/drain regions and the microparticles, which ensures prevention of unwanted charge leakage from the microparticles to the source/drain regions.

Substrate

In the above embodiments, the p-type silicon substrate was used. Alternatively, an n-type silicon substrate, or a substrate made of GaAs or any other semiconductor material may be used.

The use of the p-type silicon substrate as in the above embodiments permits use of high-precision silicon process technology and high-density integration of semiconductor devices.

At least one of a silicon oxide film, a silicon nitride film, and a silicon oxide nitride film may be formed on the substrate. These films will function as the tunnel film.

Microparticle-surrounding Member (Matrix) and Gate Insulating Film

In the above embodiments, $SiO_2$ was used for the member (matrix) surrounding the microparticles and the gate insulating film. In place of $SiO_2$, any material can be used if it functions as tunnel barriers between the substrate and the microparticles and between the microparticles. Such a member functioning as the tunnel barriers is preferably a semiconductor or insulator thin film that has a property of blocking a thermal diffusion current but transmitting a tunnel current and has a barrier height of at least 100 meV with respect to the semiconductor substrate and the microparticles.

As the insulating material, $SiO_2$, $Si_3N_4$, $Al_2O_3$, $CeO_2$, and the like are especially suitable. In addition to the films made of these insulating materials, also usable are combinations of these insulator films, and films having a mixed composition of these insulating materials such as $Si_xO_yN_z$ (4x=2y+3z). As the semiconductor material, C (diamond), AlN, GaN, AlP, GaP, ZnO, ZnS, MgO, MgS, and the like, as well as mixed crystals thereof, are suitable.

The material for the microparticle-surrounding member (matrix) and the gate insulating film may not be uniform but may be different depending on the position.

Microparticles

In EMBODIMENTS 1 to 8 above, silicon microparticles and SiGe microparticles were used. Alternatively, usable as the microparticles are silicon microcrystal, SiGe microcrystal, amorphous silicon, single crystalline silicon, and other semiconductor and metal materials.

In the case of using silicon particles, it is easy to apply high-precision silicon process technology because silicon microparticles are stable and less likely to be contaminated in a high temperature atmosphere during the fabrication process. In the case of using metal particles, high-quality microparticles with a uniform diameter can be easily formed uniformly at a high surface density.

Metal particles do not cause quantization as described, but cause potential rise depending on the capacitance, charge transfer depending on the barrier height, and a variation in charge holding characteristic. Therefore, substantially the same effect as that described in the above embodiments is obtained.

In the case of using a semiconductor having a band gap of 2.0 eV or more as the microparticles, a large distance is secured between the energy levels of the microparticles, thereby increasing the charge confinement effect. In particular, if the microparticles are made of a semiconductor having a band gap of 2.0 eV or more and the microparticle-surrounding member is made of an insulator such as $SiO_2$, the tunnel barrier height decreases. It is therefore possible to increase the distance between the adjacent microparticles while the tunnel current being secured. This results in decreasing the capacitance of the charge holding microparticles.

Examples of the semiconductor having a band gap of 2.0 eV or more include GaN, GaP, GaAs, AlAs, ZnO, ZnS, ZnSe, CdS, ZnTe, and SiC, as well as mixed crystals of these semiconductors.

In the above embodiments, the dispersion density of microparticles is preferably in the range of $1 \times 10^{15}$ cm$^{-3}$ to $1 \times 10^{20}$ cm$^{-3}$. With a dispersion density in the above range, charge can be effectively held in the microparticles, and whether or not charge exists in the microparticles can be easily detected.

In the above embodiments, the microparticles may be of a flat shape. Adopting flat microparticles facilitates the fabrication process of the device particularly when the microparticles are formed by CVD not only by sputtering. The flat shape is also effective in increasing the capacitance of the microparticles. In addition, the flat shape enhances the probability of the existence of a microparticle in the vicinity of the straight line connecting a certain microparticle for holding charge and the p-type silicon substrate. This facilitates the charge transfer between the p-type silicon substrate and the microparticle for holding charge via a microparticle existing therebetween. The microparticles may be put on one another to form a plurality o layers.

Application of Semiconductor Devices of Embodiments 1 to 8

The semiconductor devices of EMBODIMENTS 1 to 8 can be applied to various fields for control of transfer and accumulation of minute charge. For example, a charge distribution may be prepared for the semiconductor devices of EMBODIMENTS 1 to 6 based on the principle of the scanning probe microscope (SPM), especially the atomic force microscope (AFM), to use the distribution as a memory. In this case, the n-type polysilicon electrode of the semiconductor device is not necessary. A semiconductor device having characteristics of some of the semiconductor devices of the above embodiments may also be formed. Other various modifications are possible without departing from the subject of the present invention.

Embodiment 9

Structure of Semiconductor Device of Embodiment 9

Figure 16:
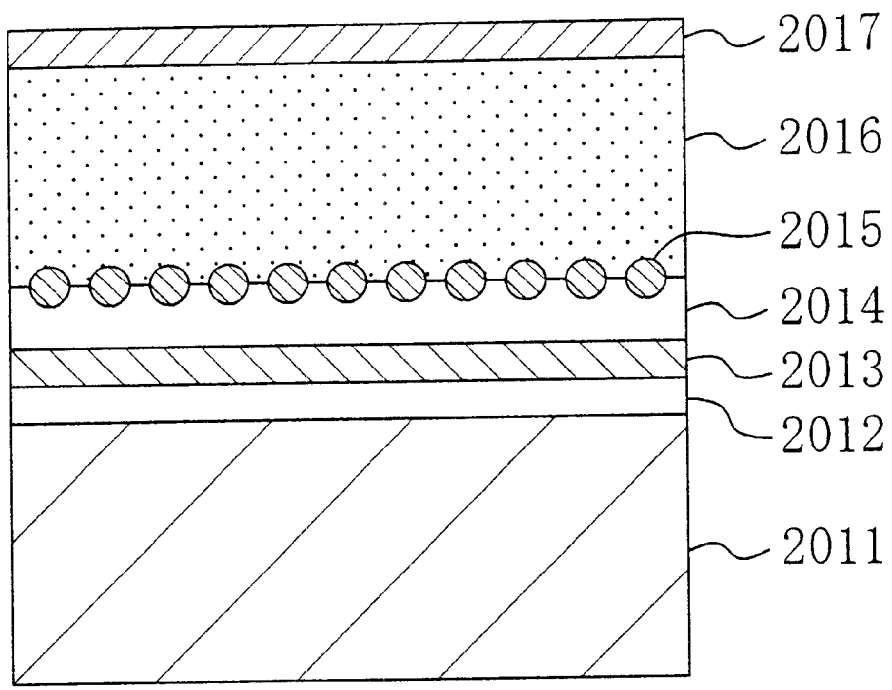
FIG. 16 is a cross-sectional view of a semiconductor device of EMBODIMENT 9 of the present invention.

FIG. 16 is a cross-sectional view of a semiconductor device of EMBODIMENT 9 of the present invention. The semiconductor memory device includes a first tunnel barrier film 2012 (thickness: 2 nm) made of a silicon oxide nitride film, a semiconductor film 2013 (thickness: 5 nm) made of a polysilicon film, a second tunnel barrier film 2014 (thickness: 2 nm) made of a $SiO_2$ film, an insulating film 2016 (thickness: 20 nm) made of a $SiO_2$ film, and an n-type polysilicon electrode 2017 functioning as the upper electrode, formed in this order on a p-type silicon substrate 2011. The semiconductor film 2013 is quantized. A plurality of quantized silicon microparticles 2015 (particle diameter: 5 nm) are buried between the second tunnel barrier film 2014 and the insulating film 2016. Preferably, the thickness of the first tunnel barrier film 2012 is in the range of 2 to 3 nm, the thickness of the semiconductor film 2013 is in the range of 2 to 8 nm, the thickness of the second tunnel barrier film 2014 is in the range of 2 to 3 nm, the thickness of the insulating film 2016 is in the range of 5 to 20 nm, and the diameter of the silicon microparticles 2015 is in the range of 2 to 8 nm. The surface density of the silicon microparticles 2015 is preferably in the range of about $1 \times 10^{12}$ cm$^{-2}$ to $3 \times 10^{12}$ cm$^{-2}$.

Fabrication Process of Semiconductor Device of Embodiment 9

First, the p-type silicon substrate 2011 is oxidized and nitrided under the presence of a nitride compound (substrate temperature: 800° C.), to form the first tunnel barrier film 2012 made of a silicon oxide nitride film on the p-type silicon substrate 2011. The resultant substrate is placed on a susceptor in a chamber of a CVD apparatus, to deposit the semiconductor film 2013 made of a polysilicon film on the first tunnel barrier film 2012. Subsequently, in the same chamber, the second tunnel barrier film 2014 made of a SiO$_2$ film is deposited on the semiconductor film 2013. With the resultant substrate kept placed on the susceptor in the same chamber (substrate temperature: 580° C.), SiH$_4$ as the material gas is introduced into the chamber of the CVD apparatus for a short time period, to form the plurality of silicon microparticles 2015 on the second tunnel barrier film 2014. The resultant substrate is exposed to an atmosphere of oxygen or steam for a short time period, to allow the surface portions of the silicon microparticles 2015 to be oxidized by a thickness of about 1 nm and thereby isolate the silicon microparticles 2015 from one another by the existence of SiO$_2$. Thereafter, the insulating film 2016 made of SiO$_2$ is deposited on the second tunnel barrier film 2014 and the silicon microparticles 2015. The n-type polysilicon electrode 2017 is then formed on the insulating film 2016. It would be understood that by repeating the formation of the silicon microparticles 2015 by CVD and the subsequent oxidation of the surfaces of the silicon microparticles 2015, the surface density of the silicon microparticles 2015 can be increased to an appropriate value.

Electron Injection, Holding, and Release Mechanism of Semiconductor Device of Embodiment 9

Hereinafter, the electron injection, holding, and release mechanism of this embodiment will be described focusing on the difference from that of the conventional semiconductor device. The electron injection, holding, and release mechanism of the conventional semiconductor device is as described in EMBODIMENT 1.

Figure 17:
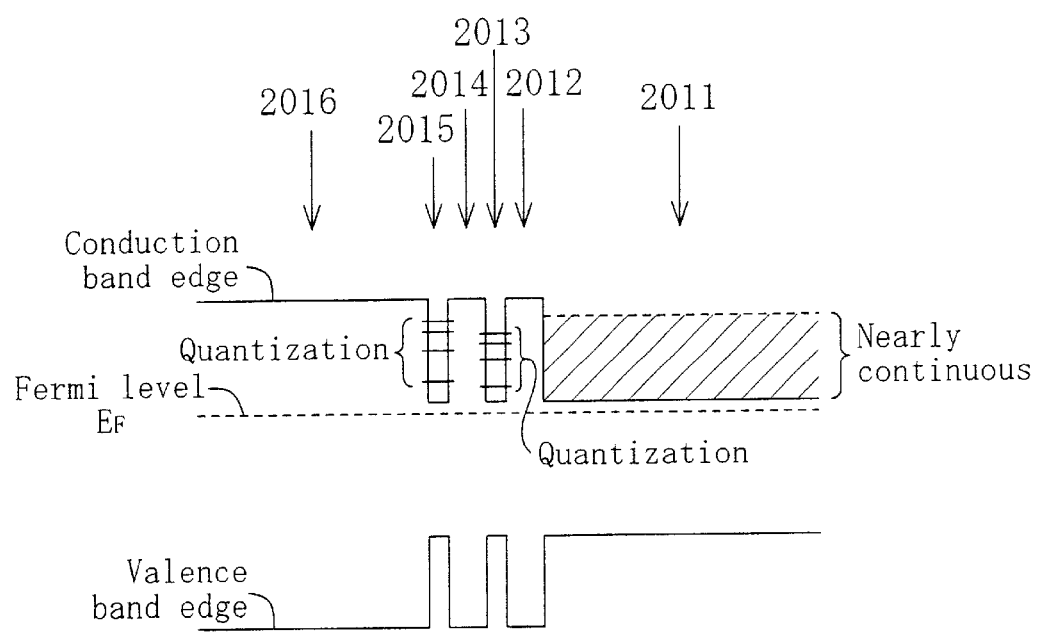
FIG. 17 is a band diagram of the semiconductor device of EMBODIMENT 9.

FIG. 17 is a band diagram of the semiconductor device of EMBODIMENT 9. The energy states (energy levels) to be given by electrons in the silicon microparticles 2015 are quantized because the diameter of the silicon microparticles 2015 is extremely small. The energy level of the semiconductor film 2013 is quantized to be discrete because the thickness of the semiconductor film 2013 is extremely small. Therefore, the energy levels of both the silicon microparticles 2015 and the semiconductor film 2013 are quantized as shown in FIG. 17.

The state density of the silicon microparticles 2015 is higher as the energy is higher. Accordingly, the distance between the energy levels (discrete energy width) is large when the energy level is low, and it is small when the energy level is high. As the state density is higher, also, the electron transfer probability is higher. Likewise, the discrete energy width of the semiconductor film 2013 is large when the energy level is low, and it is small when the energy level is high. However, the discrete energy width of the semiconductor film 2013 is smaller than that of the silicon microparticles 2015. Accordingly, the potential at the portion of the semiconductor film 2013 having a small discrete energy width is smaller than that at the portion of the silicon microparticles 2015 having a small discrete energy width.

In normal tunneling, the potentials at the energy levels on both sides of a barrier layer to be tunneled through must be identical with each other. Therefore, when no voltage is applied, tunneling occurs between the silicon microparticles 2015 and the semiconductor film 2013 only when one of the quantized energy levels of the silicon microparticles 2015 and one of the quantized energy levels of the semiconductor film 2013 on both sides of the second tunnel barrier film 2014 have potentials identical with each other. The probability of tunneling is therefore very low. In the case where the capacitance of the silicon microparticles 2015 is sufficiently small, only when a voltage is applied so that the potentials at the quantized energy levels of the silicon microparticles 2015 and the semiconductor film 2013 are made identical with each other, electron transfer therebetween will be efficiently performed by resonant tunneling. Otherwise, electron transfer is suppressed. In other words, it is possible to control the electron transfer between the silicon microparticles 2015 and the semiconductor film 2013 by an externally applied voltage, and moreover it is possible to hold electrons once injected into the silicon microparticle 2015 over a prolonged period.

In the conduction band of the p-type silicon substrate 2011, the energy levels of electrons are nearly continuous at a high state density. It is therefore considered that the p-type silicon substrate 2011 has an energy level having the same potential as that at any quantized energy level of the semiconductor film 2013. Accordingly, the tunneling between the semiconductor film 2013 and the p-type silicon substrate 2011 will not be prohibited at least in the aspect of energy. Furthermore, the area of the semiconductor film 2013 is large enough to have a large spatial overlap of state functions between the semiconductor film 2013 and the p-type silicon substrate 2011 sandwiching the first tunnel barrier film 2012. Therefore, swift tunneling occurs between the semiconductor film 2013 and the p-type silicon substrate 2011 however the voltage applied to the n-type polysilicon electrode 2017 is varied, resulting in that the semiconductor film 2013 has the same potential as the p-type silicon substrate 2011. That is, electron transfer between the semiconductor film 2013 and the p-type silicon substrate 2011 is easy.

Figure 18A:
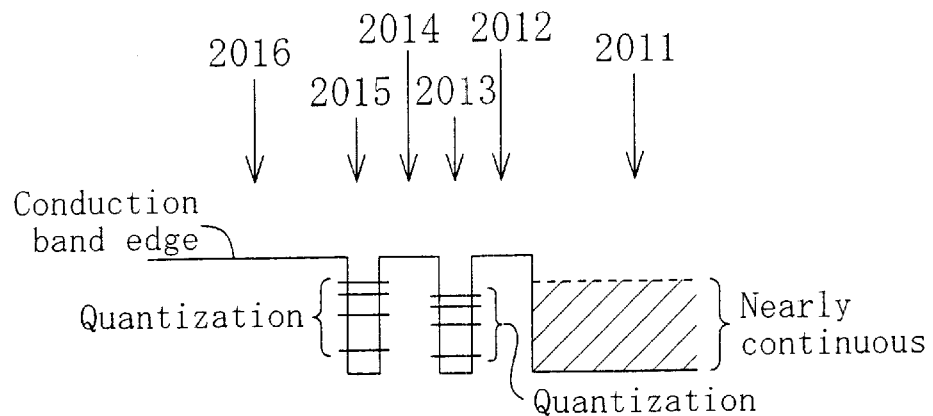
FIGS. 18(a), 18(b), and 18(c) are partial band diagrams showing the energy band states during electron injection and holding in the semiconductor device of EMBODIMENT 9.
Figure 18B:
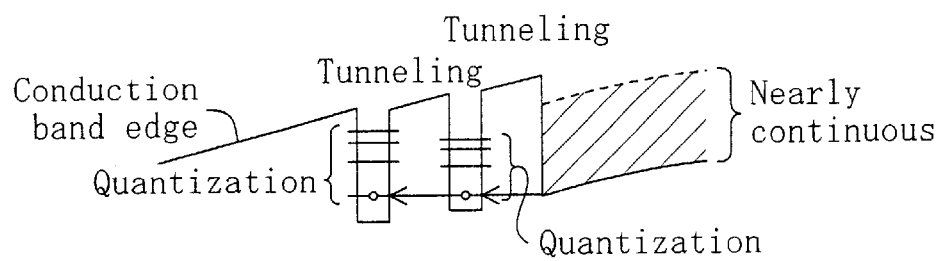

FIGS. 18(*a*), 18(*b*), and 18(*c*) are partial band diagrams of the semiconductor device of this embodiment during the electron injection and holding. In FIGS. 18(*a*), 18(*b*), and 18(*c*), illustration of the valence band is omitted for easy understanding.

Referring to FIG. 18(*a*), no electron transfer occurs between the p-type silicon substrate 2011 and the semiconductor film 2013 or the silicon microparticles 2015 before a voltage is applied to the n-type polysilicon electrode 2017.

Referring to FIG. 18(*b*), when a certain positive voltage is applied to the n-type polysilicon electrode 2017, electron transfer easily occurs from the p-type silicon substrate 2011 to vacant energy levels of the semiconductor film 2013 and from the energy levels of the semiconductor film 2013 to vacant energy levels of the silicon microparticles 2015. In general, a plurality of silicon microparticles 2015 have different diameters. Therefore, the quantized energy levels of the silicon microparticles 2015 have different potentials. This means that by the application of a certain voltage some of the quantized energy levels of electrons in the semiconductor film 2013 happen to be identical in potential with the energy levels of some silicon microparticles 2015 without the necessity of special strict voltage control. Thus, once a positive voltage is applied to the n-type polysilicon electrode 2017, electrons can be injected from the p-type silicon substrate 2011 to a plurality of silicon microparticles 2015 via the semiconductor film 2013.

The distance between the quantized energy levels (discrete energy width) is smaller as the potential is larger, as described above. By applying a higher voltage, therefore, high-level dense portions of quantized energy level groups of the silicon microparticles 2015 and the semiconductor film 2013 are likely to have the same potential, and also the state density increases. As a result, electrons are injected into a larger number of silicon microparticles 2015 having higher levels. Further, electron injection into a larger number of silicon microparticles 2015 is possible by sweeping the applied voltage within a fixed range or superimposing a radio frequency.

Figure 18C:
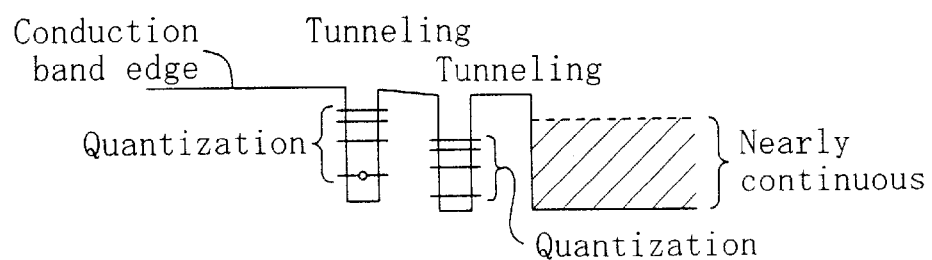

Referring to FIG. 18(c), when the application of the voltage to the n-type polysilicon electrode 2017 is terminated after the electron injection into the plurality of silicon microparticles 2015, the potential at the silicon microparticles 2015 increases while the potential at the conduction band of the p-type silicon substrate 2011 decreases.

In other words, upon termination of the voltage application, a change occurs in the hierarchical relationship in relative potential among the energy levels of the silicon microparticles, the energy levels of the semiconductor film, and the conduction band of the p-type silicon substrate. Note that after the electron injection to the plurality of silicon microparticles 2015, the potential at the silicon microparticles 2015 has increased from that before the electron injection (FIG. 18(a)).

When the voltage application is terminated, the energy levels of some of the silicon microparticles 2015 may happen to be identical in potential with some energy levels of the semiconductor film 2013, permitting tunneling therebetween. This results in loosing electrons in the silicon microparticles 2015 as in the conventional semiconductor device. In the semiconductor device of this embodiment, however, the energy levels of many of the silicon microparticles 2015 subjected to electron injection are not identical in potential with the energy levels of the semiconductor film, whereby electron transfer by tunneling between the silicon microparticles 2015 and the semiconductor film 2013 is prohibited.

Electrons are therefore held stably in the majority of the silicon microparticles 2015. Thus, the semiconductor of this embodiment allows for long-term electron holding.

Charge release can be done by applying a negative voltage to the n-type polysilicon electrode 2017. More specifically, when a voltage large enough to turn negative the n-type polysilicon electrode 2017 is applied, and the energy levels of the silicon microparticles 2015 become identical in potential with the energy levels of the semiconductor film 2013, electrons are released from the silicon microparticles 2015 to the semiconductor film 2013. Like the electron injection into the silicon microparticles 2015, more efficient charge release is possible by applying a comparatively large negative voltage, sweeping the applied voltage, or superimposing a high frequency.

As described above, in the semiconductor device of this embodiment, the semiconductor film 2013 having quantized energy levels is provided in the tunnel barrier film, unlike the conventional semiconductor device using a plurality of silicon microparticles. This makes easy the charge transfer between the silicon microparticles 2015 and the p-type silicon substrate 2011 by intervention of the semiconductor film 2013. Therefore, even though the second tunnel barrier film 2014 is thinned, it is possible to effectively suppress spontaneous release of accumulated electrons and hold electrons in the silicon microparticles 2015 over a prolonged period, unlike the conventional semiconductor device using a plurality of silicon microparticles. Utilizing the above effect, reliable control of electron injection into, holding in, and release from the microparticles is ensured. Thus, the semiconductor device of this embodiment will be a highly reliable device that responds to the request for prolonged recording retention while satisfying the request for high-speed operation and reduced operational power consumption.

Embodiment 10

Structure of Semiconductor Device of Embodiment 10

Figure 19:
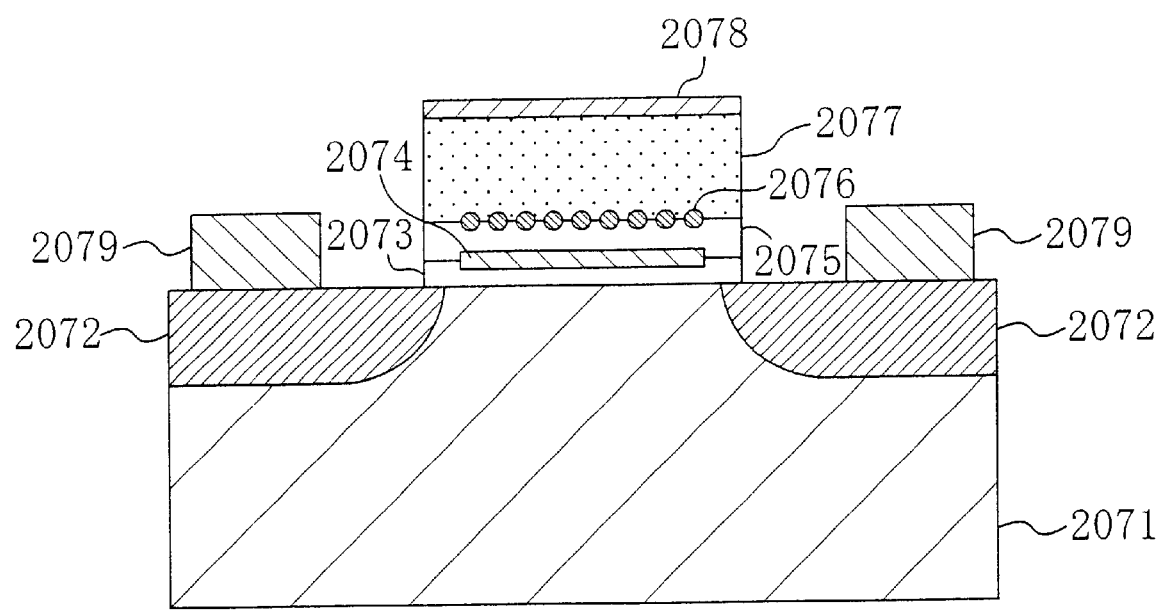
FIG. 19 is a cross-sectional view of a semiconductor device of EMBODIMENT 10 of the present invention.

FIG. 19 is a cross-sectional view of a semiconductor device of EMBODIMENT 10 of the present invention. The semiconductor device of this embodiment has a MIS transistor structure as shown in FIG. 19, which includes a first tunnel barrier film 2073 made of a silicon oxide nitride film, a semiconductor film 2074 made of a polysilicon film, a second tunnel barrier film 2075 made of a $SiO_2$ film, a gate insulating film 2077 made of a $SiO_2$ film, and an n-type polysilicon electrode 2078 functioning as the gate electrode, formed in this order on a p-type silicon substrate 2071. The semiconductor film 2074 is quantized. N-type diffusion regions 2072 as the source/drain regions are formed in portions of the p-type silicon substrate 2071 located below both sides of the n-type polysilicon electrode 2078. Metal electrodes 2079 functioning as the source/drain electrodes are formed on the n-type diffusion regions 2072. A plurality of quantized silicon microparticles 2076 are buried between the second tunnel barrier film 2075 and the gate insulating film 2077.

Fabrication Process of Semiconductor Device of Embodiment 10

First, the same semiconductor substrate as that in EMBODIMENT 9 is formed and subjected to film formation, photolithography, and etching, to form the first tunnel barrier film 2073, the semiconductor film 2074, the second tunnel barrier film 2075, the silicon microparticles 2076, the gate insulating film 2077, and the n-type polysilicon electrode 2078 on the p-type silicon substrate 2071 in the shape shown in FIG. 19. Thereafter, the n-type diffusion regions 2072 are formed by ion implantation, and the metal electrodes 2079 are formed by sputtering and etching. Thus, the semiconductor device of this embodiment is fabricated.

Characteristics of Semiconductor Device of Embodiment 10

In this embodiment, also, electron injection into, holding in, and release from the silicon microparticles 2076 are possible based on the principle described in EMBODIMENT 9. In addition, the semiconductor device of this embodiment has the MIS transistor structure, and the silicon microparticles 2076 for holding electrons are provided between the second tunnel barrier film 2075 and the gate insulating film 2077. This enables the threshold voltage of the device to change depending on whether or not electrons exist in the silicon microparticles 2076. The levels (high or low) of the threshold voltage are made associated with information H (high) and information L (low), respectively. In this way, information writing/reading is realized.

In this embodiment, as in EMBODIMENT 9, even though the second tunnel barrier film 2075 is thinned, electrons can be held in the silicon microparticles 2076 over a prolonged period. Thus, the semiconductor device of this embodiment will be a highly reliable device that responds to the request for prolonged recording retention while satisfying the request for high-speed operation and reduced operational power consumption of the device. Moreover, in this embodiment, since the single device can realize basic memory operation, high-density integration is possible.

In this embodiment, a region where the semiconductor film 2074 does not exist is preferably provided on or above at least one of the n-type diffusion regions 2072. This prevents a current short-circuited via the semiconductor film 2074 from flowing between the n-type diffusion regions 2072 when a voltage is applied to the n-type diffusion regions 2072.

In this embodiment, the semiconductor film 2074 may be divided into several portions in the direction vertical to the cross-section shown in FIG. 19. This also prevents a current short-circuited via the semiconductor film 2074 from flowing between the n-type diffusion regions 2072 when a voltage is applied to the n-type diffusion regions 2072.

Embodiment 11
Structure of Semiconductor Device of Embodiment 11

Figure 20:
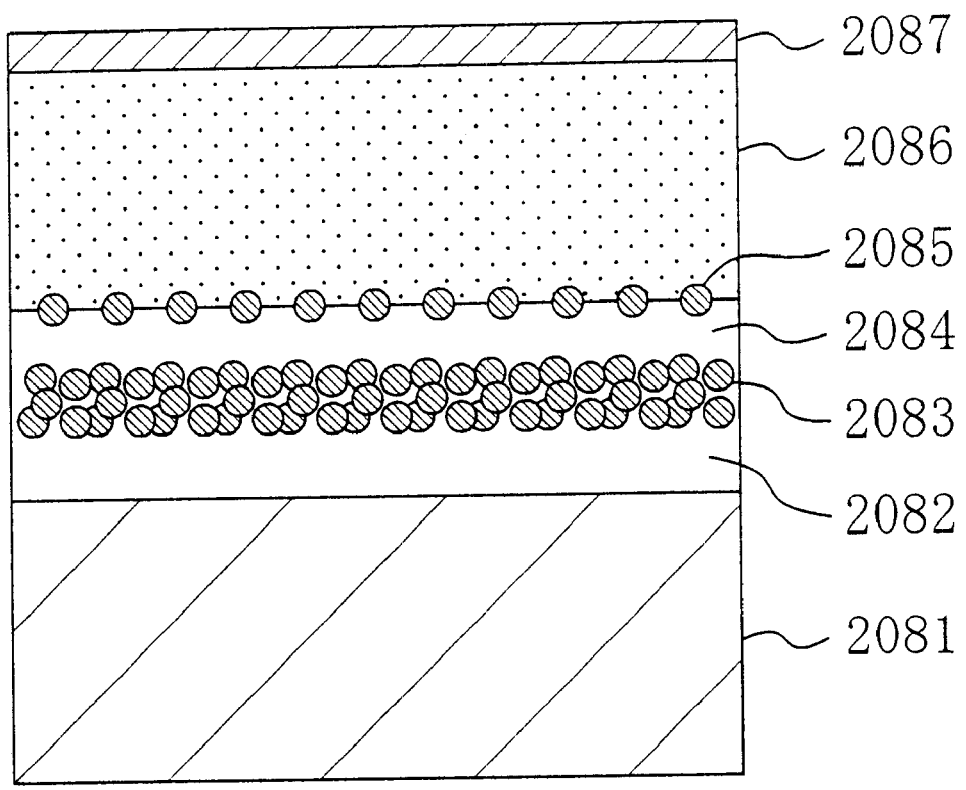
FIG. 20 is a cross-sectional view of a semiconductor device of EMBODIMENT 11 of the present invention.

FIG. 20 is a cross-sectional view of a semiconductor device of EMBODIMENT 11 of the present invention. The semiconductor memory device includes a first tunnel barrier film 2082 (thickness: 1.5 nm) made of a $SiO_2$ film, a second tunnel barrier film 2084 (thickness: 2 nm) made of a $SiO_2$ film, an insulating film 2086 (thickness: 20 nm) made of a $SiO_2$ film, and an n-type polysilicon electrode 2087 functioning as the upper electrode, formed in this order on a p-type silicon substrate 2081. A microparticle group 2083 made of a number of silicon microparticles (particle diameter: 5 nm) in contact with one another is buried between the first tunnel barrier film 2082 and the second tunnel barrier film 2084. The microparticles in the microparticle group 2083 are quantized. Further, a plurality of quantized silicon microparticles 2085 (particle diameter: 5 nm) are buried between the second tunnel barrier film 2084 and the insulating film 2086. The gaps among the respective silicon microparticles 2083 are made of $SiO_2$, the same material as that for the first and second tunnel barrier films 2082 and 2084. Preferably, the thickness of the first tunnel barrier film 2082 is in the range of 1 to 2 nm, the thickness of the second tunnel barrier film 2084 is in the range of 2 to 3 nm, the thickness of the insulating film 2086 is in the range of 5 to 20 nm, the diameter of the silicon microparticles in the microparticle group 2083 is in the range of 3 to 10 nm, the surface density of the silicon microparticles in the microparticle group 2083 is in the range of about $1\times10^{13}$ $cm^{-2}$ to $1\times10^{14}$ $cm^{-2}$, the diameter of the silicon microparticles 2085 is in the range of 2 to 5 nm, and the surface density of the silicon microparticles 2085 is in the range of about $1\times10^{12}$ $cm^{-2}$ to $1\times10^{13}$ $cm^{-2}$.

Fabrication Process of Semiconductor Device of Embodiment 11

First, the p-type silicon substrate 2081 is thermally oxidized (substrate temperature: 800° C.), to form the first tunnel barrier film 2082 made of a $SiO_2$ film on the p-type silicon substrate 2081. The resultant substrate is placed on a susceptor in a chamber of a CVD apparatus, and with a substrate temperature of 580° C., $SiH_4$ as the material gas is introduced into the chamber for a short time period, so as to form the microparticle group 2083 on the first tunnel barrier film 2082. The resultant substrate is exposed to an atmosphere of oxygen or steam for a short time period, to allow the surface portions of the respective silicon microparticles 2083 to be oxidized by a thickness of about 1 nm and thereby isolate the silicon microparticles 2083 from one another by the existence of $SiO_2$. Subsequently, in the same chamber, the second tunnel barrier film 2084 made of a $SiO_2$ film is deposited on the microparticle group 2083 and the first tunnel barrier film 2082. With the resultant substrate kept placed on the same susceptor in the same chamber (substrate temperature: 580° C.), $SiH_4$ as the material gas is introduced into the chamber of the CVD apparatus for a short time period, so as to form the plurality of silicon microparticles 2085 on the second tunnel barrier film 2084. The resultant substrate is exposed to an atmosphere of oxygen or steam for a short time period, to allow the surface portions of the respective silicon microparticles 2085 to be oxidized by a thickness of about 1 nm and thereby isolate the silicon microparticles 2085 from one another by the existence of $SiO_2$. Thereafter, the insulating film 2086 made of a $SiO_2$ film is deposited on the second tunnel barrier film 2084 and the silicon microparticles 2085 in the same chamber. The n-type polysilicon electrode 2087 is then formed on the insulating film 2086 in the same chamber. It would be understood that by repeating the formation of the silicon microparticles 2083 by CVD and the subsequent oxidation of the surfaces of the silicon microparticles 2083, the surface density of the silicon microparticles 2083 is increased to an appropriate value. This is also applicable to the surface density of the silicon microparticles 2085.

Electron Injection, Holding, and Release Mechanism of Semiconductor Device of Embodiment 11

In this embodiment, also, electron injection into, holding in, and release from the silicon microparticles 1135 are possible based on the principle described in EMBODIMENT 9. In this embodiment, the microparticle group 2083 plays substantially the same role as the semiconductor film 2013 in EMBODIMENT 9. Therefore, as in EMBODIMENT 9, the semiconductor device of this embodiment will be a highly reliable device that responds to the request for prolonged recording retention while satisfying the request for high-speed operation and reduced operational power consumption of the device.

In this embodiment, the silicon microparticles 2085 and the silicon microparticles in the microparticle group 2083 are made of the same material and have roughly the same particle diameters. Therefore, the energy levels of the respective silicon microparticles 2085 for holding electrons and the energy levels of the respective silicon microparticles in the microparticle group 2083 are quantized in the form of quantum boxes under the same conditions, resulting in having similar band structures to each other. This facilitates the electron injection and release by tunneling. In this embodiment, therefore, control of electron injection and release is easier compared with the structure of EMBODIMENT 9. After the electron injection into the silicon microparticles 2085, the potential at the silicon microparticles 2085 has risen from that before the electron injection. This differentiates the energy level potential at the silicon microparticles 2085 from that at the silicon microparticles in the microparticle group 2083 even though these microparticles are made of the same material. Thus, spontaneous release of electrons from the silicon microparticles 2085 is suppressed. Alternatively, the silicon microparticles in the microparticle group 2083 and the silicon microparticles 2085 may be made of different constructions. For example, the silicon microparticles in the microparticle group 2083 may be made of amorphous silicon, while the silicon microparticles 2085 may be made of single crystalline silicon.

For adjusting the conditions under which the electron injection, holding, and release occur by changing the energy levels of the silicon microparticles 2085 and the energy levels of the silicon microparticles in the microparticle group 2083, the diameter of the silicon microparticles 2085 may be made different from that of the silicon microparticles in the microparticle group 2083.

Moreover, this embodiment is advantageous in that control of fine structures during device fabrication is easy compared with EMBODIMENT 9. More specifically, the quantum box structure of the microparticle group 2083 in this embodiment has a high degree of discreteness of the energy levels compared with the quantum well structure of the semiconductor film 2013 in EMBODIMENT 9. In this embodiment, therefore, the effect of the quantization is large even if the size of the silicon microparticles in the microparticle group 2083 is comparatively large, permitting electron holding for a prolonged period. In this embodiment, therefore, high precision is not required during device fabrication, compared with the case of EMBODIMENT 9.

In the fabrication process, it is easier to control a variation in the thickness of the semiconductor film 2013 in EMBODIMENT 9 than a variation in the diameter of the silicon microparticles in the microparticle group 2083 in this embodiment. The semiconductor device of EMBODIMENT 9 is therefore advantageous over the semiconductor device of this embodiment in the aspect of uniformity of characteristics.

In this embodiment, the silicon microparticles in the microparticle group 2083 are in contact with one another, which therefore will not block swift electron transfer between the silicon microparticles in the microparticle group 2083 and the silicon microparticles 2085 and between the silicon microparticles in the microparticle group 2083 and the p-type silicon substrate 2081.

In this embodiment, the first tunnel barrier film 2082 is thinner than the second tunnel barrier film 2084. This further facilitates the electron transfer between the silicon microparticles in the microparticle group 2083 and the p-type silicon substrate 2081.

In this embodiment, the diameter of the silicon microparticles in the microparticle group 2083 may be larger than the diameter of the silicon microparticles 2085. This will increase the probability of the existence of a microparticle in the microparticle group 2083 in the vicinity of the straight line connecting a certain microparticle 2085 and the p-type silicon substrate 2081, thereby facilitating the electron transfer between the p-type silicon substrate 2081 and the silicon microparticle 2085 via the microparticle group 2083.

In this embodiment, the surface density of the silicon microparticles in the microparticle group 2083 is higher than. the surface density of the silicon microparticles 2085, thereby reducing the distance between the silicon microparticles in the microparticle group 2085. This also increases the probability of the existence of a microparticle in the microparticle group 2083 in the vicinity of the straight line connecting a certain microparticle 2085 and the p-type silicon substrate 2081, thereby facilitating the electron transfer between the p-type silicon substrate 2081 and the silicon microparticle 2085 via the microparticle group 2083.

Embodiment 2

Structure of Semiconductor Device of Embodiment 12

Figure 21:
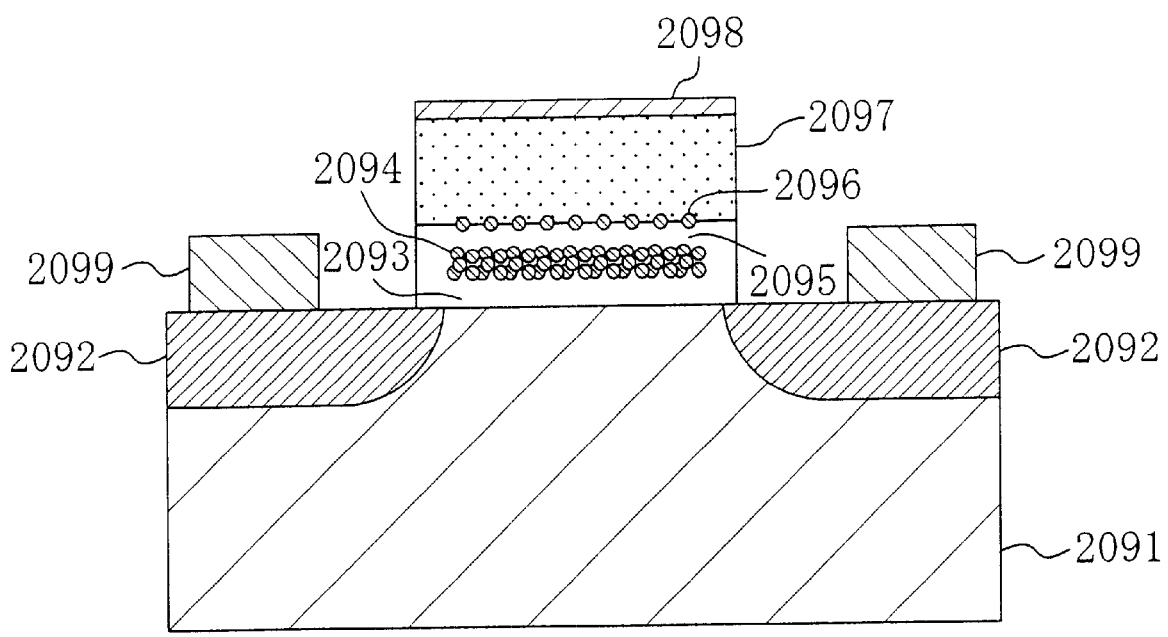
FIG. 21 is a cross-sectional view of a semiconductor device of EMBODIMENT 12 of the present invention.

FIG. 21 is a cross-sectional view of a semiconductor device of EMBODIMENT 12 of the present invention. The semiconductor device of this embodiment has a MIS transistor structure as shown in FIG. 21, which includes first and second tunnel barrier films 2093 and 2095 made of a $SiO_2$ film, a gate insulating film 2097 made of a $SiO_2$ film, and an n-type polysilicon electrode 2098 functioning as the gate electrode, formed in this order on a p-type silicon substrate 2091. N-type diffusion regions 2092 are formed in portions of the p-type silicon substrate 2091 located below both sides of the n-type polysilicon electrode 2098. Metal electrodes 2099 functioning as the source/drain electrodes are formed on the n-type diffusion regions 2092. A microparticle group 2094 made of a number of silicon microparticles in contact with one another is buried between the first tunnel barrier film 2093 and the second tunnel barrier film 2095. The microparticles in the microparticle group 2094 are quantized. Further, a plurality of quantized silicon microparticles 2096 are buried between the second tunnel barrier film 2095 and the gate insulating film 2097. The microparticles in the microparticle group 2094 may be put on one another to form a plurality of layers as shown in FIG. 21. The gaps among the respective silicon microparticles 2083 are made of $SiO_2$, the same material as that for the first and second tunnel barrier films 2093 and 2095.

The silicon microparticles in the microparticle group 2094 and the silicon microparticles 2096 may be of different construction. For example, the silicon microparticles of the microparticle group 2094 may be made of amorphous silicon, and the silicon microparticles 2096 may be made of single crystalline silicon.

Fabrication Process of Semiconductor Device of Embodiment 12

First, the same semiconductor substrate as that in EMBODIMENT 11 is formed and subjected to film formation, photolithography, and etching, to form the first tunnel barrier film 2093, the microparticle group 2094, the second tunnel barrier film 2095, the silicon microparticles 2096, the gate insulating film 2097, and the n-type polysilicon electrode 2098 on the p-type silicon substrate 2091 in the shape shown in FIG. 21. Thereafter, the n-type diffusion regions 2092 are formed by ion implantation, and the metal electrodes 2099 are formed by sputtering and etching. Thus, the semiconductor device of this embodiment is fabricated.

Characteristics of Semiconductor Device of Embodiment 12

In this embodiment, also, electron injection into, holding in, and release from the silicon microparticles 2096 are possible based on the principle described in EMBODIMENT 11. In addition, the semiconductor device of this embodiment has the MIS transistor structure, and the silicon microparticles 2096 for holding electrons are provided between the first and second tunnel barrier film 2093 and 2095 and the gate insulating film 2097. This enables the threshold voltage of the device to change depending on whether or not electrons exist in the silicon microparticles 2096. The levels (high or low) of the threshold voltage are made associated with information H (high) and information L (low), respectively. In this way, information writing/reading is realized.

Thus, the semiconductor device of this embodiment will be a highly reliable device that responds to the request for prolonged recording retention while satisfying the request for high-speed operation and reduced operational power consumption of the device. Moreover, in this embodiment, since the single device can realize basic memory operation, high-density integration is possible.

In this embodiment, a region where the microparticle group 2094 does not exist is preferably provided on or above at least one of the n-type diffusion regions 2092. This prevents a current short-circuited via the microparticle group 2094 from flowing between the n-type diffusion regions 2092 when a voltage is applied to the n-type diffusion regions 2092.

In this embodiment, the layer of the microparticle group 2094 may be divided into several portions in the direction vertical to the cross-section shown in FIG. 21. This also prevents a current short-circuited via the layer of the microparticle group 2094 from flowing between the n-type diffusion regions 2092 when a voltage is applied to the n-type diffusion regions 2092.

Embodiment 13

Structure of Semiconductor Device of Embodiment 13

Figure 22:
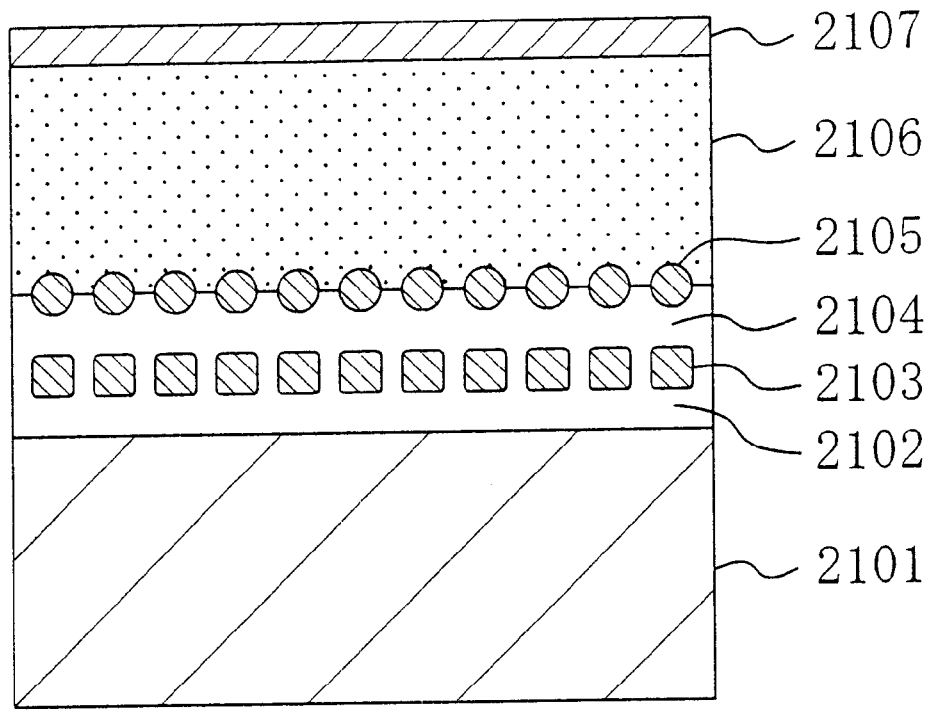
FIG. 22 is a cross-sectional view of a semiconductor device of EMBODIMENT 13 of the present invention.

FIG. 22 is a cross-sectional view of a semiconductor device of EMBODIMENT 13 of the present invention. The semiconductor memory device includes a first tunnel barrier film 2102 (thickness: 1.5 nm) made of a $SiO_2$ film, a second tunnel barrier film 2104 (thickness: 2 nm) made of a $SiO_2$ film, an insulating film 2106 (thickness: 20 nm) made of a $SiO_2$ film, and an n-type polysilicon electrode 2107 functioning as the upper electrode, formed in this order on a p-type silicon substrate 2101. A plurality of wires 2103 (height: 5 nm, width: 10 nm, length: 100 nm) made of polysilicon are buried between the first tunnel barrier film 2102 and the second tunnel barrier film 2104. The wires 2103 are quantized. Further, a plurality of quantized silicon microparticles 2105 (particle diameter: 5 nm) are buried between the second tunnel barrier film 2104 and the insulating film 2106. The respective wires 2103 are isolated from one another by SiO$_2$, the same material as that for the first and second tunnel barrier films 2102 and 2104. Preferably, the thickness of the first tunnel barrier film 2102 is in the range of 1 to 2 nm, the thickness of the second tunnel barrier film 2104 is in the range of 2 to 3 nm, the thickness of the insulating film 2106 is in the range of 5 to 20 nm, the diameter of the silicon microparticles 2105 is in the range of 2 to 8 nm, and the surface density of the silicon microparticles 2105 is in the range of about $2 \times 10^{12}$ cm$^{-2}$ to $6 \times 10^{12}$ cm$^{-2}$.

Fabrication Process of Semiconductor Device of Embodiment 13

First, the p-type silicon substrate 2101 is thermally oxidized (substrate temperature: 800° C.), to form the first tunnel barrier film 2102 made of SiO$_2$ on the p-type silicon substrate 2101. The resultant substrate is placed on a susceptor in a chamber of a CVD apparatus. A polysilicon film having a thickness of 5 nm is deposited on the substrate and then subjected to electron beam lithography and dry etching, to form the plurality of wires 2103 made of polysilicon on the first tunnel barrier film 2102. In the same chamber, the second tunnel barrier film 2104 made of SiO$_2$ is deposited on the wires 2103 and the first tunnel barrier film 2102. With the resultant substrate kept placed on the susceptor in the same chamber (substrate temperature: 580° C.), SiH$_4$ as the material gas is introduced into the chamber for a short time period, to form the plurality of silicon microparticles 2105 on the second tunnel barrier film 2104. The resultant substrate is exposed to an atmosphere of oxygen or steam for a short time period, to allow the surface portions of the respective silicon microparticles 2105 to be oxidized by a thickness of about 1 nm and thereby isolate the silicon microparticles 2105 from one another by the existence of SiO$_2$. Subsequently, in the same chamber, the insulating film 2106 made of a SiO$_2$ film is formed on the second tunnel barrier film 2104 and the silicon microparticles 2105. The n-type polysilicon electrode 2107 is then formed on the insulating film 2106 in the same chamber. It would be understood that by repeating the formation of the silicon microparticles 2105 by CVD and the subsequent oxidation of the surfaces of the silicon microparticles 2105, the surface density of the silicon microparticles 2105 is increased to an appropriate value.

Electron Injection, Holding, and Release Mechanism of Semiconductor Device of Embodiment 13

In this embodiment, also, electron injection into, holding in, and release from the silicon microparticles 2105 are possible based on the principle described in EMBODIMENT 9. In this embodiment, the wires 2103 play substantially the same role as the semiconductor film 2013 in EMBODIMENT 9. Therefore, as the semiconductor device of EMBODIMENT 9, the semiconductor device of this embodiment will be a highly reliable device that responds to the request for prolonged recording retention while satisfying the request for high-speed operation and reduced operational power consumption of the device.

This embodiment is advantageous in that control of fine structures during device fabrication is easy compared with EMBODIMENT 9. More specifically, the quantum wire structure of the wires 2103 in this embodiment has a large degree of discreteness of the energy levels compared with the quantum well structure of the semiconductor film 2013 in EMBODIMENT 9. In this embodiment, therefore, the effect of the quantization is large even if the size of the wires 2103 is comparatively large, enabling electrons to be held for a prolonged period. In this embodiment, therefore, high precision is not required during device fabrication, compared with the case of EMBODIMENT 9.

Embodiment 14

Structure of Semiconductor Device of Embodiment 14

Figure 23:
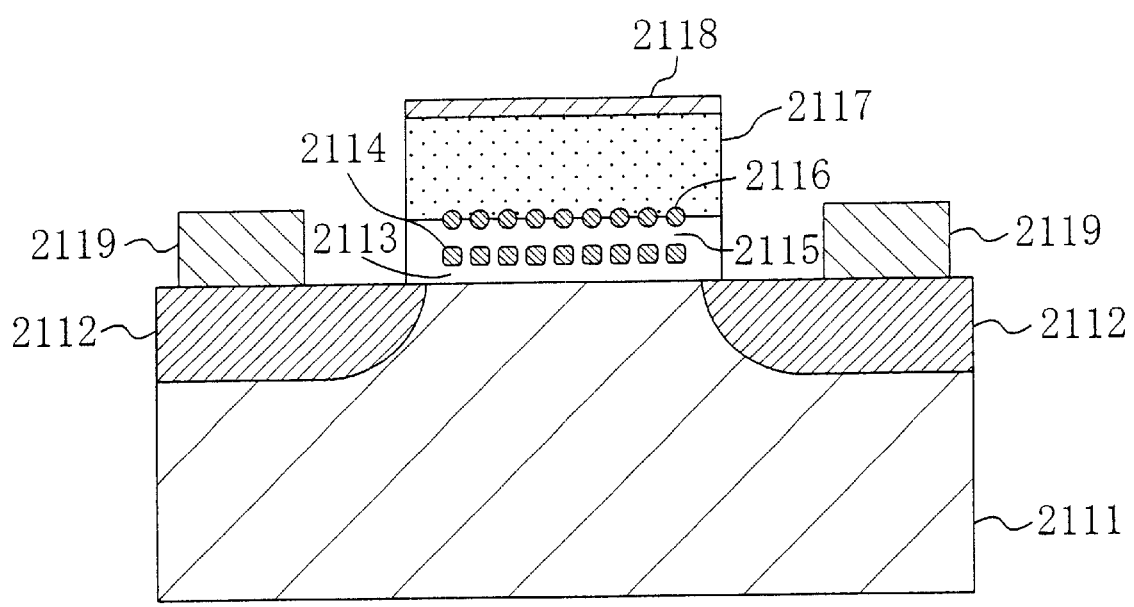
FIG. 23 is a cross-sectional view of a semiconductor device of EMBODIMENT 14 of the present invention.

FIG. 23 is a cross-sectional view of a semiconductor device of EMBODIMENT 14 of the present invention. The semiconductor device of this embodiment has a MIS transistor structure as shown in FIG. 23, which includes first and second tunnel barrier films 2113 and 2115 made of SiO$_2$, a gate insulating film 2117 made of SiO$_2$, and an n-type polysilicon electrode 2118 functioning as the gate electrode, formed in this order on a p-type silicon substrate 2111. N-type diffusion regions 2112 are formed in portions of the p-type silicon substrate 2111 located below both sides of the n-type polysilicon electrode 2118. Metal electrodes 2119 functioning as the source/drain electrodes are formed on the n-type diffusion regions 2112. Wires 2114 made of polysilicon are buried between the first tunnel barrier film 2113 and the second tunnel barrier film 2115. The wires 2114 are quantized. Further, a plurality of quantized silicon microparticles 2116 are buried between the second tunnel barrier film 2115 and the gate insulating film 2117. The wires 2114 are isolated from one another by SiO$_2$, the same material as that for the first and second tunnel barrier films 2113 and 2115. The wires 2114 may be put on one another forming a plurality of layers. The orientations of the wires 2114 may not be uniform, and may be arbitrary.

Fabrication Process of Semiconductor Device of Embodiment 14

First, the same semiconductor substrate as that in EMBODIMENT 13 is formed and subjected to film formation, photolithography, and etching, to form the first tunnel barrier film 2113, the wires 2114, the second tunnel barrier film 2115, the silicon microparticles 2116, the gate insulating film 2117, and the n-type polysilicon electrode 2118 on the p-type silicon substrate 2111 in the shape shown in FIG. 23. Thereafter, the n-type diffusion regions 2112 are formed by ion implantation, and the metal electrodes 2119 are formed by sputtering and etching. Thus, the semiconductor device of this embodiment is fabricated.

Characteristics of Semiconductor Device of Embodiment 14

In this embodiment, also, electron injection into, holding in, and release from the silicon microparticles 2116 are possible based on the principle described in EMBODIMENT 13. In addition, the semiconductor device of this embodiment has the MIS transistor structure, and the silicon microparticles 2116 for holding electrons are provided between the first and second tunnel barrier films 2113 and 2115 and the gate insulating film 2117. This enables the threshold voltage of the device to change depending on whether or not electrons exist in the silicon microparticles 2116. The levels (high or low) of the threshold voltage are made associated with information H (high) and information L (low), respectively. In this way, information writing/reading is realized.

Thus, the semiconductor device of this embodiment will be a highly reliable device that responds to the request for prolonged recording retention while satisfying the request for high-speed operation and reduced operational power consumption of the device. Moreover, in this embodiment, since the single device can realize basic memory operation, high-density integration is possible.

In this embodiment, a region where the wires 2114 do not exist is preferably provided on or above at least one of the n-type diffusion regions 2112. This prevents a current short-circuited via the wires 2114 from flowing between the n-type diffusion regions 2112 when a voltage is applied to the n-type diffusion regions 2112.

In this embodiment, the layer of the wires 2114 may be divided into several portions in the direction vertical to the cross-section shown in FIG. 23. This also prevents a current short-circuited via the layer of the wires 2114 from flowing between the n-type diffusion regions 2112 when a voltage is applied to the n-type diffusion regions 2112.

Embodiment 15

Structure of Semiconductor Device of Embodiment 15

Figure 24:
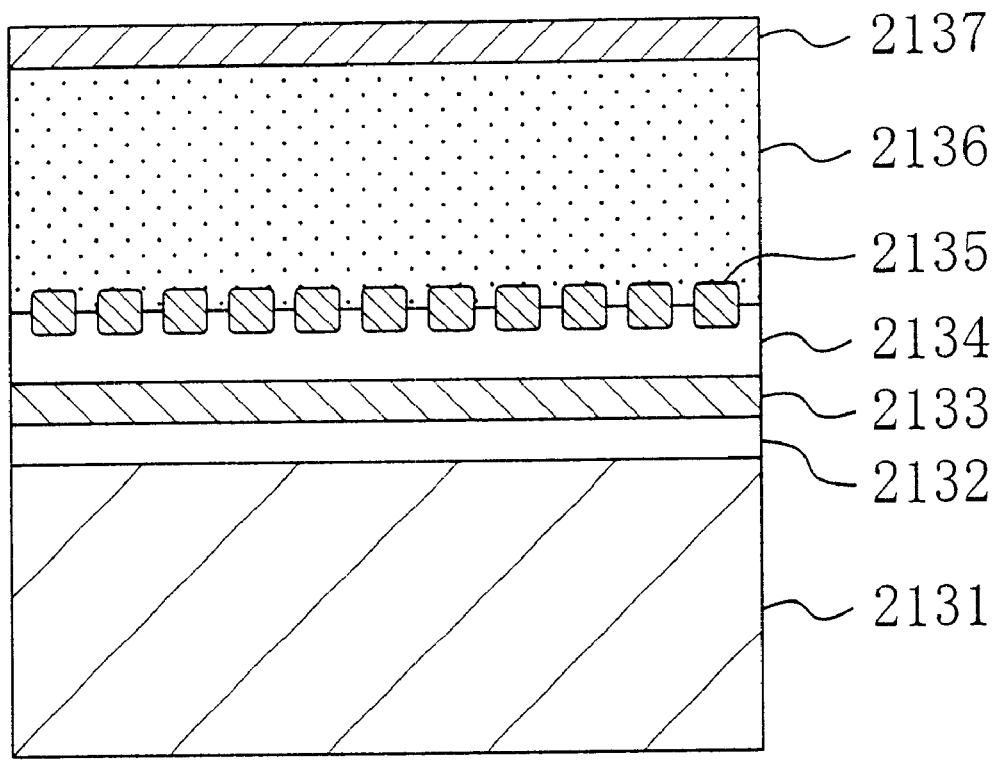
FIG. 24 is a cross-sectional view of a semiconductor device of EMBODIMENT 15 of the present invention.

FIG. 24 is a cross-sectional view of a semiconductor device of EMBODIMENT 15 of the present invention. The semiconductor memory device includes a first tunnel barrier film 2132 (thickness: 2 nm) made of a silicon oxide nitride film, a semiconductor film 2133 (thickness: 5 nm) made of polysilicon film, a second tunnel barrier film 2134 (thickness: 2 nm) made of $SiO_2$, an insulating film 2136 (thickness: 20 nm) made of $SiO_2$, and an n-type polysilicon electrode 2137 functioning as the upper electrode, formed in this order on a p-type silicon substrate 2131. The semiconductor film 2133 is quantized. A plurality of quantized wires 2135 (height: 5 nm, width: 10 nm, length: 100 nm) made of polysilicon are buried between the second tunnel barrier film 2134 and the insulating film 2136. Preferably, the thickness of the first tunnel barrier film 2132 is in the range of 2 to 3 nm, the thickness of the semiconductor film 2133 is in the range of 2 to 8 nm, the thickness of the second tunnel barrier film 2134 is in the range of 2 to 3 nm, and the thickness of the insulating film 2136 is in the range of 5 to 20 nm.

Fabrication Process of Semiconductor Device of Embodiment 15

First, the p-type silicon substrate 2131 is oxidized and nitrided under the presence of an nitrogen compound (substrate temperature: 800° C.), to form the first tunnel barrier film 2132 made of silicon oxide nitride. The resultant substrate is placed on a susceptor in a chamber of a CVD apparatus, to deposit the semiconductor film 2133 made of polysilicon on the first tunnel barrier film 2132. In the same chamber, the second tunnel barrier film 2134 made of $SiO_2$ is sequentially deposited on the semiconductor film 2133. Subsequently, in the same chamber, a polysilicon film having a thickness of 5 nm is deposited and subjected to electron beam lithography and dry etching, to form the plurality of wires 2135 made of polysilicon on the second tunnel barrier film 2134. In the same chamber, the insulating film 2136 made of $SiO_2$ is then deposited on the second tunnel barrier film 2134 and the wires 2135. The n-type polysilicon electrode 2137 is then formed on the insulating film 2136.

Electron Injection, Holding, and Release Mechanism of Semiconductor Device of Embodiment 15

In this embodiment, as in the above embodiments, since the semiconductor film 2133 and the polysilicon wires 2135 are quantized, control of electron transfer between the wires 2135 and the p-type silicon substrate 2131 is possible. In other words, electron transfer occurs only when the energy level of the wires 2135 is identical in potential with the energy level of the semiconductor film 2133. This allows for effective suppression of spontaneous release of electrons accumulated in the wires 2135, and thus enables electrons to be held in the wires 2135 for a prolonged period. As a result, under an appropriate electric field, electrons can be easily injected from the p-type silicon substrate 2131 into the wires 2135 and easily released from the wires 2135 toward the p-type silicon substrate 2131. Utilizing the above effect, reliable control of electron injection into, holding in, and release from the wires 2135 is ensured. Thus, the semiconductor device of this embodiment will be a highly reliable device that responds to the request for prolonged recording retention while satisfying the request for high-speed operation and reduced operational power consumption.

(Modifications of Embodiments 9 to 15)

In EMBODIMENTS 9 to 15 above, electrons were used as the charge injected and accumulated in the silicon microparticles. Instead, holes may be used for injection and accumulation.

Substrate

In EMBODIMENTS 9 to 15, the p-type silicon substrate was used. Alternatively, an n-type silicon substrate, or a substrate made of GaAs or any other semiconductor material may be used.

The use of the p-type silicon substrate as in the above embodiments allows for use of high-precision silicon process technology and high-density integration of semiconductor devices.

Tunnel Barrier Film

In EMBODIMENTS 9 to 15, $SiO_2$ and the like were used as the materials for the tunnel barrier films and the insulating films. Alternatively, other insulating materials such as $Si_3N_4$, $Si_xO_yN_z$ (4x=2y+3z), $CeO_2$, ZnS, ZnO, and $Al_2O_3$ may be used.

The tunnel barrier film in EMBODIMENTS 9 to 15 refers to a barrier film that has a property of blocking a thermal diffusion current but transmitting a tunnel current.

In normal, the first and second tunnel barrier films desirably have a barrier height of at least 1 eV relative to the upper and lower films sandwiching the tunnel barrier films, and have a thickness of 50 nm or less. Further, for functioning as a good tunnel barrier film, the first and second tunnel barrier films desirably have a thickness in the range between 1 nm and 6 nm, inclusive and are made of an insulating material. Otherwise, the first and second tunnel barrier films desirably have a thickness in the range between 3 nm and 50 nm, inclusive and are made of a semiconductor material having a band gap larger than the band gap of the semiconductor substrate, the plurality of microparticles, the semiconductor film, and the wires.

As the insulating material, $SiO_2$, $Si_3N_4$, $Al_2O_3$, $CeO_2$, and the like are especially suitable. In addition to the films of these insulating materials, also usable are combinations of these insulating films, and films having a mixed composition of these insulating materials such as $Si_xO_yN_z$ (4x=2y+3z). When amorphous $SiO_2$ is to be used, an especially good tunnel characteristic is obtained if the thickness thereof is in the range of 1 to 3 nm. When $Si_3N_4$ is to be used, an especially good tunnel characteristic is obtained if the thickness thereof is in the range of 2 to 6 nm. As the semiconductor material, C (diamond), AlN, GaN, AlP, GaP, ZnO, ZnS, MgO, MgS, and the like, as well as mixed crystals thereof, are suitable.

The first tunnel barrier film does not directly contribute to charge confinement. Therefore, preferably, the first tunnel barrier film is made of an insulating or semiconductor material having a higher dielectric constant than $SiO_2$, such as $Si_3N_4$, $Si_xO_yN_z$, and $CeO_2$. For the same reason, the first tunnel barrier film can be made thinner than the second tunnel barrier film. Especially suitably, the thickness of the first tunnel barrier film is in the range between 1 nm and 4 nm, inclusive, if the first tunnel barrier film is made of an insulator, or in the range between 3 nm and 20 nm, inclusive, if it is made of a semiconductor.

On the contrary, the second tunnel barrier film contributes to charge confinement. Therefore, especially preferably, the second tunnel barrier film is made of a material having a comparatively low dielectric constant, such as $SiO_2$ and C (diamond). For the same reason, the second tunnel barrier film is preferably thick compared with the first tunnel barrier film. Especially suitably, the thickness of the second tunnel barrier film is in the range between 1.5 nm and 6 nm, inclusive, if the second tunnel barrier film is made of an insulator, or in the range between 4 nm and 40 nm, inclusive, if it is made of a semiconductor.

In EMBODIMENTS 11 to 14, the thickness of part of the first tunnel barrier film may be reduced to substantially zero. That is, the semiconductor device lacking part of the first tunnel barrier film may be fabricated. This simplifies the fabrication process for the semiconductor device, and can further increase the capacitance of the silicon microparticles in the microparticle group or the wires. In this case, the charge transfer in the semiconductor device is facilitated.

Microparticles

In EMBODIMENTS 9 to 14 above, as the microparticles, silicon microcrystal, amorphous silicon, single crystalline silicon, and other semiconductor materials may also be used. The microparticles may be composed of any one type of the above materials.

In the case of using silicon particles, high-precision silicon process technology can be easily applied because silicon particles are stable and less likely to be contaminated even in a high temperature atmosphere during the fabrication process. In the case of using metal particles, highquality microparticles with a uniform particle diameter can be easily formed uniformly at a high surface density.

In the case of using a semiconductor having a band gap of 2.0 eV or more as the material for the microparticles, a large distance is secured between the energy levels of the microparticles, thereby increasing the charge confinement effect. In particular, if the microparticles are made of a semiconductor having a band gap of 2.0 eV or more and the tunnel barrier film is made of an insulator such as $SiO_2$, the tunnel barrier height decreases. This enables the second tunnel barrier film to be made thick while securing the tunnel current. As a result, the capacitance of the charge holding microparticles decreases.

In EMBODIMENTS 9 to 14, the silicon microparticles may be of a flat shape. Adopting flat microparticles facilitates the fabrication process of the device particularly when the microparticles are formed by sputtering. In EMBODIMENTS 11 and 12, in particular, the flat shape increases the capacitance of the microparticle group. In this case, the flat shape enhances the probability of the existence of a silicon microparticle in the microparticle group in the vicinity of the straight line connecting a certain silicon microparticle for holding charge and the p-type silicon substrate. This facilitates the charge transfer between the p-type silicon substrate and the silicon microparticle for holding charge via the microparticle group existing therebetween. In EMBODIMENTS 9 to 14, the silicon microparticles may be put on one another forming a plurality of layers.

Semiconductor Film

In EMBODIMENTS 9, 10, and 15, the polysilicon film was used as the semiconductor film. Alternatively, amorphous silicon, single crystalline silicon, and other semiconductor materials may be used. The semiconductor film may be composed of any one type of the above materials. If the semiconductor film is composed of an amorphous silicon film or a polysilicon film, it is easy to employ high-precision silicon process technology because the silicon semiconductor film is stable and less likely to be contaminated even in a high temperature atmosphere during the fabrication process.

If the semiconductor film is made of a semiconductor having a band gap of 2.0 eV or more, a large distance is secured between the energy levels of the microparticles, thereby increasing the charge confinement effect. In particular, if the semiconductor film is made of a semiconductor having a band gap of 2.0 eV or more and the tunnel barrier film is made of an insulator such as $SiO_2$, the tunnel barrier height decreases. This enables the second tunnel barrier film to be made thick while securing the tunnel current. This facilitates the fabrication.

Wires

In EMBODIMENTS 13 and 14, polysilicon was used for the wires. Alternatively, amorphous silicon, single crystalline silicon, carbon nanotube, and other semiconductor materials may be used. The wires may be composed of any one type of the above materials. If the wires are made of amorphous silicon or polysilicon, it is easy to employ high-precision silicon process technology because the silicon wires are stable and less likely to be contaminated even in a high temperature atmosphere during the fabrication process.

If the wires are made of a semiconductor having a band gap of 2.0 eV or more, a large distance is secured between the energy levels of the microparticles, thereby increasing the charge confinement effect. In particular, if the wires are made of a semiconductor having a band gap of 2.0 eV or more and the tunnel barrier film is made of an insulator such as $SiO_2$, the tunnel barrier height decreases. This enables the second tunnel barrier film to be made thick while securing the tunnel current. As a result, the capacitance of the charge holding microparticles decreases.

In EMBODIMENTS 13 and 14, the wires may be put on one another forming a plurality of layers. The orientations of the wires may not be uniform, and may be arbitrary.

Examples of the semiconductor having a band gap of 2.0 eV or more include GaN, GaP, GaAs, AlAs, ZnO, ZnS, ZnSe, CdS, ZnTe, and SiC, as well as mixed crystals of these semiconductors.

Surface Density of Microparticles

In EDMBODIMENTS 9 to 14, the surface density of the microparticles is preferably in the range of about $1 \times 10^{11}$ $cm^{-2}$ to $1 \times 10^{13}$ $cm^{-2}$. With the surface density within this range, effective charge holding is ensured and whether or not charge exists can be easily detected.

In EDMBODIMENTS 11 and 12, preferably, the surface density of the first microparticles buried between the first and second tunnel barrier films is $1 \times 10^{12}$ $cm^{-2}$ or more and is higher than the surface density of the second microparticles buried between the second tunnel barrier film and the (gate) insulating film. This will further facilitate the charge transfer between the first microparticles and the second microparticles.

Application of Semiconductor Devices of Embodiments 9 to 15

The semiconductor devices of EMBODIMENTS 9 to 15 can be applied to various fields for control of transfer and accumulation of minute charge. For example, a charge distribution may be prepared for the semiconductor devices of EMBODIMENTS 9 to 15 based on the principle of the scanning probe microscope (SPM), especially the atomic force microscope (AFM), to use the distribution as a memory. In this case, the n-type polysilicon electrode of the semiconductor device is not necessary. A semiconductor device having characteristics of some of the semiconductor devices of the above embodiments may also be formed. Other various modifications are possible without departing from the subject of the present invention.

Embodiment 16

Figure 25:
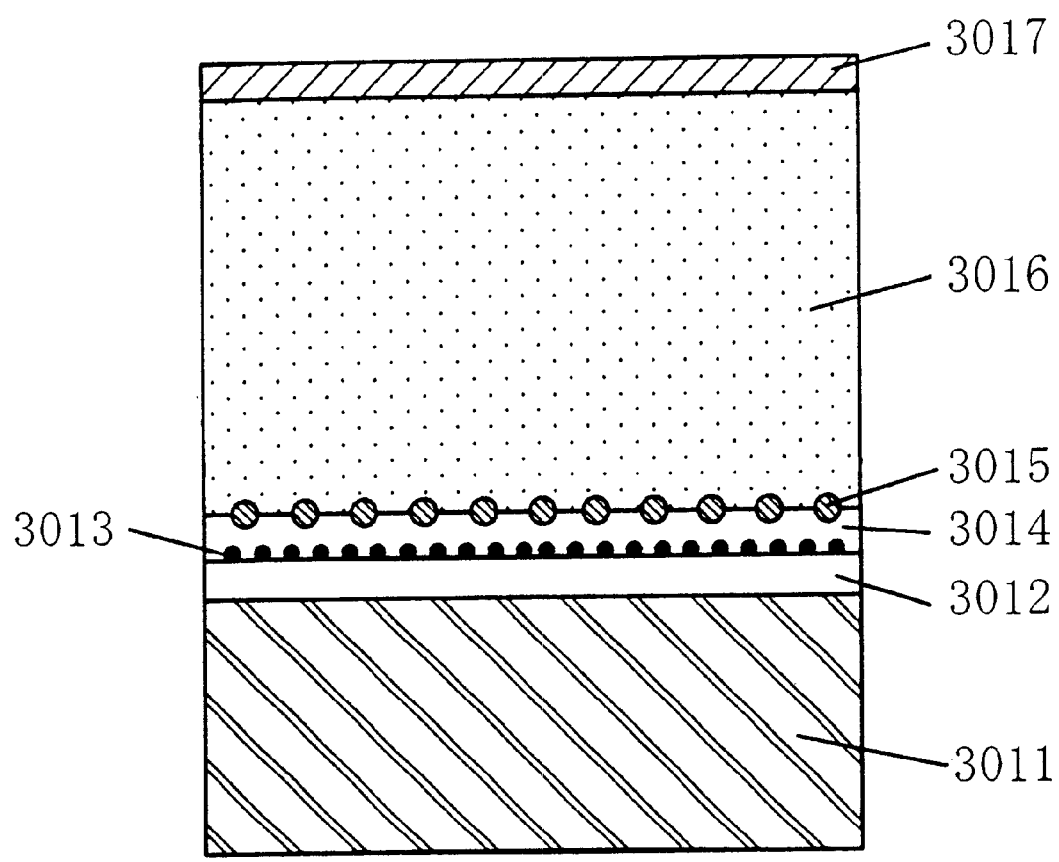
FIG. 25 is a cross-sectional view of a semiconductor device of EMBODIMENT 16 of the present invention.

FIG. 25 is a cross-sectional view of a semiconductor device of EMBODIMENT 16 of the present invention. The semiconductor device of this embodiment includes: a thermally oxidized $SiO_2$ film 3012 having a thickness of about 2 nm as the first barrier layer that functions as a barrier for charge transfer; silicon microparticles 3013 having a diameter of 2 nm as the first microparticles; a $SiO_2$ film 3014 having a thickness of about 2 nm as the second barrier layer that functions as a barrier for charge transfer; gold microparticles 3015 having a diameter of 5 to 8 nm as the second microparticles: a $SiO_2$ film 3016 having a thickness of 10 nm as the insulating layer; and an n-type polysilicon electrode 3017 as the electrode layer. These are formed in this order on a p-type silicon substrate 3011 as the semiconductor substrate.

The diameter of the gold microparticles 3015 as the second microparticles is 2.5 times as large as that of the silicon microparticles 3013 as the first microparticles, so that the capacitance of the former is larger than that of the latter. The electron affinity of the second microparticles is larger than that of the first microparticles, and the sum of the electron affinity and the forbidden bandwidth of the former is smaller than that of the latter.

The silicon microparticles 3013 are formed by chemical vapor deposition (CVD) at a surface density of about $1\times10^{11}$ $cm^{-2}$ to $1\times10^{13}$ $cm^{-2}$, while the gold microparticles 3015 is formed by wafer immersion into a gold colloid solution at a fixed surface density of about $1\times10^{10}$ $cm^{-2}$ to $1\times10^{12}$ $cm^{-2}$.

The conventional semiconductor device shown in FIG. 57 utilizes the tunnel phenomenon occurring within the same system, that is, the microparticles (silicon microparticles 6203), the tunnel barrier film (tunnel oxide film 6202), and the semiconductor substrate (p-type silicon substrate 6201) for all of charge injection, holding, and release. The only differences are the number of charges in the microparticles (silicon microparticles 6203) and the potential at the microparticles with respect to the semiconductor substrate (p-type silicon substrate 6201). Therefore, it is not easy to largely change the tunnel current within this system with a low external voltage applied to the upper electrode (n-type polysilicon electrode 6205) (upper electrode voltage). For example, if the height and thickness of the tunnel barrier are increased in an attempt to suppress a leak current, write/erase currents are also reduced resulting in lowering the write/erase speeds. The degree of the leak current also depends on the number of charges held in each microparticle. The leak current is considered smallest when the number of electrons (or holes) is one. There is therefore little room for improvement.

The potential at the microparticles during writing (or erasing) is determined by the position of the microparticles in the device structure. If the microparticles (silicon microparticles 6203) are made close to the upper electrode (n-type polysilicon electrode 6205), potential rise at the microparticles during writing increases, which theoretically increases the write current. However, if the microparticles are too close to the upper electrode, the gate voltage shift during reading becomes small whereby sensitivity lowers excessively.

If the capacitance of the microparticles is increased, potential rise at the microparticles during charge holding may be suppressed, which is effective in suppressing the leak current. In reality, however, if the diameter of the microparticles is increased or the microparticles are placed closer to the semiconductor substrate for increasing the capacitance of the microparticles, the tunneling probability between the microparticles and the semiconductor substrate increases, resulting in unintentionally increasing the leak current. Theoretically, if the particle size is increased and the tunnel barrier film is thickened simultaneously, the leak current alone may possibly be suppressed to some extent. However, if the particle size is too large, the surface density of the microparticles becomes too low to hold an amount of charges required to maintain the sensitivity of the device. If the barrier film is thickened too much, the resultant construction is similar to a flash EEPROM, where a large voltage is applied to the barrier film. This may cause film degradation due to charge transfer. During fabrication, also, in order to obtain a long-life device, high precision is required for the control of the size and distribution of the microparticles and the thickness of the barrier film.

It is therefore difficult for the conventional semiconductor device shown in FIG. 57 to realize high-speed write and erase operations and long-life recording. On the contrary, in the semiconductor device of this embodiment, leak current during charge holding can be greatly reduced without lowering the write/erase speeds.

In this embodiment, charge transfer occurs between the semiconductor substrate and the first microparticles (silicon microparticles 3013) via the first barrier layer (thermally oxidized $SiO_2$ film 3012) and between the first microparticles (silicon microparticles 3013) and the second microparticles (gold microparticles 3015) via the second barrier layer ($SiO_2$ film 3014). The probability of charge transfer via the first barrier layer is determined by the density and spatial overlap of the wave function representing the state of electrons in the semiconductor substrate and the wave function representing the vacant state of the microparticles. The first microparticles are much lower in state density and smaller in spread of the wave function than the semiconductor substrate. Therefore, the first microparticles substantially govern the charge transfer. Likewise, since the first microparticles are smaller in diameter than the second microparticles, the first microparticles are lower in state density and smaller in spread of the wave function than the second microparticles. Therefore, the first microparticles also substantially govern the charge transfer between the first and second microparticles. As a result, the charge transfer between the semiconductor substrate and the second microparticles via the first microparticles is mainly governed by the state of the first microparticles. For example, if the diameter of the first microparticles is small, the tunneling probability is low even if the diameter of the second microparticles is large.

The charge injection and holding operation of the semiconductor device of this embodiment is as follows.

In the write process during charge injection, by applying a write voltage externally to the upper electrode 3017, charge is transferred from the semiconductor substrate 3011 to the first microparticles (silicon microparticles 3013) by tunneling via the first barrier layer (thermally oxidized $SiO_2$ film 3012). The potential at the first microparticles and the relationship between the first microparticles and the semiconductor surface in this process are substantially the same as those in the conventional write process. Therefore, the charge transfer to the first microparticles (silicon microparticles 3013) is performed at substantially the same speed as that conventionally obtained.

In this embodiment, the charge in the first microparticles (silicon microparticles 3013) is further transferred to the second microparticles (gold microparticles 3015) via the second barrier layer ($SiO_2$ film 3014). In this charge transfer, if the diameter of the second microparticles is sufficiently large, the tunnel transition between the first and second microparticles is under substantially the same conditions as the tunnel transition between the first microparticles and the semiconductor substrate surface. Therefore, if the potential difference is the same, the charge transfer speed from the semiconductor substrate surface to the first microparticles will be substantially the same as that from the first microparticles to the second microparticles. In this embodiment, however, the potential has risen at the first microparticles that have already carried the charge ($\Delta V_1 = \Delta q/C_{dot1}$; $\Delta q$ denotes the charge amount and $C_{dot1}$ denotes the capacitance of the first microparticles). Therefore, an electric field has been generated between the first and second microparticles due to this potential rise at the first microparticles in addition to the external write voltage. Since the effect of the potential rise due to charge injection is great for the first microparticles (silicon microparticles 3013) having a small capacitance, the charge transfer from the first microparticles to the second microparticles (gold microparticles 3015) is further accelerated. Thus, although the tunneling is required twice during the write process in this embodiment, the charge transfer from the first microparticles to the second microparticles is done at a speed equal to or higher than the charge transfer from the semiconductor substrate to the first microparticles. Therefore, the entire charge transfer speed, i.e., the write speed is substantially the same as that of the conventional device. It would be understood that the above description on the write process is also applicable to the erase process where a voltage reverse to the write voltage is applied to the upper electrode 3017 to release accumulated charge from the microparticles.

Once the application of the write voltage to the upper electrode is terminated to finish writing, the first microparticles (silicon microparticles 3013) and the second microparticles (gold microparticles 3015) are stabilized at respective potentials corresponding to the respective charges and capacitances. Some of the first microparticles possess redundant charge. However, such redundant charge swiftly returns to the semiconductor substrate because the first microparticles are located close to the semiconductor substrate and have a small capacitance providing a large potential rise per charge. As for the second microparticles, since the capacitance $C_{dot2}$ is large, the potential rise ($\Delta V_1 = \Delta q/C_{dot2}$) is kept small. While the diameter of the second microparticles is large and the state density thereof is high, the state density of the first microparticles is low. Therefore, the probability of charge transfer from the second microparticles with a small potential rise to the first microparticles is low. This results in the charge accumulated in the second microparticles being held therein for a prolonged period.

It would be understood that the effect described above will not be obtained with only forming a plurality of microparticle layers as in this embodiment if the diameter of the second microparticles is the same as that of the first microparticles. If the particle diameter is the same, the capacitance of the second microparticles decreases because the second microparticles are located farther from the semiconductor substrate than the first microparticles.

It has been described that substantially the same write and erase speeds as those of the conventional device are obtained in this embodiment. Moreover, higher write and erase speeds, as well as lower write and erase voltages, can be obtained in this embodiment by thinning the barrier layer. The barrier layer can be thinned because in this embodiment leak current is suppressed and thus charge holding is stabilized.

Further stabilization of the charge holding is possible if the state of the first microparticles is quantized and the energy distance between quantum levels is large compared with the thermal energy at room temperature and the potential rise at the second microparticles for the following reason.

Figure 26A:
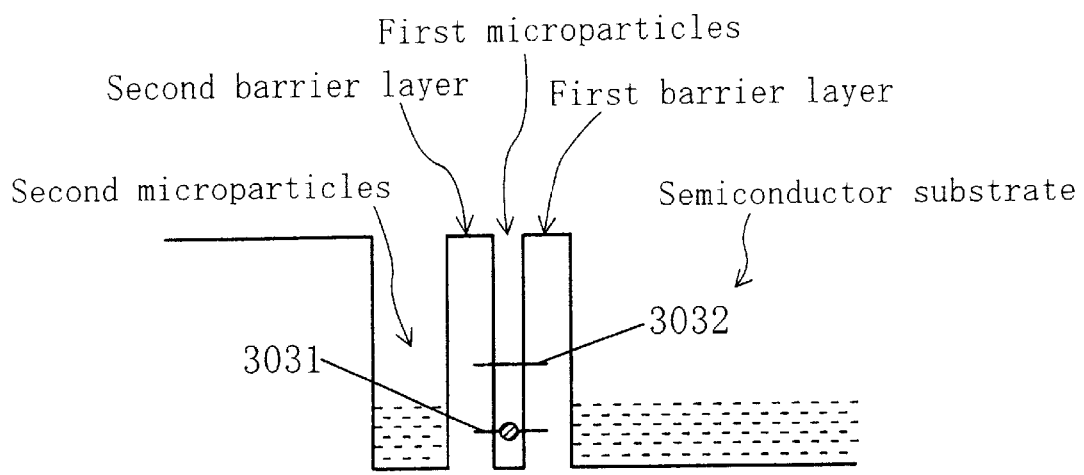
FIGS. 26(a), 26(b), and 26(c) are schematic band diagrams near the conduction band edge in the case of using electrons as injection charge.
Figure 26B:
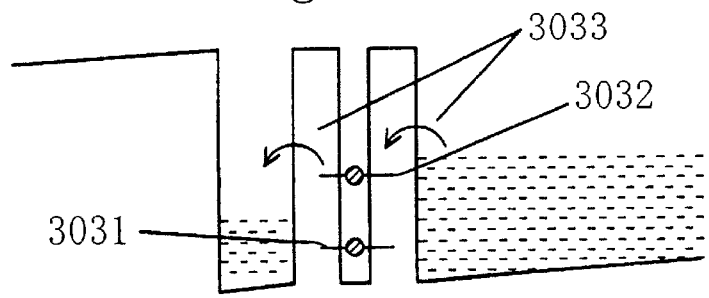
Figure 26C:
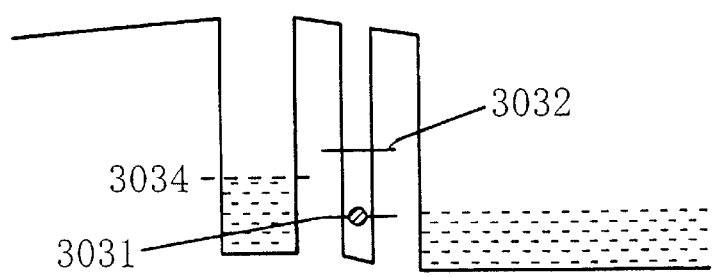

FIGS. 26(*a*) to 26(*c*) schematically illustrate the band structures near the conduction band when electrons are used as injection charge. Referring to FIG. 26(*a*), assume that, in the state of the microparticles having no charge, the first microparticles (silicon microparticles 3013) are quantized, the ground level 3031 is occupied by an electron, the first excited level 3032 is vacant, and the energy distance between the two levels is sufficiently larger than the thermal energy. Referring to FIG. 26(*b*), when an electric field for writing is applied externally, electrons are injected into the second microparticles (gold microparticles 3015) by tunneling 3033 from the semiconductor substrate via the first excited level 3032. Referring to FIG. 26(*c*), once the external electric field is removed, the Fermi level 3034 of the second microparticles is lower than the first excited level 3032 when the diameter of the second microparticles is large. If the difference between these levels is larger than the thermal energy, the charge will not be easily released, resulting in the charge being held stably in the second microparticles. It would be understood that substantially the same effect is obtained when holes are used as injection charge.

Relationship Between Band Structure of Microparticles and Charge Transfer and Holding FIGS. 27(*a*) to 27(*c*) are band diagrams illustrating only the conduction band edges of the semiconductor substrate, the first barrier layer, the first microparticles, the second barrier layer, and the second microparticles. Referring to FIGS. 27(*a*) to 27(*c*), a preferred relationship between the voltage level and the charge transfer characteristic between the semiconductor substrate (or a semiconductor layer on the substrate) and the second microparticles will be described. In the illustrated case, electrons are used as the charge. FIG. 27(*a*) illustrates the state where no voltage is applied. As is apparent from FIG. 27(*a*), in the illustrated example, the electron affinity xe2 of the second microparticles is larger than the electron affinity xe1 of the first microparticles. Therefore, as shown in FIG. 27(*b*), when an electric field is applied between the second microparticles and the semiconductor substrate so that the second microparticles have a higher potential, electrons easily migrate from the semiconductor substrate to the second microparticles via the first microparticles. On the contrary, as shown in FIG. 27(*c*), once charge is accumulated in the second microparticles resulting in generation of a weak electric field forcing the second microparticles to have a lower potential, electron transfer from the first microparticles to the second microparticles is difficult. That is, unless a predetermined high electric field is applied on the side of the semiconductor substrate, electron transfer from the first microparticles to the semiconductor substrate via the second microparticles is difficult. In other words, charge holding in the second microparticles is facilitated. The electron affinity xe2 of the second microparticles is larger than the electron affinity xsm of the semiconductor substrate. This suppresses the potential at the conduction band edge of the second microparticles from increasing beyond the potential at the conduction band edge of the semiconductor substrate, thereby further improving the charge holding. This effect of suppressing the potential rise is especially great when the first microparticles are made of a semiconductor material and the second microparticles are made of a metal material.

In the case where holes are used as the charge, as will be easily presumed from FIGS. 27(*a*) to 27(*c*), the potential rise at the valence band edge of the second microparticles can be suppressed since the sum of the electron affinity xe2 and the forbidden bandwidth gy2 of the second microparticles (Xe2+gy2) is smaller than the sum of the electron affinity xe1 and the forbidden bandwidth gy1 of the first microparticles (Xe1+gy1). Charge holding is therefore facilitated. In addition, the sum of the electron affinity xe2 and the forbidden bandwidth gy2 of the second microparticles (Xe2+gy2) is smaller than the sum of the electron affinity xsm and the forbidden bandwidth gsm of the semiconductor substrate (Xsm+gsm). This improves the effect of suppressing the potential rise at the valence band edge of the second microparticles.

Relationship Between Diameter of First Microparticles as well as Ratio thereof to Second Microparticles and Charge Transfer/holding The influence of the diameter of the first microparticles, as well as the ratio of the diameter of the first microparticles to the second microparticles, on the charge holding characteristic will be described.

Figure 28:
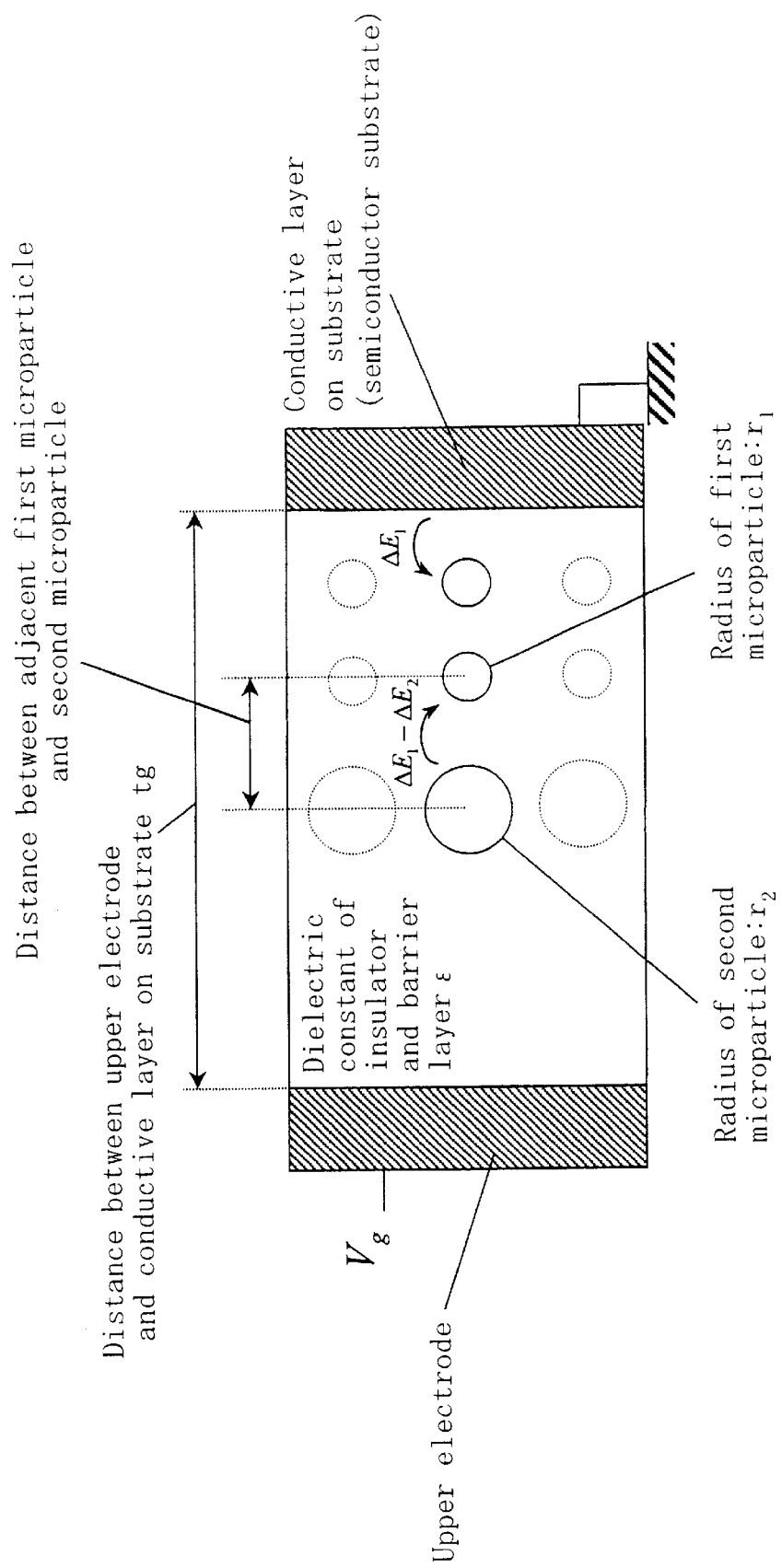
FIG. 28 is a view used to describe the influences of the diameter of first microparticles and the ratio of the diameter of the first microparticles to second microparticles on the charge holding characteristic.

Referring to FIG. 28, the distance between the upper electrode and the conductive layer on the substrate (semiconductor substrate) is denoted by tg, the distance between the adjacent first and second microparticles is denoted by d, the radius of the first microparticles is denoted by r1, the radius of the second microparticles is denoted by r2, the dielectric constant of the insulator and the barrier layer is denoted by $\in$, and the unit charge is denoted by e.

Assume that the potential at the conductive layer of the semiconductor substrate is fixed at 0 V, and that the potential Vg at the upper electrode is set at 0 V during charge holding and charge injection and release are made by controlling the potential Vg.

First, Vg is set at 0 in the state of the microparticles having no charge and the no-charge state is retained. To achieve this, it is necessary to ensure that charge will not be spontaneously injected into the microparticles from the semiconductor substrate by diffusion.

In the process of injecting charge from the conductive layer on the substrate into the first microparticles adjacent to the substrate, the charging energy $\Delta E1$ of the first microparticles is represented by the expression:

$$\Delta E1 = (e^2/8\,\pi\in)(1/r1).$$

When Vg=0, the state of the second microparticles having charge injected therein is high in terms of energy compared with the state of the second microparticles having no charge. Accordingly, most of charges transferred to the first microparticles return to the substrate, resulting in a low probability of the charge being transferred to the second microparticles. However, charge transfer between the semiconductor substrate and the first microparticles adjacent to the semiconductor substrate occurs comparatively easily because the semiconductor substrate is not quantized and thus the state density thereof is high.

In consideration of the above, if the charging energy $\Delta E1$ is made higher than the thermal energy kT (k: Boltzmann constant, T: absolute temperature) ($\Delta E1 > kT$), injection of thermally excited charge will be suppressed. This is possible if the diameter of the first microparticles is 5 nm or less, where the charging energy $\Delta E1$ is sufficiently high compared with the thermal energy kT. In this way, spontaneous charge injection can be prevented. If longer charge holding duration is required, the diameter of the first microparticles is preferably 2 nm or less. With this particle diameter, the charging energy $\Delta E1$ is seven times or more as high as the thermal energy kT. In this case, the electron excitation probability is 1/1000 or less of the normal value. This case is therefore advantageous in that the information retention state of the device is further stabilized.

Next, when information is to be written in the memory device, a positive voltage Vg(charge) is applied to the upper electrode to generate an electric field, so that charge is injected from the substrate into the second microparticles. In order to achieve this, it is required to apply an electric field large enough to allow charge to be injected into the first microparticles against the charging energy $\Delta E1$ and further be transferred to the second microparticles. Therefore, if the diameter of the first microparticles is too small, the charging energy $\Delta E1$ is excessively high, which may block the charge injection. In this embodiment, however, since the state density of the semiconductor substrate is high, charge transfer between the semiconductor substrate and the first microparticles occurs comparatively easily as described above. In addition, under the application of the voltage Vg(charge), the energy state of the second microparticles after charge has been injected is lower in potential than that before charge is injected. This enables the charge transferred to the first microparticles to be swiftly injected into the second microparticles. As a result, the practical lower limit of the diameter of the first microparticles is less strict. Actually, charge injection is possible when the particle diameter is of the order of the size of atoms, i.e., 0.1 nm or larger. This makes it possible to use atoms introduced by ion implantation and the levels caused by the atoms as the first microparticles. That is, the lower limit of the first microparticles is about 0.1 nm.

For applications especially requiring high-speed operation, the diameter of the first microparticles may preferably be set at 0.5 nm or more, to suppress excessive increase in the charging energy $\Delta E1$ of the first microparticles and thus enable swift charge injection.

Next, when Vg is turned to 0 in the state where a single charge is accumulated in each second microparticle to retain the charge, it is necessary to ensure that the charge will not be spontaneously released from the microparticle toward the substrate. In this embodiment, charge release is determined in the process of charge transfer from the second microparticle to the adjacent first microparticle. The electron energy change ($\Delta E1 - \Delta E2$) due to this charge transfer is represented by the expression:

$$\Delta E1 - \Delta E2 = \{e^2(f-1)\}/8\pi f\, r1$$

wherein f denotes the ratio of the diameter of the first microparticles to the second microparticles (r2/r1). Since the state density of the first microparticles is low compared with that of the substrate surface, the charge transfer from the second microparticles to the first microparticles or vice versa is less likely to occur compared with the charge transfer between the first microparticles and the semiconductor substrate surface. However, if the band energy of the second microparticles is increased by thermal excitation, charge in the second microparticles is transferred to the first microparticles at a certain probability. Once the charge is transferred to the first microparticles, the charge in the first microparticles is mostly transferred to the semiconductor substrate because the charge transfer is easier between the first microparticles and the semiconductor substrate than between the first and second microparticles as described above. Therefore, in order to block this tunnel transition and hold the charge stably, the energy change is preferably higher than the thermal energy ($\Delta E1 - \Delta E2 > kT$). For example, if the diameter of the first microparticles is 5 nm or less and the ratio of the diameter of the second microparticles to the first microparticles is 1.8 times or more, the energy change ($\Delta E1-\Delta E2$) is larger than the thermal energy kT, whereby spontaneous release of charge is prevented. If longer charge holding duration is required, the particle diameter ratio f is preferably four times or more. By this setting, charge holding can be further stabilized.

When a voltage Vg(discharge) is applied to the upper electrode to generate an electric field externally so as to release the charge accumulated in the second microparticles, the charge in the second microparticles must be swiftly transferred to the substrate. In order to achieve this, it is required to apply an electric field large enough to allow the charge to be transferred to the first microparticles against the energy change ($\Delta E1-\Delta E2$) and further be transferred to the semiconductor substrate. By the application of the voltage Vg(discharge), the energy state of the second microparticles after the charge has been released to the semiconductor substrate can be made lower than the state thereof before the charge is released. This increases the probability of charge transfer from the second microparticles to the first microparticles. Most of the charge transferred to the first microparticles is released to the semiconductor substrate as described above. The charge transfer between the microparticles is however less likely to occur compared with the charge transfer between the microparticles and the semiconductor substrate surface since the state density of the microparticles is lower than that of the semiconductor substrate surface.

In order to solve the above problem, the electron energy change ($\Delta E1-\Delta E2$) due to the charge transfer from the second microparticles to the first microparticles described above may be made equal to or less than the energy change $\Delta E'$ due to the potential difference between the first and second microparticles caused by the external electric field, represented by the expression:

$$\Delta E' = eVg(\text{discharge})(d/tg).$$

This enables the charge in the second microparticles to be easily released. If the diameter of the first microparticles is 0.1 nm or more, the energy change ($\Delta E1-\Delta E2$) can be easily made equal to $\Delta E'$, and thus swift charge release is realized.

If the diameter of the first microparticles is 0.5 nm or more, the energy change ($\Delta E1-\Delta E2$) can be made sufficiently lower than $\Delta E'$. This desirably permits high-speed operation.

Relationship Between Diameter of Second Microparticles as well as Ratio thereof to Second Microparticles and Charge Transfer/holding The diameter of the second microparticles, as well as the upper limit of the ratio of the diameter of the second microparticles to the first microparticles, will be described.

Assume a device having a charge accumulation region of about 0.4 µm square as a typical semiconductor device to which the present invention is applied. This corresponds to a MIS transistor device having a gate width and a gate length of 0.4 µm, for example. A number of second microparticles are dispersed in order to improve the resistance against a leak current caused by a defect and the like in the barrier layer. In this type of semiconductor device, by setting the diameter of the second microparticles at 30 nm or less, as many as 40 or more second microparticles in average can be formed in the charge accumulation region.

For finer devices, the diameter of the second microparticles may be set at 10 nm or less. By this setting, a number of second microparticles can also be formed in a charge accumulation region of 0.13 µm square.

The diameter of the first microparticles is 0.1 nm or more as described above. Accordingly, the ratio f of the radius r2 of the second microparticles to the radium r1 of the first microparticles is preferably 300 times or less. For finer devices, the radium ratio is preferably 100 times or less.

If the diameter of the second microparticles is too small, the potential rise $\Delta E2$ observed during charge injection represented by the expression, $$\Delta E2 = (e^2/8\pi\in)(1/r2)$$

is so large that the accumulated charge becomes unstable. If the diameter of the second microparticles is 1 nm or more, excessive potential rise can be suppressed and thus charge holding is facilitated. In particular, if the diameter of the second microparticle is 3 nm or more, long-term charge holding is facilitated.

In view of the above, the particle diameter r2 of the second microparticles is preferably not less than 1.8 times and not more than 300 times as large as the particle diameter r1 of the first microparticles. In order to further stabilize the charge holding for finer devices, the diameter r2 of the second microparticles is preferably not less than 4 times and not more than 100 times as large as the diameter r1 of the first microparticles.

The diameter r1 of the first microparticles is preferably in the range between 0.1 nm and 5 nm, inclusive. For high-speed operation and further stabilization of charge holding, the particle diameter r1 is preferably in the range between 0.5 nm and 2 nm, inclusive.

The particle diameter r2 of the second microparticles is preferably in the range between 1 nm and 30 nm, inclusive. For further stabilization of charge holding in finer devices, the particle diameter r2 is preferably in the range between 3 nm and 10 nm, inclusive.

As described above, in this embodiment, the microparticles for holding charge and the microparticles for controlling charge transfer are independently provided. By this specialization of the respective functions, provided is a reliable means for charge injection into, holding in, and release from microparticles that realizes high-speed write and erase operations and long-term charge holding compared with the conventional devices.

In this embodiment, either electrons or holes can be used as the charge to be injected into and held in the microparticles.

In this embodiment, the p-type silicon substrate is used as the semiconductor substrate. Alternatively, an n-type semiconductor substrate or substrates made of other materials may be used. Preferably, an n-type semiconductor substrate may be used when electrons are used as the injection charge, and a p-type semiconductor substrate may be used when holes are used as the injection charge. This facilitates suppression of release of accumulated charge.

In this embodiment, silicon microparticles and gold microparticles are used. Alternatively, other metal and semiconductor materials may be used.

In this embodiment, a single layer of the first microparticles sandwiched by the first and second barrier layers is formed between the second microparticles and the semiconductor substrate. Alternatively, plural layers of the first microparticles may be formed with a barrier layer between every adjacent layers. This structure further stabilizes the charge holding in the second microparticles.

Embodiment 17

Figure 29:
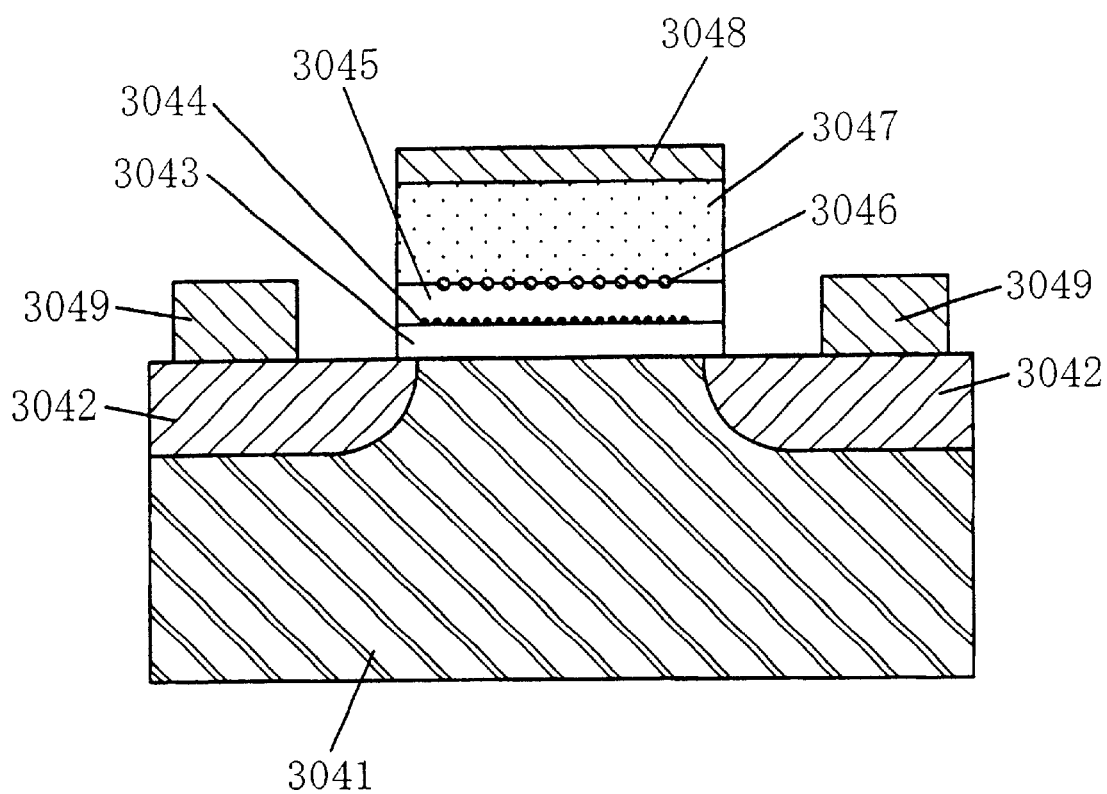
FIG. 29 is a cross-sectional view of a semiconductor memory device of EMBODIMENT 17 of the present invention.

FIG. 29 is a cross-sectional view of a semiconductor memory device of EMBODIMENT 17 of the present invention. The semiconductor memory device includes: n-type regions 3042 functioning as the source and drain regions formed in a p-type silicon substrate 3041; metal electrodes 3049 as the source/drain electrodes; a SiO$_2$ gate insulating film 3047 having a thickness of 7 nm; and an n-type polysilicon electrode 3048 as the gate electrode, thereby constituting a MIS transistor structure. The semiconductor memory device of this embodiment also includes between the gate insulating film 3047 and the semiconductor substrate 3041: a thermally oxidized SiO$_2$ film 3043 having a thickness of about 1.9 nm as the first barrier layer that functions as a barrier for charge transfer; silicon microparticles 3044 having a diameter of 2.5 nm as the first microparticles; a SiO$_2$ film 3045 having a thickness of about 1.8 nm as the second barrier layer that functions as a barrier for charge transfer; and gold microparticles 3046 having a diameter of 6 nm as second microparticles. The surface density of the silicon microparticles is in the range of about $1\times10^{11}$ cm$^{-2}$ to $1\times10^{13}$ cm$^{-2}$, and the surface density of the gold microparticles is in the range of about $1\times10^{10}$ cm$^{-2}$ to $1\times10^{12}$ cm$^{-2}$.

This embodiment, also, can realize a structure capable of controlling electron injection into, holding in, and release from the microparticles based on the principle as described in EMBODIMENT 16. In addition, in this embodiment, the structure for holding charge is formed in the gate region of the MIS transistor structure. This allows the threshold voltage of the MIS transistor characteristic to change depending on whether or not charge is held in the second microparticles. The resultant device serves as a low-voltage, high-speed nonvolatile semiconductor memory device allowing for prolonged recording. Moreover, since the single device can realize basic memory operation, high-density integration is possible.

In this embodiment, as shown in FIG. 29, a region where the microparticles do not exist is provided in at least a portion of the gate region located above or in contact with the source region or a portion thereof located above or in contact with the drain region. This prevents a current short-circuited via the microparticles from flowing when a voltage is applied from the source region to the drain region.

In this embodiment, also, the region including the microparticles may be divided into a plurality of portions in such a direction that can at least block a source-drain short-circuited current. This also prevents a current short-circuited via the microparticles from flowing when a voltage is applied from the source region to the drain region.

Embodiment 18

Figure 30:
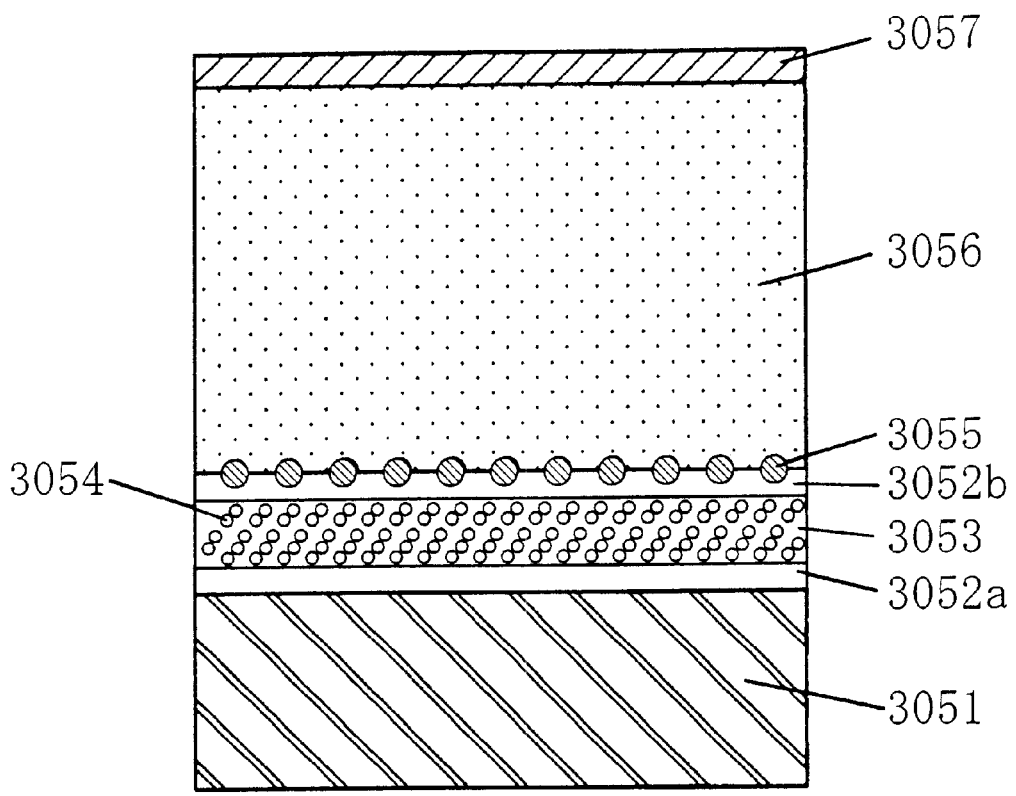
FIG. 30 is a cross-sectional view of a semiconductor device of EMBODIMENT 18 of the present invention.

FIG. 30 is a cross-sectional view of a semiconductor device of EMBODIMENT 18 of the present invention. The semiconductor device of this embodiment includes: a thermally oxidized SiO$_2$ film 3052$a$ having a thickness of about 1 nm as the surface barrier layer that functions as a barrier for charge transfer; a silicon rich oxide film 3053 composed of a SiOX layer (1.5<x<2) as the microparticle dispersed layer where silicon microparticles 3054 as the first microparticles are dispersed in a SiO$_2$ film functioning as a barrier for charge transfer; a deposited SiO$_2$ film 3052$b$ functioning as the barrier layer; gold microparticles 3055 having a diameter of 2 nm as the second microparticles: a SiO$_2$ film 3056 having a thickness of 8 nm as the insulating layer; and at the top an n-type polysilicon electrode 3057 as the electrode layer. These are formed in this order on a p-type silicon substrate 3051 as the semiconductor substrate. The gold microparticles 3055 have a diameter of 2 to 5 nm and are fixed by wafer immersion into a gold colloid solution at a surface density of about $1\times10^{10}$ cm$^{-2}$ to $1\times10^{12}$ cm$^{-2}$.

In EMBODIMENT 16 above, the first microparticles are formed as a fine structure on the first barrier layer, which requires control of the particle diameter distribution and the in-plane dispersion state of the first microparticles. In this embodiment, however, the structure of the silicon microparticles 3054 dispersed in the SiO$_2$ film can be easily obtained by using the silicon rich oxide film (microparticle dispersed layer) 3053 composed of a SiOX layer (1.5<x<2). In other words, in this embodiment, control of a fine structure is not required since minute silicon islands in the SiO$_x$ layer serve as the silicon microparticles. This facilitates the fabrication of the semiconductor device and enhances the reproducibility of the device characteristics. A high-quality SiO$_x$ layer can be formed by CVD, but other methods such as sputtering may be employed. The oxygen content x of the SiO$_x$ layer (1.5<x<2) may be in the range of 1.8<x<2, which realizes more minute silicon islands. The thickness of the SiO$_x$ layer (1.5<x<2) may be in the range of 3 to 10 nm in order to realize low-voltage device operation. In this embodiment, the SiO$_{1.9}$ layer having a thickness of 6 nm is used. The diameter of the silicon microparticles 3054 in the SiO$_x$ layer (1.5<x<2) functioning as the first microparticles is 1 nm or less, and the diameter of the gold microparticles 3055 functioning as the second microparticles is at least double the diameter of the silicon microparticles 3054.

In this embodiment, the deposited SiO$_2$ film 3052$b$ functioning as the barrier layer is formed between the gold microparticles 3055 (second microparticles) and the silicon rich oxide film 3053 (microparticle dispersed layer). This advantageously ensures prevention of charge held in the gold microparticles from being undesirably transferred to the silicon microparticles (first microparticles) in the silicon rich oxide film 3053.

In this embodiment, the SiO$_x$ layer is used as it is, not being heat-treated, utilizing minute silicon islands existing in the SiO$_2$ layer as the microparticles. Alternatively, the SiO$_x$ layer may be heat-treated at about 1000° C., to allow the silicon microparticles to grow for control of the particle diameter thereof.

In this embodiment, the SiO$_x$ layer is used as the microparticle dispersed layer. Alternatively, semiconductor ions or metal ions may be implanted in an insulating layer to form a microparticle dispersed layer. In this alternative case, a microparticle dispersed layer having the charge control function as described above can be formed more easily. Although the insulating layer with semiconductor or metal ions implanted therein is different from the structure with microparticles dispersed therein, the levels formed by the semiconductor or metal ions in the insulating layer provide substantially the same function as that provided by the small-diameter first microparticles in this embodiment. Therefore, the semiconductor or metal ion-implanted insulating layer can be used as the microparticle dispersed layer in this embodiment. Examples of the semiconductor and metal ions include Si ions and W ions. A SiO$_2$ film with these ions implanted therein, for example, may be used as the microparticle dispersed layer. The resultant semiconductor device can provide substantially the same function as that in this embodiment.

In this embodiment, also, electron injection into, holding in, and release from the microparticles can be efficiently controlled based on the principle described in EMBODIMENT 16. In addition, in this embodiment, it is not necessary to form the first microparticles as a fine structure. This facilitates the fabrication of the semiconductor device and enhances the reproducibility of the device characteristics.

Moreover, unlike EMBODIMENT 16, the charge transfer between the semiconductor substrate and a certain second microparticle is normally done via a plurality of first microparticles, not via a single first microparticle. In this tunneling via a plurality of microparticles, the tunnel current is reduced compared with the tunneling via a single microparticle. The reduction rate is greater under a weak electric field such as during charge holding than under a comparatively strong electric field such as during writing. This results in further enhancing the ratio of the tunnel current during writing/erasing (write/erase current) to the tunnel current during charge holding (leak current), whereby high-speed, long-life device can be realized.

If the second microparticles are not formed but only the microparticle dispersed layer is formed, charge is held in the first microparticles having a high capacitance. Also, during charge holding, charge tends to be transferred to higher-capacitance microparticles in the microparticle dispersed layer that are adjacent to the semiconductor substrate. Prolonged charge holding is therefore difficult. Furthermore, charge tends to be dispersed laterally in the microparticle dispersed layer. This may cause an occurrence of losing accumulated charge over a wide range by a local leak current, and thus makes it difficult to realize a reliable semiconductor device.

In a structure where a single floating conductor is formed in place of the second microparticles to be described in an embodiment hereinbelow, all accumulated charges will be lost by a local leak current. In this embodiment, however, only the second microparticle located right above a leak position loses charge, but other second microparticles are not influenced by this leak current. High reliability is therefore provided.

In this embodiment, the existence of the second barrier layer between the microparticle dispersed layer and the second microparticles serves to further suppress the leak current.

In this embodiment, the surface barrier layer is formed between the semiconductor substrate and the microparticle dispersed layer. When the density of the microparticles in the microparticle dispersed layer is not so high, for example, the microparticle dispersed layer may be directly formed on the semiconductor substrate, omitting the surface barrier layer.

A semiconductor memory device having a construction similar to that of EMBODIMENT 17 can be fabricated using the structure of the semiconductor device of this embodiment.

Figure 31:
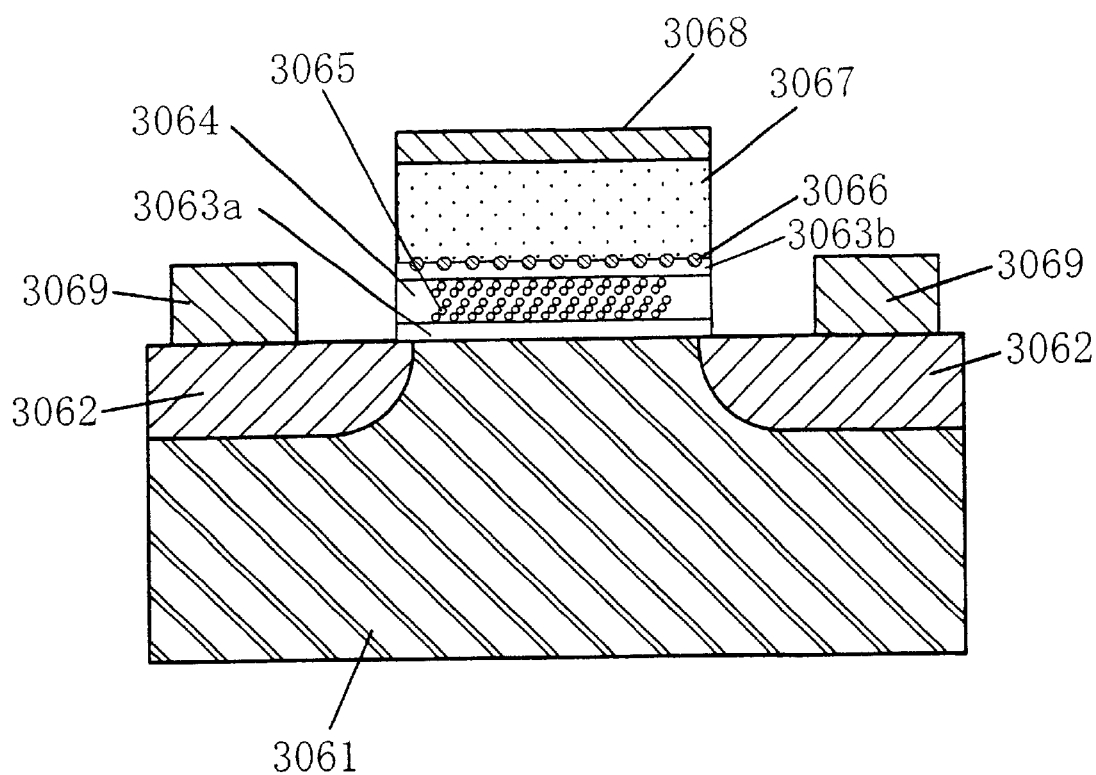
FIG. 31 is a cross-sectional view of a semiconductor memory device fabricated from the semiconductor device of EMBODIMENT 18.

FIG. 31 is a cross-sectional view of a semiconductor memory device formed using the semiconductor device of this embodiment. The semiconductor memory device includes: a p-type silicon substrate 3061 as the semiconductor device; source/drain regions 3062; a thermally oxidized $SiO_2$ film 3063a as the surface barrier layer; a silicon rich oxide film 3064 where silicon microparticles 3065 as the first microparticles are dispersed in a $SiO_2$ film as the barrier layer; a deposited $SiO_2$ film 3063b as the barrier layer; gold microparticles 3066 as the second microparticles: a gate insulating film 3067 made of a $SiO_2$ film; an n-type polysilicon electrode 3068 as the electrode layer; and source/drain electrodes 3069. This semiconductor memory device has a MIS transistor structure similar to that in EMBODIMENT 17, with the microparticle dispersed layer ($SiO_x$ layer) being formed between the gate insulating film 3067 and the semiconductor substrate 3061. This allows the threshold voltage of the MIS transistor characteristic to change depending on whether or not charge is held in the gold microparticles 3066 as the second microparticles. The resultant device serves as a low-voltage, high-speed non-volatile semiconductor memory device allowing for prolonged recording.

In the semiconductor memory device of this embodiment, a region where the microparticles do not exist is provided in at least a portion of the gate region located above or in contact with the source region and/or a portion thereof located above or in contact with the drain region. This prevents a current short-circuited via the microparticles from flowing when a voltage is applied from the source region to the drain region.

Embodiment 19

Figure 32:
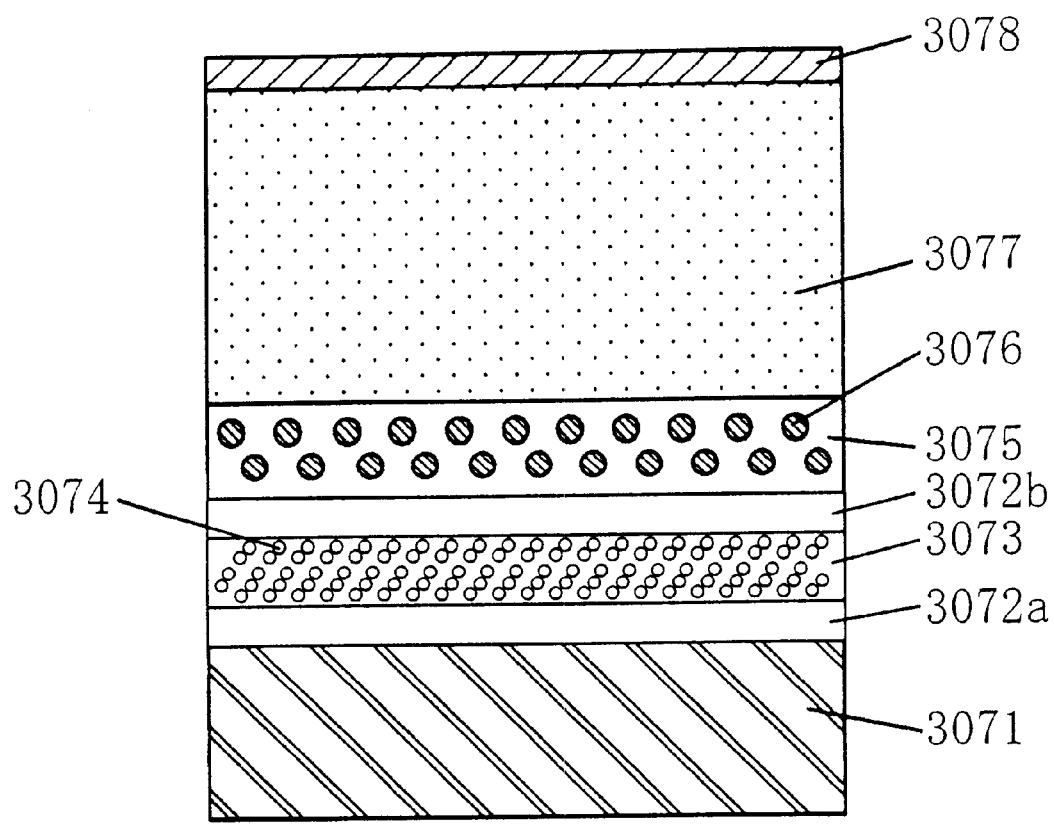
FIG. 32 is a cross-sectional view of a semiconductor device of EMBODIMENT 19 of the present invention.

FIG. 32 is a cross-sectional view of a semiconductor device of EMBODIMENT 19 of the present invention. The semiconductor device of this embodiment includes: a thermally oxidized $SiO_2$ film 3072a having a thickness of about 1.2 nm as the surface barrier layer that functions as a barrier for charge transfer; a silicon rich oxide film 3073 composed of a first $SiO_x$ layer (1.5<x<2) having a thickness of about 3 nm as the first microparticle dispersed layer where silicon microparticles 3074 as the first microparticles are dispersed in a $SiO_2$ film functioning as a barrier for charge transfer; a deposited $SiO_2$ film 3072b functioning as the barrier layer; a silicon rich oxide film 3075 composed of a second $SiO_x$ layer (1.5<x<2) having a thickness of about 5 nm as the second microparticle dispersed layer where silicon microparticles 3076 as the second microparticles are dispersed in a $SiO_2$ film functioning as a barrier for charge transfer; a $SiO_2$ film 3077 having a thickness of 10 nm as the insulating layer; and at the top an n-type polysilicon electrode 3078 as the electrode layer. These are formed in this order on a p-type silicon substrate 3071 as the semiconductor substrate.

Both the first microparticles 3074 and the second microparticles 3076 are silicon microparticles dispersed in a $SiO_x$ layer (1.5<x<2). The diameter of the microparticles can be controlled by controlling the composition of the $SiO_x$ layer and performing heat treatment. Both microparticle dispersed layers are formed by depositing the $SiO_x$ layer (1.5<x<2) by CVD and growing silicon microparticles under heat treatment at about 1100° C. In this process, the Si content of the second microparticle dispersed layer (silicon rich oxide film 3075) is set higher than the Si content of the first microparticle dispersed layer (silicon rich oxide film 3073). By this setting, the diameter of the silicon microparticles grown in the second microparticle dispersed layer can be made large. In this embodiment, the composition of the first microparticle dispersed layer (silicon rich oxide film 3073) is $SiO_{1.9}$, and the composition of the second microparticle dispersed layer (silicon rich oxide film 3075) is $SiO_{1.7}$. The diameter of the second microparticles is 1.7 nm or more, and the diameter of the first microparticles is 0.8 nm or less, whereby the diameter of the second microparticles is about 1.8 times or more as large as that of the microparticles. As a result, the second microparticles can exhibit good charge injection and holding characteristics as described above.

In this embodiment, the $SiO_x$ layer is used as the first and second microparticle dispersed layers. Alternatively, a layer with semiconductor ions or metal ions implanted in an insulating layer may be formed as the microparticle dispersed layer. In this alternative case, a microparticle dispersed layer having the charge control function as described above can be formed more easily.

In this embodiment, also, electron injection into, holding in, and release from the microparticles can be efficiently controlled based on the principle described in EMBODIMENT 18. In addition, in EMBODIMENT 18 above, the second microparticles need to be formed as a fine structure above the first microparticle dispersed layer. In this embodiment, however, since the second microparticles are dispersed in the second barrier layer, which facilitates fabrication of the semiconductor device and enhances the reproducibility of the device characteristics.

If the second microparticle dispersed layer is not formed but only a single microparticle dispersed layer is formed, charge is held in the first microparticles having a small capacitance. Also, during charge holding, charge tends to be transferred to higher-capacitance first microparticles in the microparticle dispersed layer that are adjacent to the semiconductor substrate. Prolonged charge holding is therefore difficult.

In this embodiment, the existence of the second barrier layer between the first microparticle dispersed layer and the second microparticle dispersed layer serves to further suppress the leak current.

In this embodiment, the surface barrier layer is formed between the semiconductor substrate and the first microparticle dispersed layer. When the density of the microparticles in the first microparticle dispersed layer is not so high, for example, the first microparticle dispersed layer may be directly formed on the semiconductor substrate, omitting the surface barrier layer.

In this embodiment, a clear boundary exists between the first and second microparticle dispersed layers. Alternatively, no clear boundary may be formed between the first and second microparticle dispersed layers, but the two layers share a continuous particle density distribution. In this case, also, substantially the same effect as that described above is obtained.

A semiconductor memory device having a construction similar to that of EMBODIMENT 17 can be fabricated using the structure of the semiconductor device of this embodiment.

Figure 33:
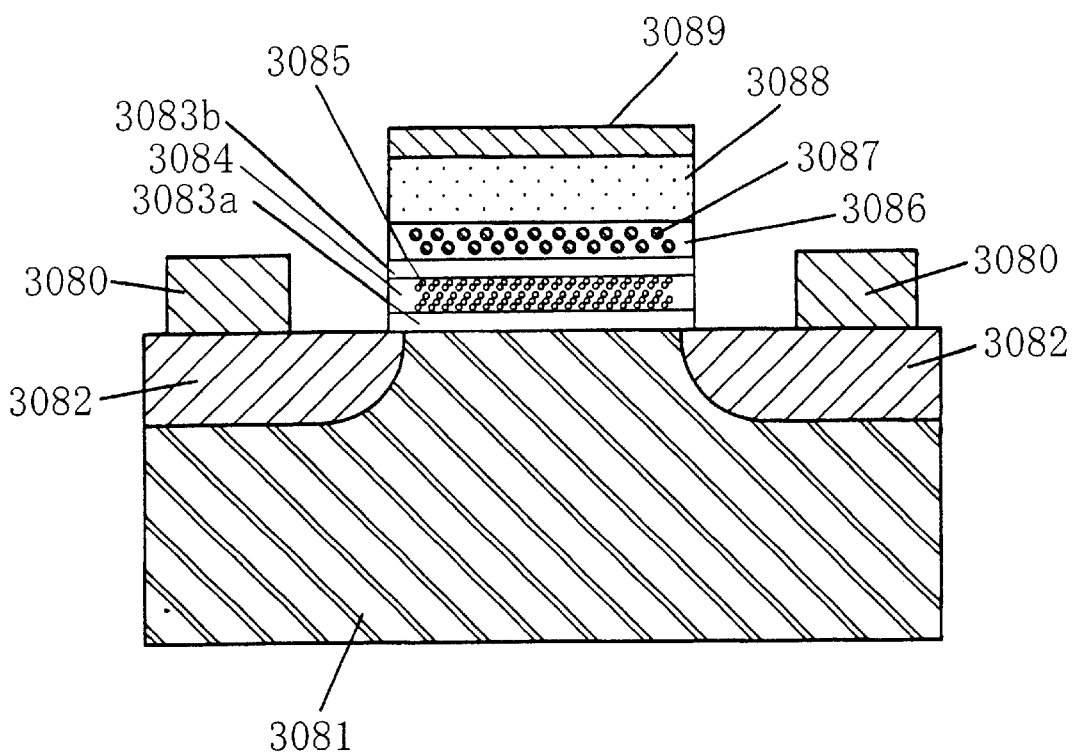
FIG. 33 is a cross-sectional view of a semiconductor memory device fabricated from the semiconductor device of EMBODIMENT 19.

FIG. 33 is a cross-sectional view of a semiconductor memory device formed using the semiconductor device of this embodiment. The semiconductor memory device includes: a p-type silicon substrate 3081 as the semiconductor substrate; source/drain regions 3082; a thermally oxidized $SiO_2$ film 3083a as the surface barrier layer; a silicon rich oxide film 3084 as the first microparticle dispersed layer where silicon microparticles 3085 as the first microparticles are dispersed in a $SiO_2$ film as the barrier layer; a deposited $SiO_2$ film 3083b as the barrier layer; a silicon rich oxide film 3086 as a second microparticle dispersed layer where gold microparticles 3087 as the second microparticles are dispersed in a $SiO_2$ film as the barrier layer; a gate insulating film 3088 made of a $SiO_2$ film; an n-type polysilicon electrode 3089 as the electrode layer; and source/drain electrodes 3080. This semiconductor memory device has a MIS transistor structure similar to that in EMBODIMENT 17, where, in this example, two microparticle dispersed layers (the $SiO_x$ layer, and the $SiO_2$ layer with gold microparticles dispersed therein) are formed between the gate insulating film 3088 and the semiconductor substrate 3081. This allows the threshold voltage of the MIS transistor characteristic to change depending on whether or not charge is held in the gold microparticles 3087 as the second microparticles. The resultant device serves as a low-voltage, high-speed nonvolatile semiconductor memory device allowing for prolonged recording.

In the semiconductor memory device of this embodiment, a region where at least the microparticle dispersed layers does not exist is provided in at least a portion of the gate region located above or in contact with the source region and/or a portion thereof located above or in contact with the drain region. This prevents a current short-circuited via the microparticles from flowing when a voltage is applied from the source region to the drain region.

Embodiment 20

Figure 34:
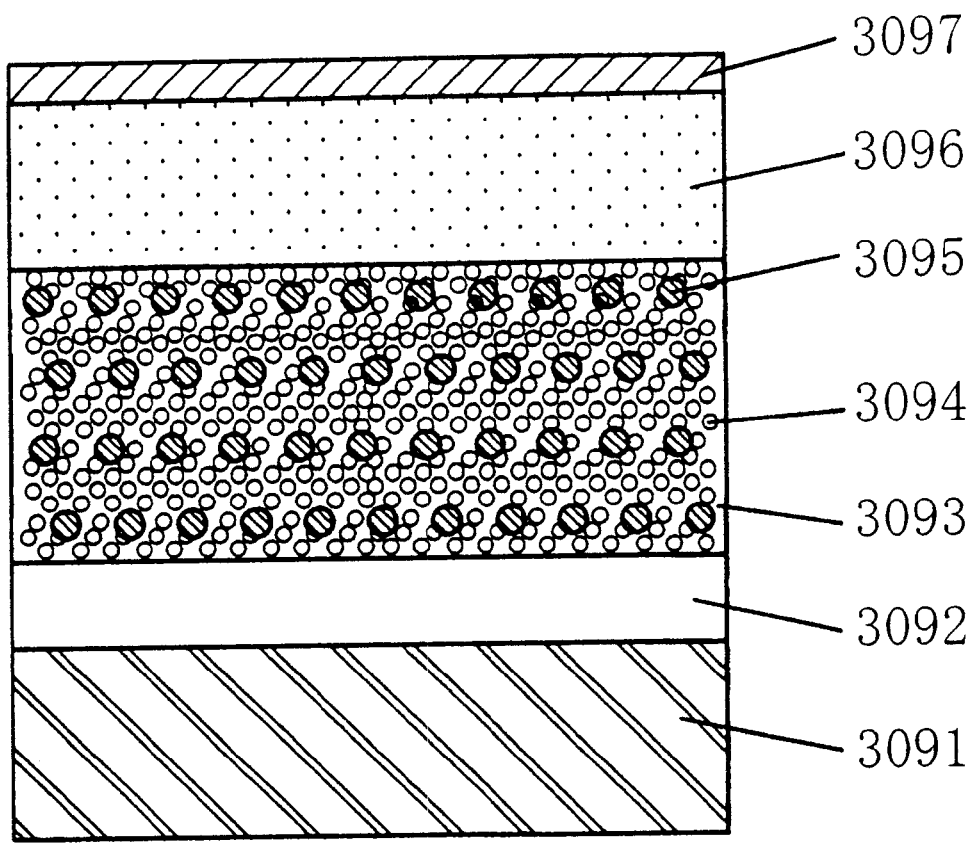
FIG. 34 is a cross-sectional view of a semiconductor device of EMBODIMENT 20 of the present invention.

FIG. 34 is a cross-sectional view of a semiconductor device of EMBODIMENT 20 of the present invention. The semiconductor device of this embodiment includes: a thermally oxidized $SiO_2$ film 3092 having a thickness of about 1.3 nm as the surface barrier layer that functions as a barrier for charge transfer; a microparticle dispersed layer 3093 having a thickness of about 5 nm where silicon microparticles 3094 as the first microparticles and ion-implanted tungsten atoms 3095 as the second microparticles are dispersed in a $SiO_2$ film functioning as a barrier for charge transfer; a $SiO_2$ film 3096 having a thickness of 6 nm as an insulating layer; and at the top an n-type polysilicon electrode 3097 as the electrode layer. These are formed in this order on a p-type silicon substrate 3091 as the semiconductor substrate.

Both the first microparticles 3094 and the second microparticles 3095 are dispersed in the $SiO_2$ layer as the barrier layer, but the diameters of these microparticles are different. The diameter of the second microparticles 3095 is 2.6 nm or more, which is 1.8 times or more as large as the diameter of the first microparticles 3094 that is substantially about 0.5 nm or less.

The microparticle dispersed layer can be formed by depositing the $SiO_x$ layer ($1.5<x<2$) by CVD, growing silicon microparticles under heat treatment at about 1100° C., and then introducing tungsten atoms into the resultant layer by ion implantation. In this embodiment, tungsten atoms introduced into the insulating layer are used as the second microparticles. Alternatively, any semiconductor atoms or metal atoms introduced by ion implantation, or other semiconductor microparticles or metal microparticles may be used.

In this embodiment, also, electron injection into, holding in, and release from the microparticles can be efficiently controlled based on the principle described in EMBODIMENT 18. In addition, in EMBODIMENT 18 above, it is required to control the thickness of the first microparticle dispersed layer in order to secure suitable device operation speed and recording retention duration. In this embodiment, however, the allowable thickness range of the first microparticle dispersed layer is wide, which makes device fabrication easy. More specifically, in the microparticle dispersed layer, the dispersed first and second microparticles are in various positional relationship with each other. A charge released from the semiconductor surface during writing selects a route through which the charge is transferred comparatively easily, to be injected into a second microparticle into which the charge is more easily injected. During charge holding, a charge is released earlier from a second microparticle that is located adjacent to the semiconductor surface, for example. However, a charge is held for a prolonged period in a second microparticle that is located at a position where charge release is more difficult. Thus, although this embodiment is low in the rate of charge holding with respect to charge injection compared with EMBODIMENT 18, it has an advantage of being simple in device construction, enabling fabrication of a semiconductor device with high reproducibility.

In this embodiment, the first microparticles and the second microparticles are clearly distinguished from each other. Alternatively, microparticles made of the same material having a wide range of particle diameters may be formed to provide a continuous particle diameter distribution, where those having a small diameter function as the first particles and those having a large diameter function as the second particles. Although the first and second microparticles are not clearly distinguished in this alternative case, injected charge tend to be selectively held in the large-diameter microparticles having a large capacitance. As a result, the microparticles selected by the charge function as the second microparticles. In order to prevent the charge from returning to the microparticles located in the vicinity of the semiconductor surface, the particle diameter distribution is required to range at least from 0.7 times to 1.6 times the intermediate diameter of the microparticles. For prolonged charge holding, a particle diameter distribution ranging at least from 0.4 times to 1.6 times is desired.

The particle diameter distribution is preferably shaped to have a valley in the center with two peaks on both sides.

The semiconductor device of this embodiment has the surface barrier layer between the semiconductor substrate and the microparticle dispersed layer. When the density of the microparticles in the microparticle dispersed layer is not so high, for example, the microparticle dispersed layer may be directly formed on the semiconductor substrate, omitting the surface barrier layer.

A semiconductor memory device having a construction similar to that of EMBODIMENT 17 can be fabricated using the structure of the semiconductor device of this embodiment.

Figure 35:
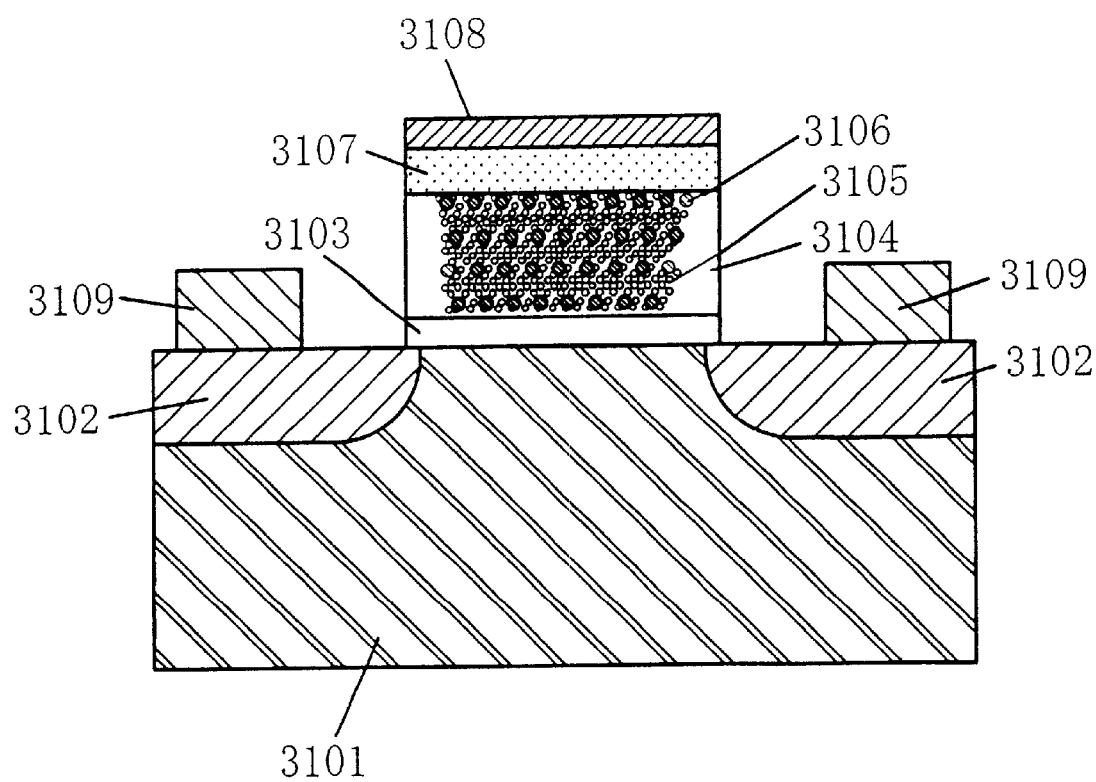
FIG. 35 is a cross-sectional view of a semiconductor memory device fabricated from the semiconductor device of EMBODIMENT 20.

FIG. 35 is a cross-sectional view of a semiconductor memory device formed using the semiconductor device of this embodiment. The semiconductor memory device includes: a p-type silicon substrate 3101 as the semiconductor substrate; source/drain regions 3102; a thermally oxidized $SiO_2$ film 3103 as the surface barrier layer; a microparticle dispersed layer 3104 where silicon microparticles 3105 as the first microparticles and tungsten microparticles 3106 as the second microparticles are dispersed in a $SiO_2$ film as the barrier layer: a gate insulating film 3107 made of a $SiO_2$ film; an n-type polysilicon electrode 3108 as the electrode layer; and source/drain electrodes 3109. With this construction, the threshold voltage of the MIS transistor characteristic changes depending on whether or not charge is held in the second microparticles. The resultant device serves as a low-voltage, high-speed nonvolatile semiconductor memory device allowing for prolonged recording.

In the semiconductor memory device of this embodiment, a region where at least the microparticle dispersed layer does not exist is provided in at least a portion of the gate region located above or in contact with the source region and/or a portion thereof located above or in contact with the drain region. This prevents a current short-circuited via the microparticles from flowing when a voltage is applied from the source region to the drain region.

Embodiment 21

Figure 36:
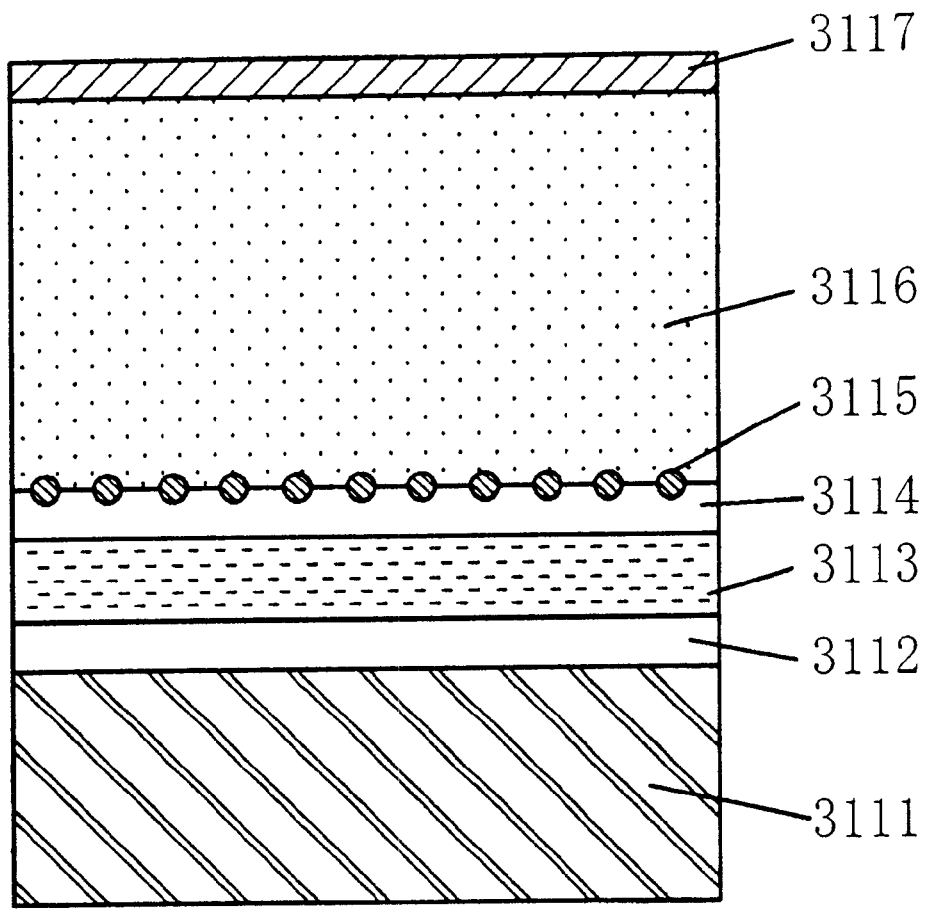
FIG. 36 is a cross-sectional view of a semiconductor device of EMBODIMENT 21 of the present invention.

FIG. 36 is a cross-sectional view of a semiconductor device of EMBODIMENT 21 of the present invention. The semiconductor device of this embodiment includes: a thermally oxidized $SiO_2$ film 3112 having a thickness of about 1 nm as the first $SiO_2$ layer; a $Si_3N_4$ layer 3113 having a thickness of about 1.2 nm as a $SiO_xN_y$ layer ($0 \leq x < 2$, $0 < y \leq 4/3$); a second $SiO_2$ layer 3114 having a thickness of about 1.8 nm; gold microparticles 3115 having a diameter of 2 nm; a $SiO_2$ film 3116 having a thickness of 10 nm as an insulating layer; and at the top an n-type polysilicon electrode 3117 as the electrode layer. These are formed in this order on a p-type silicon substrate 3111 as the semiconductor substrate.

Unlike EMBODIMENT 16, this embodiment does not have two types of microparticles having different particle diameters. Instead, the semiconductor device of this embodiment includes the $SiO_xN_y$ layer ($0 \leq x < 2$, $0 < y \leq 4/3$) sandwiched by the first and second $SiO_2$ layers. This construction generates charge-exchangeable levels (interface states) in the vicinity of the interface between the $SiO_xN_y$ layer and the second $SiO_2$ layer and inside the $SiO_xN_y$ layer. The inter-level energy distance at the interface state, as well as the potential rise at the interface state on receipt of charge, are so large that the interface state can provide virtually the same function as the small-diameter microparticles. In other words, in this embodiment, the interface state between the $SiO_xN_y$ layer and the second $SiO_2$ layer has the same function as the first microparticles in EMBODIMENT 16. This enables the microparticles in this embodiment to stably hold accumulated charge therein as is done by the second microparticles in EMBODIMENT 16. Therefore, in this embodiment, also, efficient control of electron injection into, holding in, and release from the microparticles is possible based on the principle described in EMBODIMENT 16.

In EMBODIMENT 16 above, it is required to form the first microparticles on the first barrier layer as a fine structure. However, in this embodiment utilizing the $SiO_xN_y$ layer, no special control over a fine structure is required. This advantageously facilitates fabrication of the semiconductor device and enhances the reproducibility of the device characteristics. The $SiO_xN_y$ layer with high quality can be easily formed by CVD.

In this embodiment, the $Si_3N_4$ layer as a $SiO_xN_y$ layer ($0 \leq x < 2$, $0 < y \leq 4/3$) is used. Alternatively, a silicon oxide nitride film having a composition represented by general formula, $SiO_xN_y$ ($0 < x < 2$, $0 < y < 4/3$) may be used.

If the microparticles are not formed but only the $SiO_xN_y$ layer is formed between. the first and second $SiO_2$ layers, charge is held at the interface level having a high capacitance. It makes it difficult to hold the charge for a prolonged period. Further, lateral charge dispersion may possibly occur between the charge-holding interface states, which may results in losing all accumulated charges by a local leak current. This reduces the reliability of the semiconductor device.

A semiconductor memory device having a construction similar to that of EMBODIMENT 17 can be fabricated using the structure of the semiconductor device of this embodiment.

Figure 37:
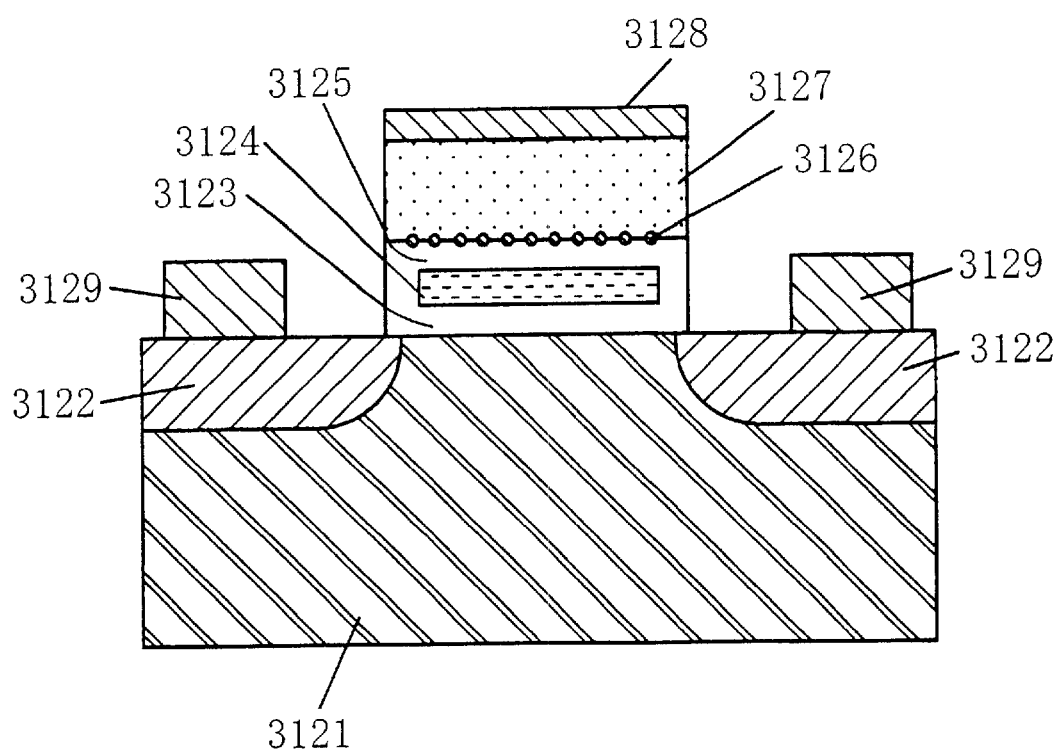
FIG. 37 is a cross-sectional view of a semiconductor memory device fabricated from the semiconductor device of EMBODIMENT 21.

FIG. 37 is a cross-sectional view of a semiconductor memory device formed using the semiconductor device of this embodiment. The semiconductor memory device includes: a p-type silicon substrate 3121 as the semiconductor substrate; source/drain regions 3122; a thermally oxidized $SiO_2$ film 3123 as the first $SiO_2$ layer; a $SiO_{1.5}N_{3.5}$ layer 3124 as the $SiO_xN_y$ layer ($0 \leq x < 2$, $0 < y \leq 4/3$); a second $SiO_2$ layer 3125; gold microparticles 3126; a $SiO_2$ film 3127; an n-type polysilicon electrode 3128; and source/drain electrodes 3129. With this construction, the threshold voltage of the MIS transistor characteristic changes depending on whether or not charge is held in the second microparticles. The resultant device serves as a low-voltage, high-speed nonvolatile semiconductor memory device allowing for prolonged recording.

In the semiconductor memory device of this embodiment, a region where at least the $SiO_xN_y$ layer and the microparticles do not exist is provided in at least a portion of the gate region located above or in contact with the source region and/or a portion thereof located above or in contact with the drain region. This prevents a current short-circuited via the microparticles from flowing when a voltage is applied from the source region to the drain region.

Embodiment 22

Figure 38:
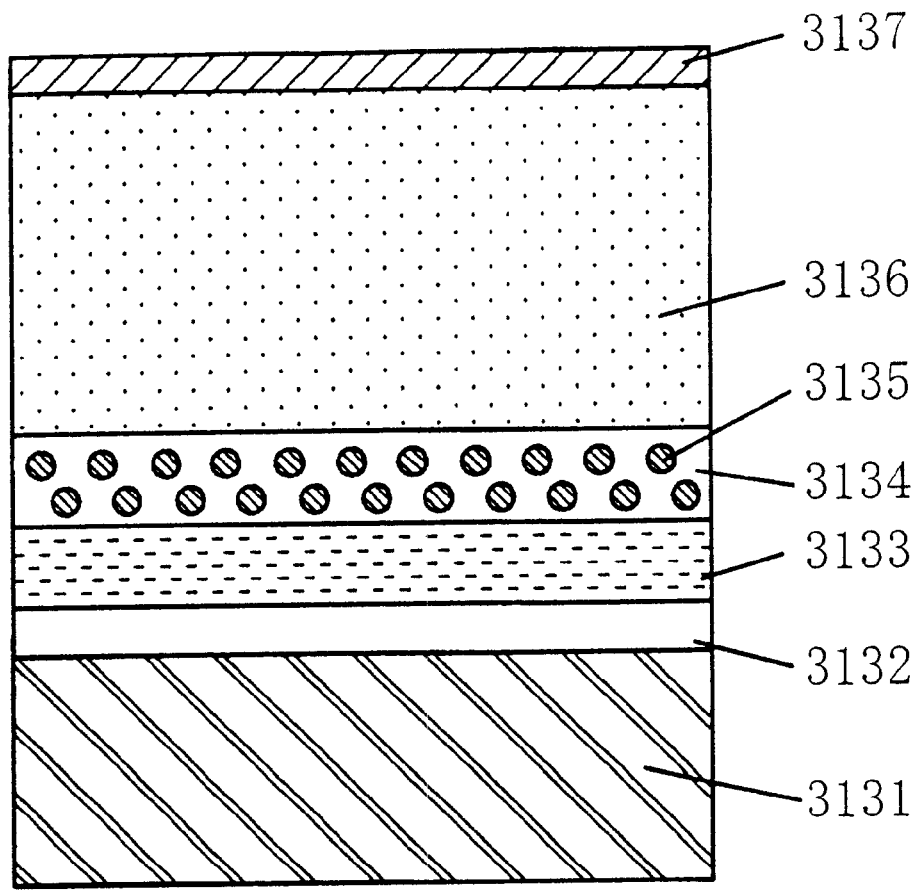
FIG. 38 is a cross-sectional view of a semiconductor device of EMBODIMENT 22 of the present invention.

FIG. 38 is a cross-sectional view of a semiconductor device of EMBODIMENT 22 of the present invention. The semiconductor device of this embodiment includes: a thermally oxidized $SiO_2$ film 3132 having a thickness of about 1.3 nm as the first $SiO_2$ layer; a $SiO_{0.5}N$ layer 3133 having a thickness of about 1.8 nm as a $SiO_xN_y$ layer ($0 \leq x < 2$, $0 < y \leq 4/3$); a silicon rich oxide film 3134 composed of a $SiO_x$ layer ($1.5 < x < 2$) as the first microparticle dispersed layer where silicon microparticles 3135 are dispersed in a $SiO_2$ barrier film functioning as a barrier for charge transfer; a $SiO_2$ film 3136 having a thickness of 10 nm as the insulating layer; and at the top an n-type polysilicon electrode 3137 as the electrode layer. These are formed in this order on a p-type silicon substrate 3131 as the semiconductor substrate. In this embodiment, the thickness of the $SiO_x$ layer is about 5 nm and the composition thereof is $SiO_{1.8}$.

In this embodiment, also, electron injection into, holding in, and release from the microparticles can be controlled efficiently based on the principle described in EMBODIMENT 21.

In EMBODIMENT 21 above, the microparticles need to be formed as a fine structure under control of the particle diameter distribution, the in-plane dispersion state, and the like. In this embodiment, however, with the microparticles dispersed in the barrier layer, fabrication of the semiconductor device is facilitated and the reproducibility of the device characteristics is enhanced.

In this embodiment, the $SiO_{0.5}N$ layer is used as the $SiO_xN_y$ layer ($0 \leq x < 2$, $0 < y \leq 4/3$). Alternatively, a $Si_3N_4$ layer or a silicon oxide nitride film having another composition may be used.

In this embodiment, a second $SiO_2$ layer may be formed between the $SiO_xN_y$ layer ($0 \leq x < 2$, $0 < y \leq 4/3$) and the microparticle dispersed layer, to further suppress leak current.

A semiconductor memory device having a construction similar to that of EMBODIMENT 17 can be fabricated using the structure of the semiconductor device of this embodiment.

Figure 39:
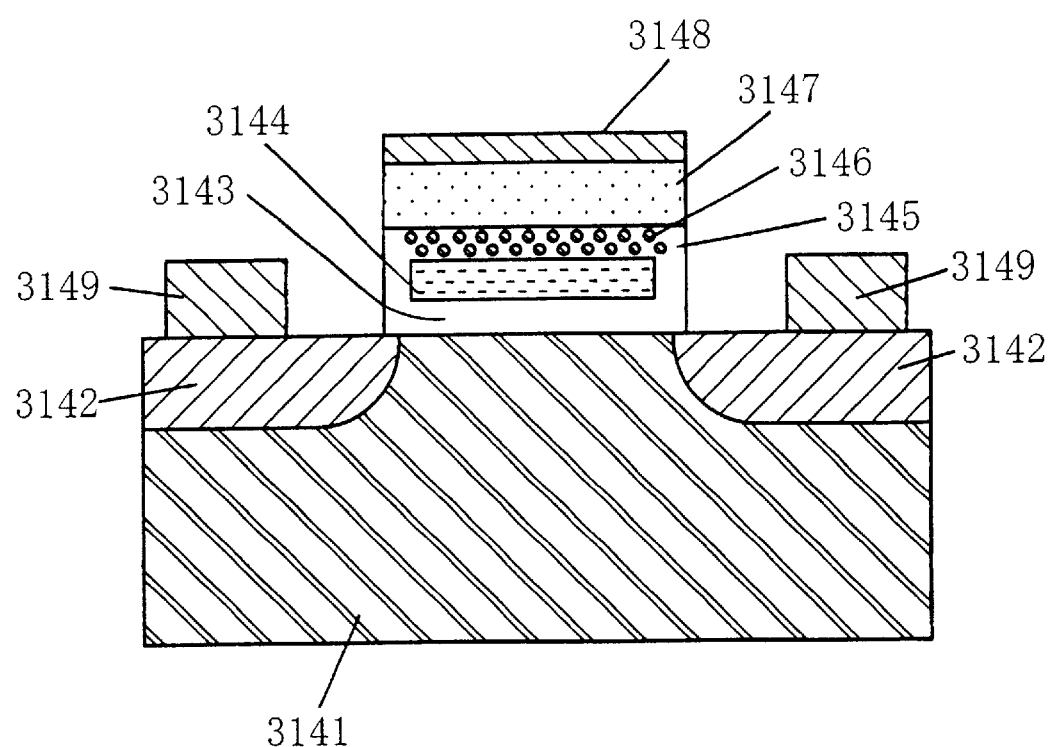
FIG. 39 is a cross-sectional view of a semiconductor memory device fabricated from the semiconductor device of EMBODIMENT 22.

FIG. 39 is a cross-sectional view of a semiconductor memory device formed using the semiconductor device of this embodiment. The semiconductor memory device includes: a p-type silicon substrate 3141 as the semiconductor substrate; source/drain regions 3142; a thermally oxidized $SiO_2$ film 3143; a $Si_3N_4$ layer 3144; silicon microparticles 3146; a silicon rich oxide film 3145; a $SiO_2$ film 3147; an n-type polysilicon electrode 3148; and source/drain electrodes 3149. With this construction, the threshold voltage of the MIS transistor characteristic changes depending on whether or not charge is held in the microparticles. The resultant device serves as a low-voltage, high-speed nonvolatile semiconductor memory device allowing for prolonged recording.

In the semiconductor memory device of this embodiment, a region where at least the $SiO_xN_y$ layer and the microparticle dispersed layer do not exist is provided in at least a portion of the gate region located above or in contact with the source region and/or a portion thereof located above or in contact with the drain region. This prevents a current short-circuited via the microparticles from flowing when a voltage is applied from the source region to the drain region.

Embodiment 23

Figure 40:
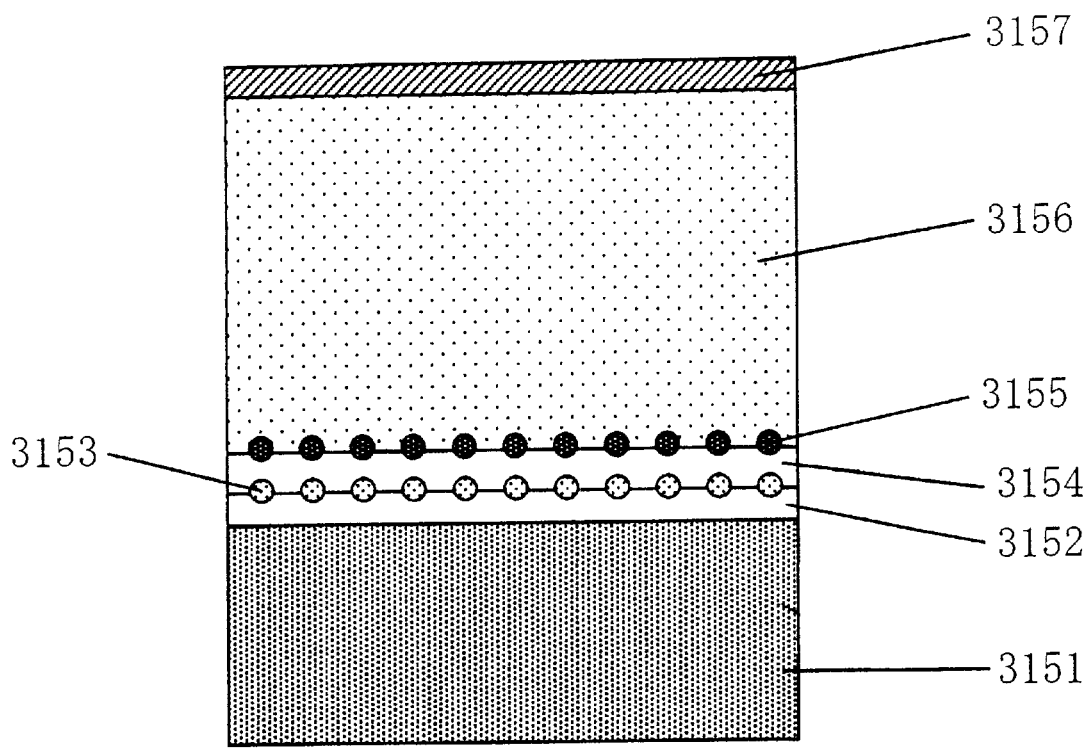
FIG. 40 is a cross-sectional view of a semiconductor device of EMBODIMENT 23 of the present invention.

FIG. 40 is a cross-sectional view of a semiconductor device of EMBODIMENT 23 of the present invention. The semiconductor device of this embodiment includes: a thermally oxidized $SiO_2$ film 3152 having a thickness of about 2 nm as the first barrier layer functioning as a barrier for charge transfer; silicon microparticles 3153 having a diameter of 2 nm as the first microparticles; a $SiO_2$ film 3154 having a thickness of about 2 nm as the second barrier layer functioning as a barrier for charge transfer; SiGe microparticles 3155 having a diameter of 2 nm as the second microparticles; a $SiO_2$ film 3156 having a thickness of 10 nm as the insulating layer; and at the top an n-type polysilicon electrode 3157 as the electrode layer. These are formed in this order on a p-type silicon substrate 3151 as the semiconductor substrate.

The silicon microparticles 3153 as the first microparticles and the SiGe microparticles 3155 as the second microparticles have the same diameter. They are however different in electron affinity. That is, the electron affinity of the silicon microparticles 3153 is smaller than that of the SiGe microparticles 3155. In this case, the sum of the electron affinity and the forbidden band of the affinity and the forbidden band of the silicon microparticles 3153 is larger than that of the SiGe microparticles 3155. In the structure of this embodiment, therefore, either electrons or holes can be held in the SiGe microparticles 3155 as the second microparticles for use as the information medium charge.

As described above, the semiconductor device of this embodiment can provide a reliable charge injection, holding, and release means that can be easily fabricated and realizes long-term charge holding compared with the conventional devices.

Figure 41:
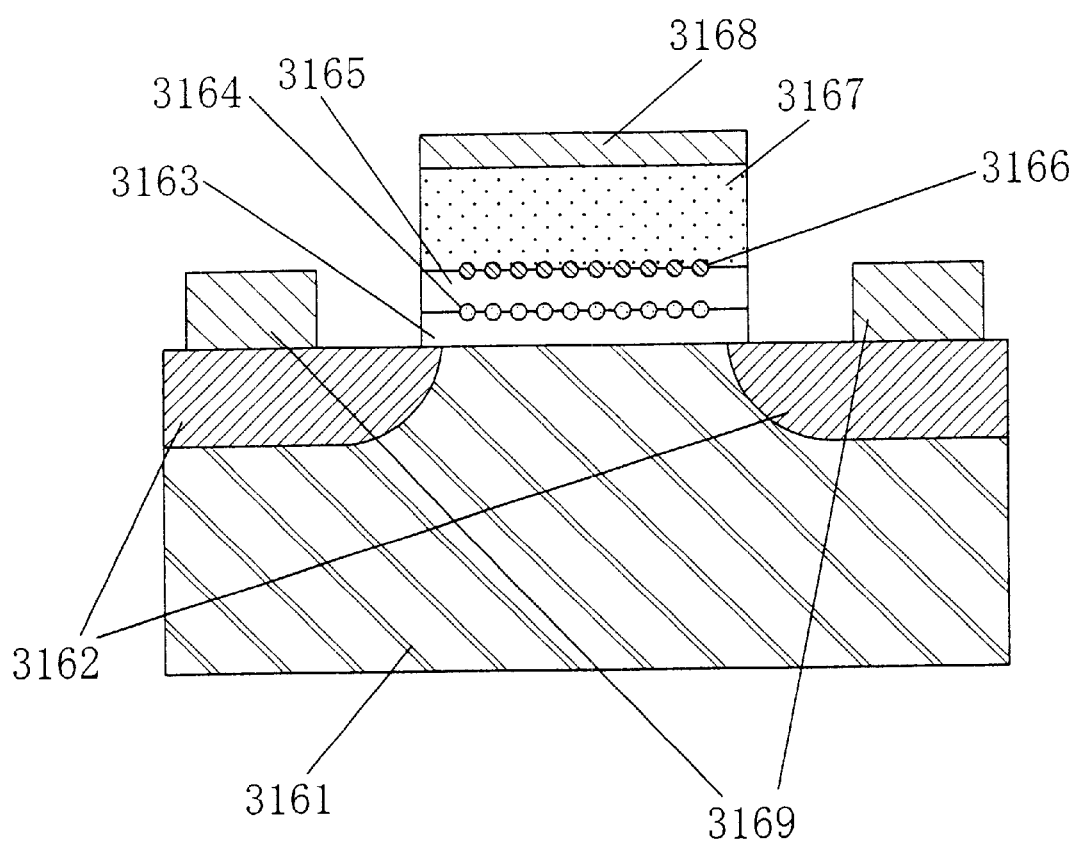
FIG. 41 is a cross-sectional view of a semiconductor memory device fabricated from the semiconductor device of EMBODIMENT 23.

FIG. 41 is a cross-sectional view of a semiconductor memory device formed using the semiconductor device of this embodiment. The semiconductor memory device includes: a p-type silicon substrate 3161 as the semiconductor substrate; n-type regions 3162 functioning as the source/drain regions; a thermally oxidized $SiO_2$ film 3163 having a thickness of about 1.9 nm; silicon microparticles 3164 as the first microparticles; a $SiO_2$ film 3165 as the second barrier layer; SiGe microparticles 3166 as the second microparticles; a $SiO_2$ layer 3167 as the gate insulating film; an n-type polysilicon electrode 3168 as the gate electrode; and metal electrodes 3169 as the source/drain electrodes. Thus, the semiconductor device has a MIS transistor structure.

The above structure also permits control of electron injection into, holding in, and release from the microparticles based on the principle described in EMBODIMENT 23. In addition, in this embodiment, the structure for holding charge is formed in the gate region of the MIS transistor structure. This allows the threshold voltage of the MIS transistor characteristic to change depending on whether or not charge is held in the second microparticles. The resultant device serves as a low-voltage, high-speed nonvolatile semiconductor memory device allowing for prolonged recording. Moreover, since the single device can realize basic memory operation, high-density integration is possible.

In this embodiment, as shown in FIG. 40, a region where the microparticles do not exist is provided in at least a portion of the gate region located above or in contact with the source region and/or a portion thereof located above or in contact with the drain region. This prevents a current short-circuited via the microparticles from flowing when a voltage is applied from the source region to the drain region.

In EMBODIMENTS 16 to 23 above, the p-type silicon substrate was used as the semiconductor substrate. Alternatively, an n-type silicon substrate, or a substrate made of GaAs or any other semiconductor material may be used.

In EMBODIMENTS 16 to 23, $SiO_2$ was used as the material for the insulating layers. Alternatively, other insulating materials such as $Si_3N_4$, $Si_xO_yN_z$ ($4x=2y+3z$), $CeO_2$, ZnS, ZnO, and $Al_2O_3$ may be used as described above.

In EMBODIMENTS 16 to 23, silicon microparticles, gold microparticles, tungsten atoms, and SiGe microparticles were used. Alternatively, other semiconductor and metal materials may be used as the microparticles.

Embodiment 24

Figure 42:
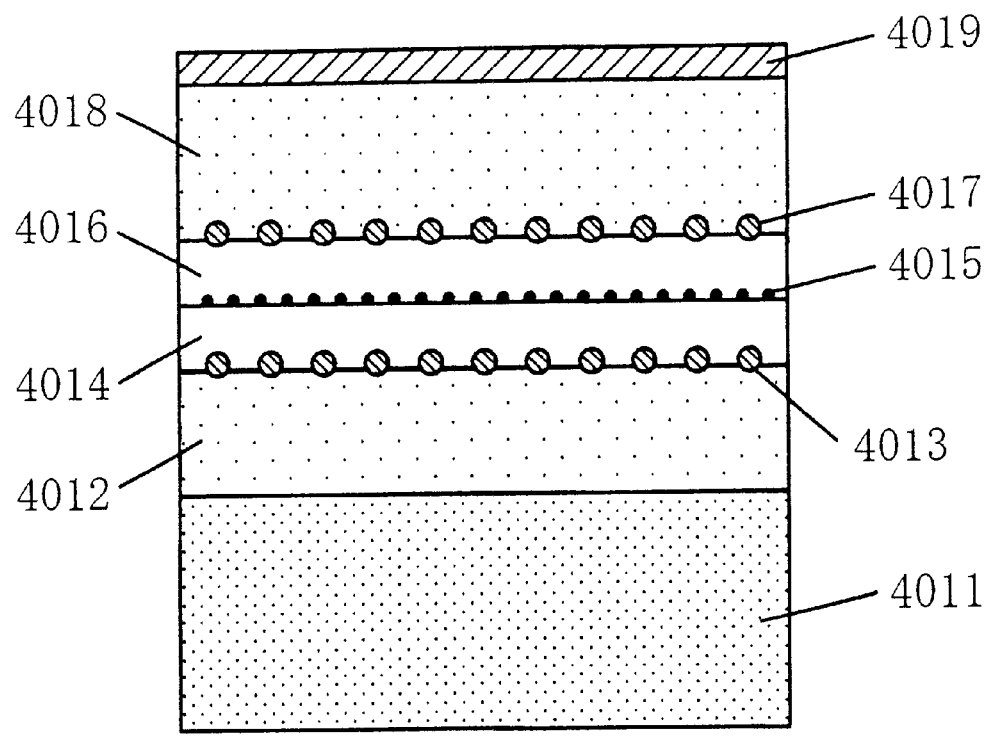
FIG. 42 is a cross-sectional view of a semiconductor device of EMBODIMENT 24 of the present invention.

FIG. 42 is a cross-sectional view of a semiconductor device of EMBODIMENT 24 of the present invention. The semiconductor device of this embodiment includes: a $SiO_2$ film 4012 having a thickness of 4 nm as the first insulating layer; gold microparticles 4013 as the first microparticles; a thermally oxidized $SiO_2$ film 4014 having a thickness of about 2 nm as the first barrier layer functioning as a barrier for charge transfer; silicon microparticles 4015 having a diameter of about 1 nm as the second microparticles; a $SiO_2$ film 4016 having a thickness of 2 nm as the second barrier layer functioning as a barrier for charge transfer; gold microparticles 4017 as the third microparticles; a $SiO_2$ film 4018 having a thickness of 10 nm as the second insulating layer; and at the top an n-type polysilicon electrode 4019 as the electrode layer. These are formed in this order on a p-type silicon substrate 4011 as the semiconductor substrate. The gold microparticles as the first and third microparticles have a height of about 1 nm and a diameter in the lateral direction of 5 to 8 nm. The effective diameter of the first and third microparticles is 1.8 times or more as large as that of the second microparticles, and thus the capacitance of the former is larger than that of the latter. The electron affinity of the first and third microparticles is larger than that of the second microparticles, and the sum of the electron affinity and the forbidden band of the former is smaller than that of the latter.

The silicon microparticles are formed by CVD at a surface density of about $1 \times 10^{11}$ cm$^{-2}$ to $1 \times 10^{13}$ cm$^{-2}$. The gold microparticles are fixed by wafer immersion into a gold colloid solution at a surface density of about $1 \times 10^{10}$ cm$^{-2}$ to $1 \times 10^{12}$ cm$^{-2}$.

In the conventional semiconductor device shown in FIG. 57, the amount of charge in the microparticles gradually changes depending on the electric field state at the semiconductor surface, thereby making it difficult to effect reliable charge holding as described above. On the contrary, the construction of this embodiment greatly enhances the reliability of the device as described below.

In this embodiment, information is recorded by charge transfer between the first microparticles and the third microparticles via the second microparticles. More specifically, for information recording (writing or erasing), an electric field for writing (or erasing) is applied externally between the upper electrode and the semiconductor substrate, to generate an electric field gradation between the first microparticles and the third microparticles, which causes charge transfer to occur therebetween and thus changes the charge distribution state.

In this embodiment, the insulating layer is formed between the first microparticles and the semiconductor substrate. No charge transfer therefore occurs between the semiconductor substrate and the first microparticles. Since the microparticles for holding charge are located isolated from the semiconductor surface, the influence of the semiconductor surface is only indirect. Even if the semiconductor surface becomes a charge accumulated state or a strong inversion state during charge holding, having a number of holes or electrons on the surface, such holes or electrons will not directly influence the charge transfer between the microparticles. Actually, when the surface state of the semiconductor substrate changes, a change in an electric field gradation corresponding to the change of the surface state occurs between the first and third microparticles. However, this electric field gradation is so small compared with the electric field gradation generated by the externally applied electric field during writing and erasing that it can be suppressed.

Having the above effect, this embodiment can provide a highly reliable semiconductor device that can reduce the variation in the charge holding state of the microparticles with a change in the surface state of the semiconductor substrate.

Specific charge injection and holding operations of the device of this embodiment will be described.

When a positive voltage, for example, is applied to the n-type polysilicon electrode 4019 externally as a write voltage, electrons are released from the first microparticles (gold microparticles 4013) to migrate to the second microparticles (silicon microparticles 4015). The second microparticles are small in diameter compared with the first microparticles and the third microparticles (gold microparticles 4017), and thus the capacitance of the second microparticles is small as described above. Therefore, the electrons on the second microparticles are unstable, causing redundant electrons to immediately migrate from the second microparticles to the third microparticles. This charge transfer results in accumulation of +e charge in the first microparticles while −e charge in the third microparticles. Since the capacitance of the first and third microparticles is large compared with that of the second microparticles, the electric field generated by the accumulated electrons is sufficiently small compared with the external electric field generated during writing, allowing the once accumulated electrons to be held undischarged for a prolonged period. In particular, if the diameter of the second microparticles is 5 nm or less, the potential rise at each of the second microparticles due to a single charge is great compared with the electric field gradation due to the accumulated charges and the thermal energy. This makes difficult the charge transfer via the second microparticles and thus allows for long-term charge holding. During erasing, the accumulated charges can be easily released by applying an external electric field of the same magnitude as but the opposite polarity to the electric field for writing.

Further stabilization of the charge holding is possible when the state of the second microparticles is quantized and the energy distance between the quantum levels is large compared with the thermal energy and the potential rise at the third microparticles for the following reason.

Figure 43A:
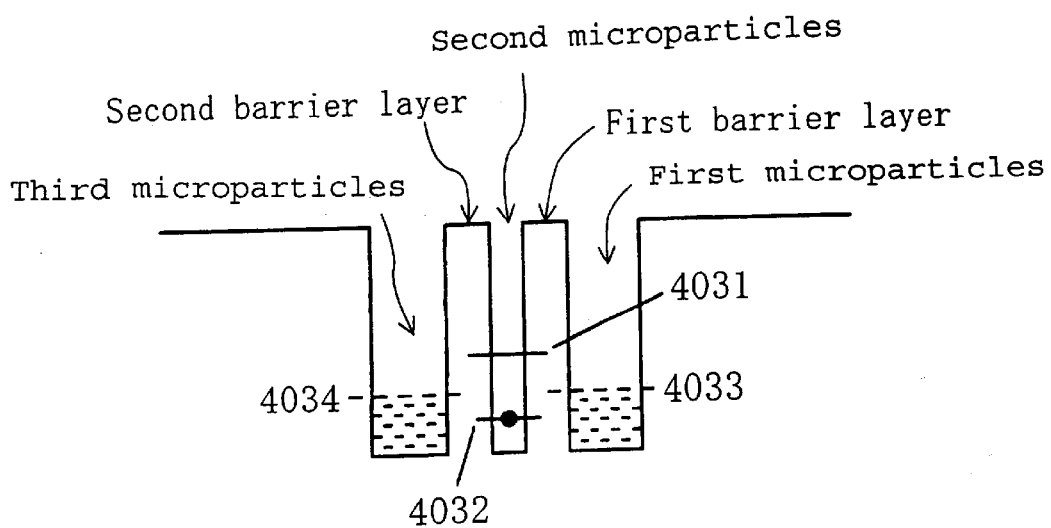
FIGS. 43(a), 43(b), and 43(c) are schematic band diagrams near the conduction band edge during charge transfer by electrons.
Figure 43B:
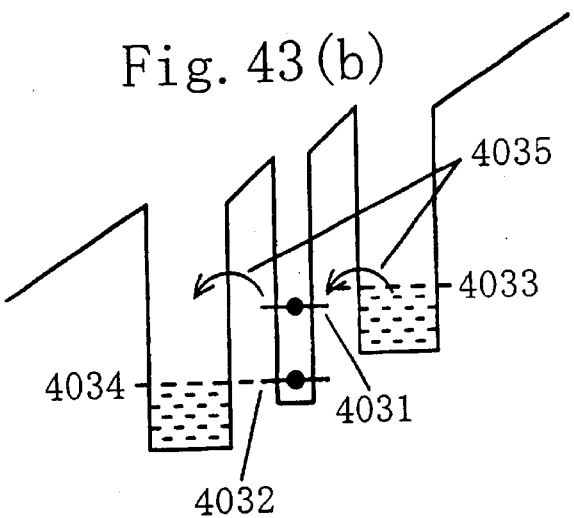
Figure 43C:
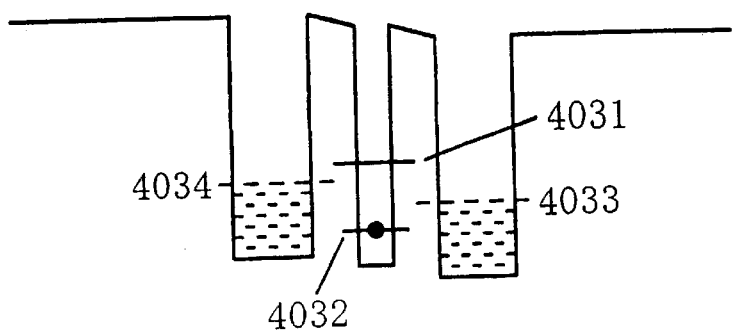

FIGS. 43(a) to 43(c) schematically illustrate the band structure in the vicinity of the conduction band edges during electron transfer. Referring to FIG. 43(a), assume that, in the state of the first to third microparticles having no charge, the second microparticles are quantized, the ground level 4032 is occupied by an electron, the first excited level 4031 is vacant, and the energy distance between the two levels is sufficiently larger than the thermal energy. Referring to FIG. 43(b), when an electric field for writing is applied externally, electrons are injected into the third microparticles through tunneling 4035 from the first microparticles via the first excited level 4031 of the second microparticles. Referring to FIG. 43(c), once the external electric field is removed, the Fermi level 4034 of the third microparticles is lower than the first excited level 3032 when the diameter of the third microparticles is large. If the difference between these levels is larger than the thermal energy, the charge will not be easily released, resulting in the charge in the first and third microparticles being held stably. It would be understood that substantially the same effect is obtained when holes are used as the injection charge.

In this embodiment, higher write and erase speeds, as well as lower write and erase voltages, can be obtained by thinning the barrier layers. The barrier layers can be thinned because in this embodiment leak current is suppressed and thus charge holding is stabilized.

Charge leak via the second microparticles can be suppressed because the electron affinity of the first and third microparticles is larger than that of the second microparticles in the case of using electrons as the charge and because the sum of the electron affinity and the forbidden bandwidth of the first and third microparticles is smaller than that of the second microparticles in the case of using holes as the charge. This further facilitates the charge holding. In particular, long-term stable charge holding is secured if the second microparticles are made of a semiconductor material and the first and third microparticles are made of a metal material.

In this embodiment, it is also possible to apply in advance an electric field larger than that applied during writing or erasing to the upper electrode (polysilicon layer) 4019, so that the first or third microparticles can hold redundant initial charge received from the p-type silicon substrate 4011 or the n-type polysilicon electrode 4019 (upper electrode). If one charge in average is given to each of the first microparticles (gold microparticles 4013) or the third microparticles (gold microparticles 4017) as the initial charge, information recording is possible by distinguishing whether the single charge is in the first microparticle or the third microparticle. The electric field gradation between the first and third microparticles generated by transfer of a single charge when no initial charge exists is about $2q/(C \times d)$ (q: charge elementary quantity, C: capacitance between the first and third microparticles, d: effective distance between a pair of the first and third microparticles). The electric field gradation is reduced to about $q/(C \times d)$ when the initial charge exists in the first or third microparticle. This serves to further suppress charge transfer during information holding, thereby facilitating long-term information holding.

Thus, the semiconductor device of this embodiment can provide a reliable information recording, retention, and release means that can realize long-term charge holding compared with the conventional devices.

In this embodiment, either electrons or holes can be used as the charge to be injected into and accumulated in the microparticles.

In this embodiment, the p-type silicon substrate is used as the semiconductor substrate. Alternatively, an n-type silicon substrate, or a substrate made of any other semiconductor material may be used.

In this embodiment, the silicon microparticles and the gold microparticles are used. Alternatively, other metal and semiconductor materials may be used.

In this embodiment, the second microparticles located between the first and third microparticles has a single layer structure sandwiched by the first barrier layer (thermally oxidized $SiO_2$ film 4014) and the second barrier layer ($SiO_2$ film 4016). Alternatively, a plurality of second microparticle layers may be formed with each layer sandwiched by barrier layers. This further stabilizes the charge holding in the first and third microparticles.

In this embodiment, the insulator surrounds the region of the microparticles. This construction is preferred because accumulated charges will not be lost due to a neighboring short circuit. When initial charge is held, in particular, it is required to surround the microparticle region with an insulator to prevent the charge from being released outside.

Embodiment 25

Figure 44:
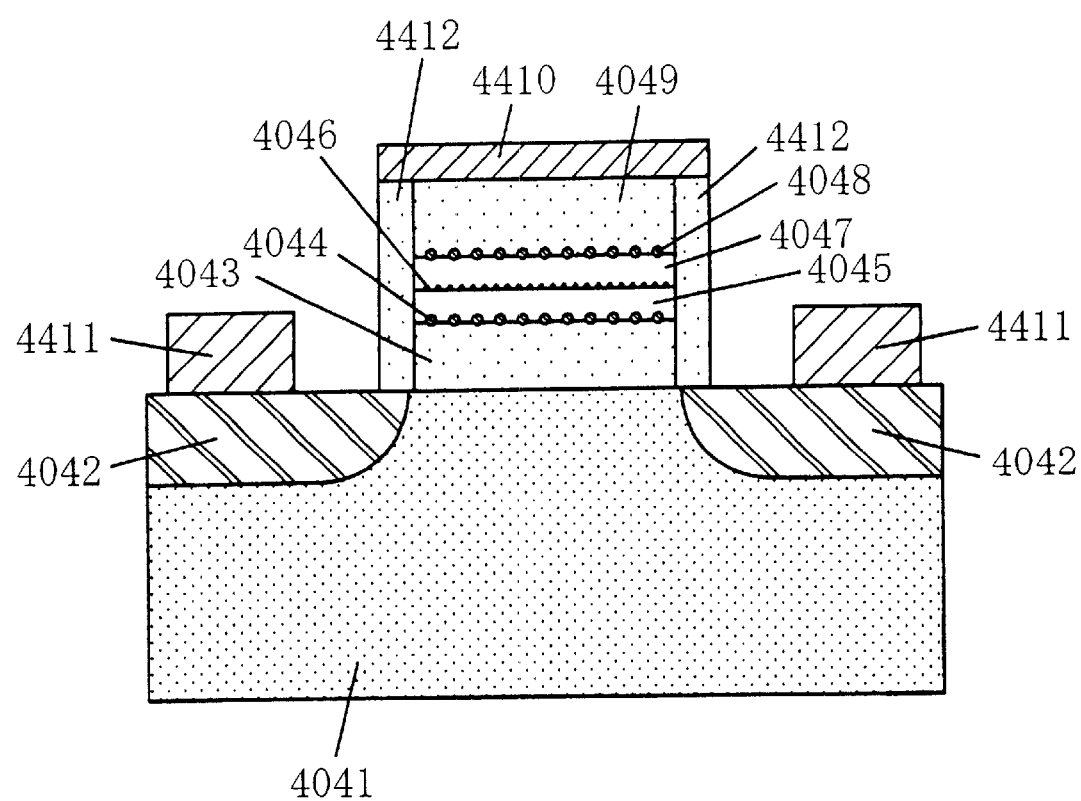
FIG. 44 is a cross-sectional view of a semiconductor memory device of EMBODIMENT 25 of the present invention.

FIG. 44 is a cross-sectional view of a semiconductor memory device of this embodiment. N-type conductive regions 4042 functioning as the source/drain regions are formed in a p-type silicon substrate 4041 as the semiconductor substrate, which constitute a MIS transistor structure together with metal electrodes 4411 as the source/drain electrodes, a $SiO_2$ gate insulating film 4049, and an n-type polysilicon electrode 4410 as the gate electrode. Between the gate insulating film 4049 and the p-type silicon substrate 4041 of the MIS transistor structure, the following structure is formed.

The structure includes: a $SiO_2$ layer 4043 having a thickness of 4 nm as the insulating layer; gold microparticles 4044 as the first microparticles; a thermally oxidized $SiO_2$ film 4045 (first barrier layer) having a thickness of about 2 nm functioning as a barrier for charge transfer; silicon microparticles 4046 having a diameter of 1 nm as the second microparticles; a $SiO_2$ film 4047 (second barrier layer) having a thickness of about 2 nm functioning as a barrier for charge transfer; and gold microparticles 4048 as the third microparticles, which are formed in this order on the p-type silicon substrate 4041. In addition, sidewalls 4412 are formed on the sides of the $SiO_2$ film 4043, the gold microparticles 4044, the thermally oxidized $SiO_2$ film 4045, the silicon microparticles 4046, the $SiO_2$ film 4047, and the gold microparticles 4048. The gold microparticles 4044 and 4048 as the first and third microparticles have a height of about 1 nm and a diameter in the lateral direction of 5 to 8 nm.

The effective diameter of the first and third microparticles (gold microparticles 4044 and 4048) is 1.8 times or more as large as that of the second microparticles (silicon microparticles 4046), and thus the capacitance of the former is larger than that of the latter. The surface density of the silicon microparticles is about $1 \times 10^{11}$ $cm^{-2}$ to $1 \times 10^{13}$ $cm^{-2}$, and that of the gold microparticles is about $1 \times 10^{10}$ $cm^{-2}$ to $1 \times 10^{12}$ $cm^{-2}$. The region of the microparticles is surrounded by the $SiO_2$ sidewalls 4412 as the insulator. This ensures that accumulated charges will not be lost due to a neighboring short circuit. In the case of holding initial charge in the microparticles, also, the charge is prevented from being released outside.

In the semiconductor memory device of this embodiment, a region where at least the microparticle dispersion layer do not exist is provided in at least a portion of the gate region located above or in contact with the source region and/or a portion thereof located above or in contact with the drain region. This prevents a current short-circuited via the microparticles from flowing when a voltage is applied from the source region to the drain region.

In this embodiment, also, electron injection into, holding in, and release from the microparticles can be controlled based on the principle described in EMBODIMENT 24. In addition, in this embodiment, the charge holding structure is formed in the gate region of the MIS transistor structure. This allows the threshold voltage of the MIS transistor characteristic to change depending on a change in charge distribution in the first and third microparticles. The resultant device serves as a high-speed, reliable nonvolatile semiconductor memory device.

In this embodiment, the area of the gate region including the microparticles may be divided into a plurality of portions in such a direction that can at least block a source-drain short-circuited current. This also prevents a current short-circuited via the microparticles from flowing when a voltage is applied from the source region to the drain region.

Embodiment 26

Figure 45:
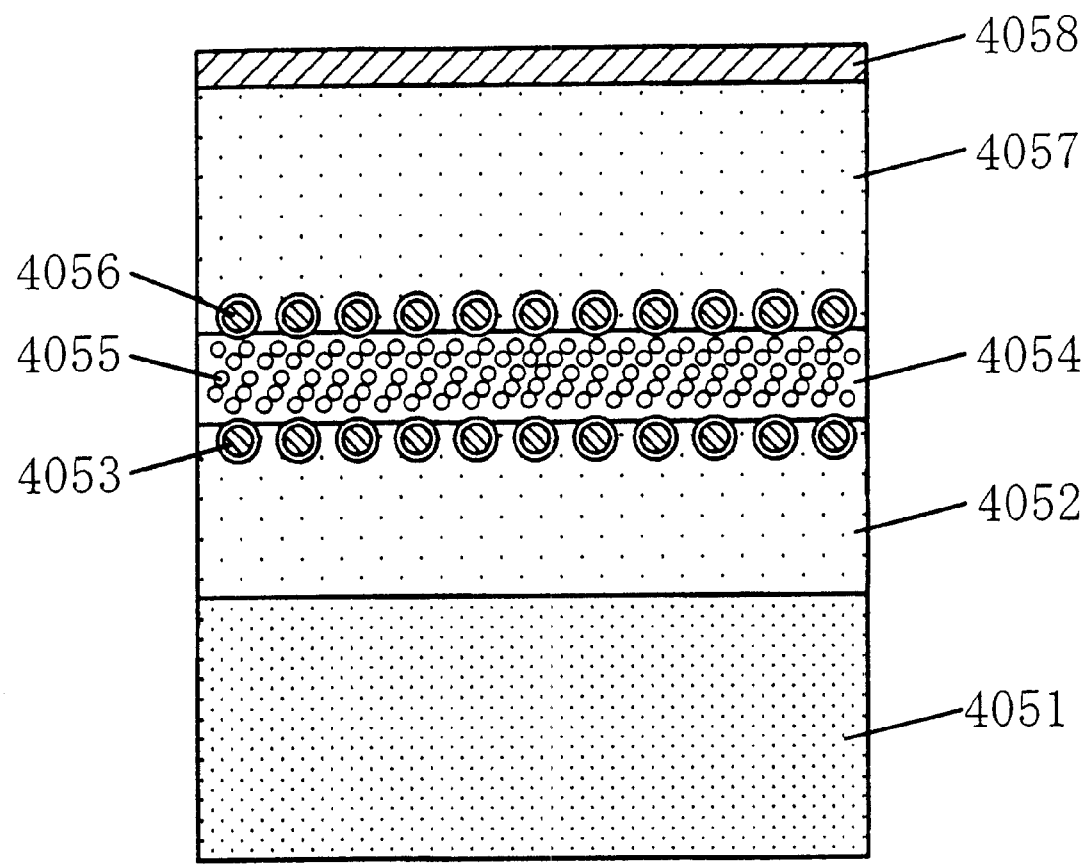
FIG. 45 is a cross-sectional view of a semiconductor device of EMBODIMENT 26 of the present invention.

FIG. 45 is a cross-sectional view of a semiconductor device of EMBODIMENT 26 of the present invention. The semiconductor device of this embodiment includes: a $SiO_2$ film 4052 having a thickness of 4 nm as the first insulating layer; silicon microparticles 4053 having a diameter of 5 nm as the first microparticles; a silicon rich oxide film 4054 made of $SiO_x$ (1.5<x<2) deposited by CVD as the first microparticle dispersed layer where silicon microparticles 4055 as the second microparticles are dispersed in a $SiO_2$ layer as the barrier layer functioning as a barrier for charge transfer; silicon microparticles 4056 having a thickness of 5 nm as the third microparticles; a $SiO_2$ film 4057 having a thickness of 10 nm as the second insulating layer; and at the top an n-type polysilicon electrode 4058 as the electrode layer. These are formed in this order on a p-type silicon substrate 4051 as the semiconductor substrate.

The surfaces of the silicon microparticles 4053 and 4056 as the first and third microparticles are oxidized so that the silicon microparticles 4053 and 4056 are covered with a $SiO_2$ film (barrier layer) having a thickness of about 1 nm functioning as a barrier for charge transfer.

The silicon microparticles 4053 and 4056 as the first and third microparticles are formed by CVD and have a surface density of about $1 \times 10^{10}$ cm$^{-2}$ to $1 \times 10^{12}$ cm$^{-2}$.

In EMBODIMENT 24 above, the second microparticles are formed as a fine structure on the first barrier layer under control of the particle diameter distribution, the in-plane dispersion state, and the like. In this embodiment, however, the structure with the silicon microparticles 4055 dispersed in the $SiO_2$ film as the barrier layer can be easily obtained by using the $SiO_x$ layer (1.5<x<2) (silicon rich oxide film 4054). In other words, in this embodiment, control of a fine structure is not required since minute silicon islands (silicon microparticles 4055) in the $SiO_x$ layer serve as the second microparticles. This facilitates the fabrication of the semiconductor device and enhances the reproducibility of the device characteristics. A high-quality $SiO_x$ layer (silicon rich oxide film 4054) can be formed by CVD, but other methods such as sputtering may be employed. The oxygen content x of the $SiO_x$ layer (1.5<x<2) is preferably in the range of 1.8<x<2, which realizes more minute silicon islands. The thickness of the $SiO_x$ layer (1.5<x<2) may be in the range of 5 to 20 nm in order to realize low-voltage device operation. In this embodiment, $SiO_{1.9}$ having a thickness of 10 nm is used.

The diameter of the silicon microparticles 4055 in the $SiO_x$ layer (1.5<x<2) functioning as the second microparticles is 1 nm or less, and the diameter of the silicon microparticles 4053 and 4056 as the first and third microparticles is 1.8 times or more as large as the diameter of the second microparticles.

In this embodiment, the $SiO_x$ layer is used as it is, not being heat-treated, utilizing existing minute silicon islands as the microparticles. Alternatively, the $SiO_x$ layer may be heat-treated at about 1000° C., to allow the silicon microparticles to grow for control of the diameter thereof.

In this embodiment, the $SiO_x$ layer is used as the microparticle dispersed layer. Alternatively, a layer with semiconductor ions or metal ions implanted in an insulator may be used in place of the microparticle dispersed layer. In this alternative case, a microparticle dispersed layer having the charge control function as described above can be formed more easily. Although the insulating layer with semiconductor or metal ions implanted therein is different from the structure with silicon microparticles and the like dispersed therein, the levels formed by the semiconductor or metal ions in the insulating layer provide substantially the same function as those provided by the small-diameter first microparticles in this embodiment. Therefore, the ion-implanted layer can be used as the microparticle dispersed layer in this embodiment. For example, a $SiO_2$ film with Si ions, W ions, and the like implanted therein may be used as the microparticle dispersed layer. In this case, also, substantially the same effect is obtained.

In this embodiment, also, electron injection into, holding in, and release from the microparticles can be controlled efficiently based on the principle described in EMBODIMENT 24. In addition, in this embodiment, the second microparticles need not to be formed as a fine structure. This facilitates the fabrication of the semiconductor device and enhances the reproducibility of the device characteristics.

Moreover, unlike EMBODIMENT 24, the charge transfer between a first microparticle and a third microparticle is normally done via a plurality of second microparticles, not via a single second microparticle. In this tunneling via a plurality of microparticles, the tunnel current is reduced especially under a weak electric field during charge holding, compared with the tunneling via a single microparticle. This facilitates longer-term charge holding.

In the semiconductor device of this embodiment, the surface of the first and third silicon microparticles are oxidized so that the first and third silicon microparticles are covered with barrier layers functioning as a barrier for charge transfer. Such barrier layers may not be formed, to simplify the device fabrication process.

A barrier layer may be formed between the first or third microparticles and the microparticle dispersed layer, to further suppress leak current.

The first and third microparticles may also be dispersed in respective barrier layers functioning as a barrier for charge transfer. This simplifies the device fabrication.

A semiconductor memory device having a construction similar to that of EMBODIMENT 25 can be fabricated using the structure of the semiconductor device of this embodiment.

Figure 46:
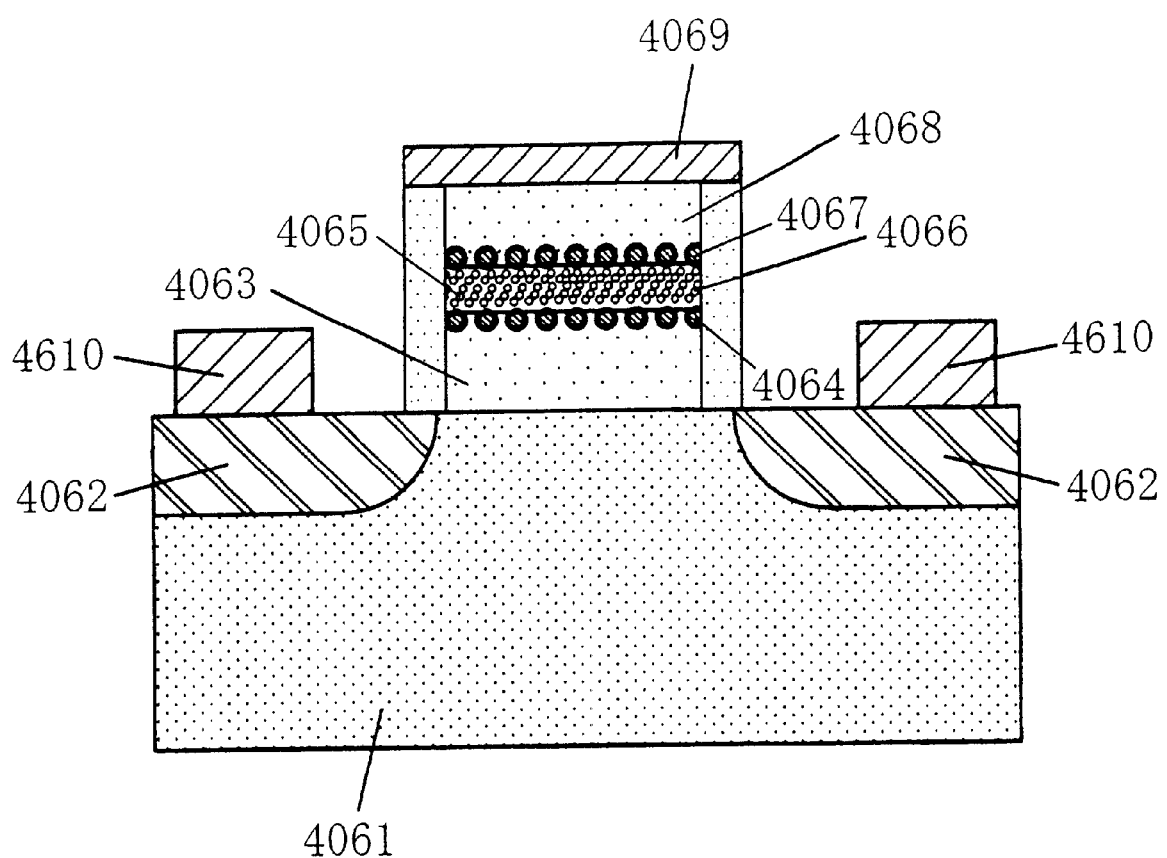
FIG. 46 is a cross-sectional view of a semiconductor memory device fabricated from the semiconductor device of EMBODIMENT 26.

FIG. 46 is a cross-sectional view of a semiconductor memory device formed using the semiconductor device of this embodiment. The semiconductor memory device includes: a p-type silicon substrate 4061 as the semiconductor substrate; n-type conductive regions 4062 functioning as the source/drain regions; a $SiO_2$ film 4063; gold microparticles 4064 as the first microparticles; a thermally oxidized $SiO_2$ film 4065; silicon microparticles 4067 as the second microparticles; a $SiO_2$ film 4068; and an n-type polysilicon electrode 4069. $SiO_2$ sidewalls are formed on the sides of the $SiO_2$ film 4063, the gold microparticles 4064, the thermally oxidized film 4065, the silicon microparticles 4067, and the $SiO_2$ film 4068. Metal electrodes 4610 as the Source/drain electrodes are formed on the n-type conductive regions 4062, whereby a MIS transistor structure is formed as a whole.

With this construction, the threshold voltage of the MIS transistor characteristic varies depending on a change in charge distribution in the second microparticles (gold microparticles 4064) and the third microparticles (silicon microparticles 4067). The resultant device serves as a high-speed, reliable nonvolatile semiconductor memory device.

In the semiconductor memory device of this embodiment, as in EMBODIMENT 25, the region of the microparticle dispersed layer is surrounded by the isolator. This ensures that accumulated charges will not be lost due to a neighboring short circuit. In the case of holding initial charge in the microparticles, also, the charge is prevented from being released outside.

In the semiconductor memory device of this embodiment, a region where at least the microparticle dispersed layer does not exist is provided in at least a portion of the gate region located above or in contact with the source region and/or a portion thereof located above or in contact with the drain region. This prevents a current short-circuited via the microparticles from flowing when a voltage is applied from the source region to the drain region.

Embodiment 27

Figure 47:
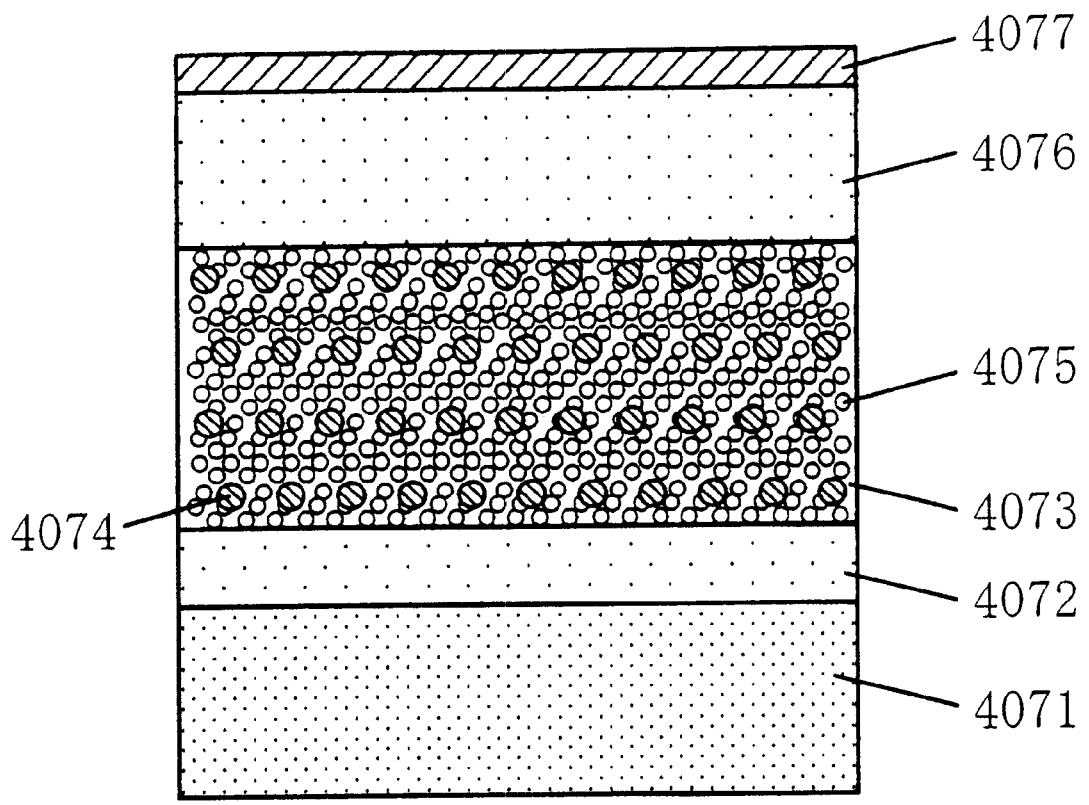
FIG. 47 is a cross-sectional view of a semiconductor device of EMBODIMENT 27 of the present invention.

FIG. 47 is a cross-sectional view of a semiconductor device of EMBODIMENT 27 of the present invention. The semiconductor device of this embodiment includes: a $SiO_2$ film 4072 having a thickness of 4 nm as the first insulating layer; a microparticle dispersed layer 4073 having a thickness of about 5 nm where silicon microparticles 4075 as the first microparticles and ion-implanted tungsten atoms 4074 as the second microparticles are dispersed in a $SiO_2$ layer as the barrier layer functioning as a barrier for charge transfer; a $SiO_2$ film 4076 having a thickness of 10 nm as the second insulating layer; and at the top an n-type polysilicon electrode 4077 as the electrode layer. These are formed in this order on a p-type silicon substrate 4071.

Both the first microparticles (silicon microparticles 4075) and the second microparticles (tungsten microparticles 4074) are dispersed in the $SiO_2$ layer as the barrier layer, but the diameters of these microparticles are different. The diameter of the second microparticles is 2.6 nm or more, which is 1.8 times or more as large as the diameter of the first microparticles that is substantially about 0.5 nm or less.

The microparticle dispersed layer 4073 can be formed by depositing a $SiO_x$ layer (1.5<x<2) by CVD, growing the silicon microparticles 4075 under heat treatment at about 1100° C., and then introducing the tungsten atoms 4074 into the resultant layer by ion implantation.

In this embodiment, tungsten atoms 4074 introduced into the insulator are used as the second microparticles. Alternatively, any semiconductor particles or metal atoms introduced by ion implantation, or other semiconductor microparticles or metal microparticles introduced by other methods may be used.

In this embodiment, as in EMBODIMENT 24, inter-microparticle charge transfer and charge holding in microparticles are possible. The first microparticles in this embodiment perform either one or both of the functions of the first and third microparticles in EMBODIMENT 24. For example, when a positive voltage is applied to the upper electrode during writing, an electron is released from a first microparticle located comparatively closer to the substrate to be injected into and accumulated in a first microparticle located closer to the upper electrode by charge transfer via some second microparticles. In the microparticle dispersed layer, the first microparticles and the second microparticles are in various positional relationship. Charge release and accumulation selectively occur between the microparticles between which charge transfer is easier. Occasionally, an electron once accumulated in a first microparticle is released therefrom to be further transferred to a first microparticle located closer to the upper electrode.

As described above, in this embodiment, charge transfer occurs in a self-selection manner starting from microparticles between which charge transfer is easier without the necessity of control of the positional relationship between the first and second microparticles. The final distribution is such that positive charges exists more in the first microparticles closer to the substrate while negative charges exists more in the microparticles closer to the upper electrode. When the write voltage is removed, this charge distribution is somewhat reduced but mostly held for a prolonged period.

It is also possible to record information in the following manner. A high voltage is in advance applied to the upper electrode, to allow a predetermined amount of redundant charge (e.g., electrons) to be injected into the microparticle dispersed layer externally and accumulated therein. The distribution of the redundant charge is changed by applying an external voltage, to effect information recording.

Thus, in this embodiment, also, electron injection into, holding in, and release from the microparticles can be controlled efficiently based on the principle as described in EMBODIMENT 24. In addition, in EMBODIMENT 24, control of the thickness of the microparticle dispersed layer is required to obtain suitable device operation speed and recording holding duration. In this embodiment, however, charge transfer selectively starts from microparticles between which charge transfer is easier. This widens the allowable thickness range of the microparticle dispersed layer, and thus facilitates the device fabrication.

In this embodiment, the first microparticles and the second microparticles are clearly distinguished from each other. Alternatively, microparticles made of the same material having a wide range of particle diameters may be formed to provide a continuous particle diameter distribution, where those having a large diameter function as the first particles and those having a small diameter function as the second particles. Although the first and second microparticles are not clearly distinguished in this alternative case, injected charge tends to be selectively held in the large-diameter microparticles having a large capacitance. As a result, the microparticles selected by the charge function as the first microparticles. For retaining the charge distribution, the particle diameter distribution is required to range at least from 0.7 times to 1.6 times the intermediate diameter of the microparticles. For prolonged charge holding, a particle diameter distribution ranging at least from 0.4 times to 1.6 times is desired.

A semiconductor memory device having a construction similar to that of EMBODIMENT 25 can be fabricated using the structure of the semiconductor device of this embodiment.

Figure 48:
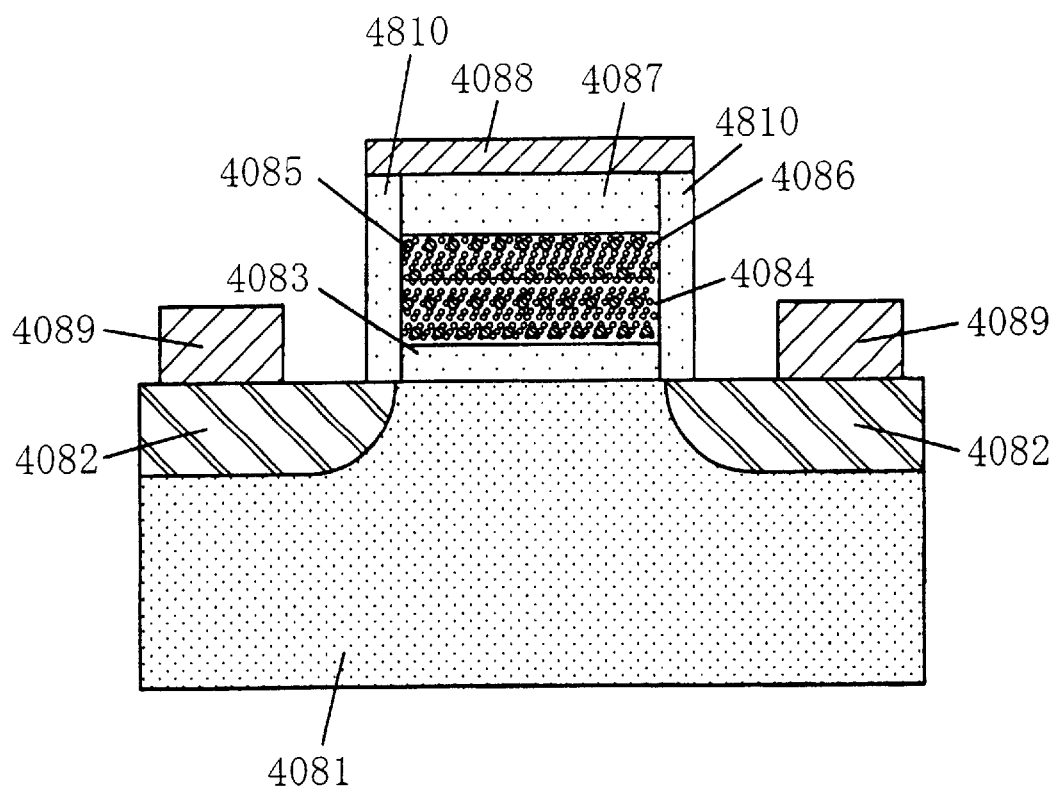
FIG. 48 is a cross-sectional view of a semiconductor memory device fabricated from the semiconductor device of EMBODIMENT 27.

FIG. 48 is a cross-sectional view of a semiconductor memory device formed using the semiconductor device of this embodiment. The semiconductor memory device includes: a p-type silicon substrate 4081 as the semiconductor substrate; n-type conductive regions 4082 functioning as the source/drain regions; a $SiO_2$ film 4083; a $SiO_2$ film 4083 as the first insulating layer; a microparticle dispersed layer 4084 having a thickness of about 5 nm where silicon microparticles 4086 as the first microparticles and ion-implanted tungsten atoms 4086 as the second microparticles are dispersed in a $SiO_2$ layer as the barrier layer; a $SiO_2$ film 4087; and an n-type polysilicon electrode 4088. $SiO_2$ sidewalls 4810 are formed on the sides of the $SiO_2$ film 4083, the microparticle dispersed layer 4084, and the $SiO_2$ film 4087. Metal electrodes 4089 as the Source/drain electrodes are formed on the n-type conductive regions 4082, whereby a MIS transistor structure is formed as a whole.

With the above construction, the threshold voltage of the MIS transistor characteristic changes depending on whether or not charge is held in the second microparticles. The resultant device serves as a low-voltage, high-speed non-volatile semiconductor memory device allowing for prolonged recording.

In this embodiment, the insulating $SiO_2$ sidewalls 4810 are formed on the sides of the microparticle dispersed layer 4084. This ensures that accumulated charges will not be lost due to a neighboring short circuit. Also, in the case of holding initial charge in the microparticles, the charge is prevented from being released outside.

In the semiconductor memory device of this embodiment, a region where at least the microparticle dispersed layer does not exist is provided in at least a portion of the gate region located above or in contact with the source region and/or a portion thereof located above or in contact with the drain region. This prevents a current short-circuited via the microparticles from flowing when a voltage is applied from the source region to the drain region.

Embodiment 28

Figure 49:
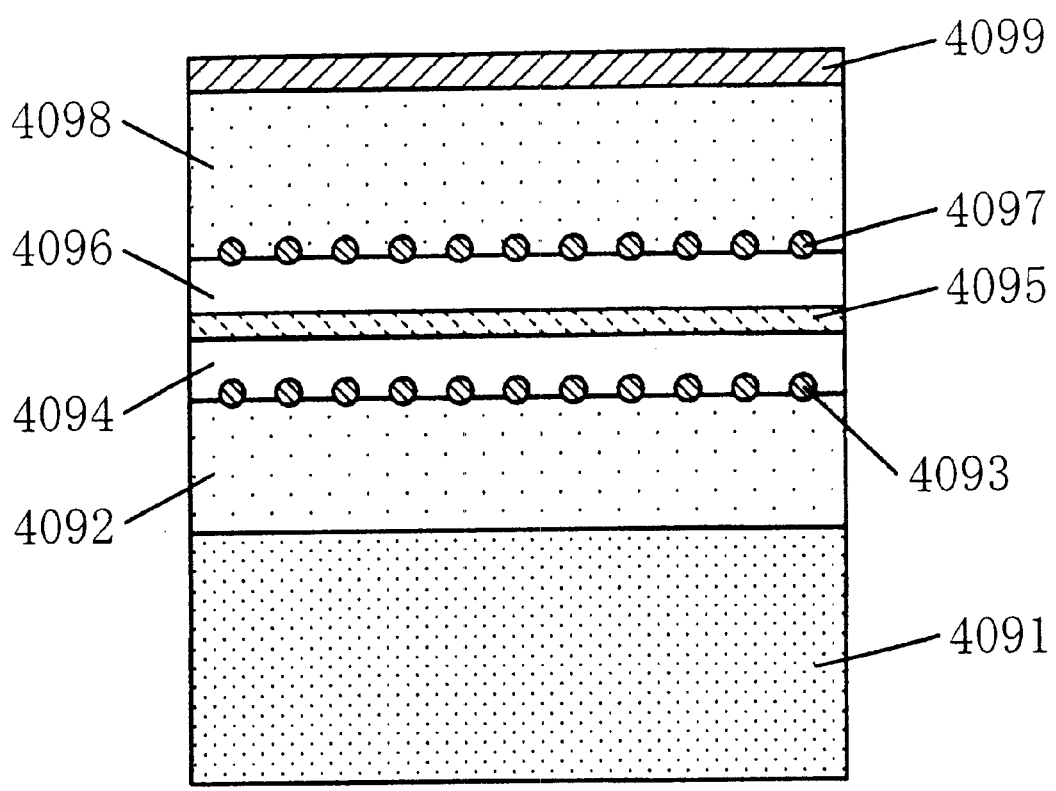
FIG. 49 is a cross-sectional view of a semiconductor device of EMBODIMENT 28 of the present invention.

FIG. 49 is a cross-sectional view of a semiconductor device of EMBODIMENT 28 of the present invention. The semiconductor device of this embodiment includes: a $SiO_2$ film 4092 having a thickness of 5 nm as the first insulating layer; silicon microparticles 4093 having a diameter of 3 nm as the first microparticles: a $SiO_2$ film 4094 having a thickness of about 1.8 nm as the first $SiO_2$ layer; a $Si_3N_4$ layer 4095 having a thickness of about 8 nm as the $SiO_xN_y$ layer ($0 \leq x < 2$, $0 < y \leq 4/3$); a $SiO_2$ film 4096 having a thickness of about 1.8 nm as the second $SiO_2$ layer; silicon microparticles 4097 having a diameter of 3 nm as the second microparticles; a $SiO_2$ film 4098 having a thickness of 12 nm as the second insulating layer; and at the top an n-type polysilicon electrode 4099 as the electrode layer. These are formed in this order on a p-type silicon substrate 4091.

The silicon microparticles as the first and second microparticles are formed by CVD and have a surface density of $1 \times 10^{10}$ $cm^{-2}$ to $1 \times 10^{12}$ $cm^{-2}$.

Unlike EMBODIMENT 24, this embodiment does not include two types of microparticles having different diameters. Instead, the semiconductor device of this embodiment includes the $SiO_xN_y$ layer ($0 \leq x < 2$, $0 < y \leq 4/3$) sandwiched by the first and second $SiO_2$ layers. This construction generates charge-exchangeable levels (interface states) in the vicinity of the interfaces between the $SiO_xN_y$ layer and the $SiO_2$ layers and inside the $SiO_xN_y$ layer. The inter-level energy distance at the interface states, as well as the potential rise at the interface states on receipt of charge, are so large that the interface states can provide virtually the same function as the small-diameter microparticles.

In other words, in this embodiment, the interface states between the $SiO_xN_y$ layer and the $SiO_2$ layers have a function equal to those of the second microparticles in EMBODIMENT 24. This enables the first and second microparticles (silicon microparticles 4093 and 4097) in this embodiment to stably hold charge therein. Therefore, in this embodiment, also, efficient control of electron injection into, holding in, and release from the microparticles is possible based on the principle described in EMBODIMENT 24.

In EMBODIMENT 24 above, it is required to form the second microparticles on the first barrier layer as a fine structure. However, in this embodiment utilizing the $SiO_xN_y$ layer, control of a fine structure is not required. This advantageously facilitates fabrication of the semiconductor device and enhances the reproducibility of the device characteristics. The $SiO_xN_y$ layer with high quality can be easily formed by CVD.

In this embodiment, the $Si_3N_4$ layer as a $SiO_xN_y$ layer ($0 \leq x < 2$, $0 < y \leq 4/3$) is used. Alternatively, a silicon oxide nitride film having a composition represented by general formula, $SiO_xN_y$ ($0 < x < 2$, $0 < y < 4/3$) may be used.

A semiconductor memory device having a construction similar to that of EMBODIMENT 25 can be fabricated using the structure of the semiconductor device of this embodiment.

Figure 50:
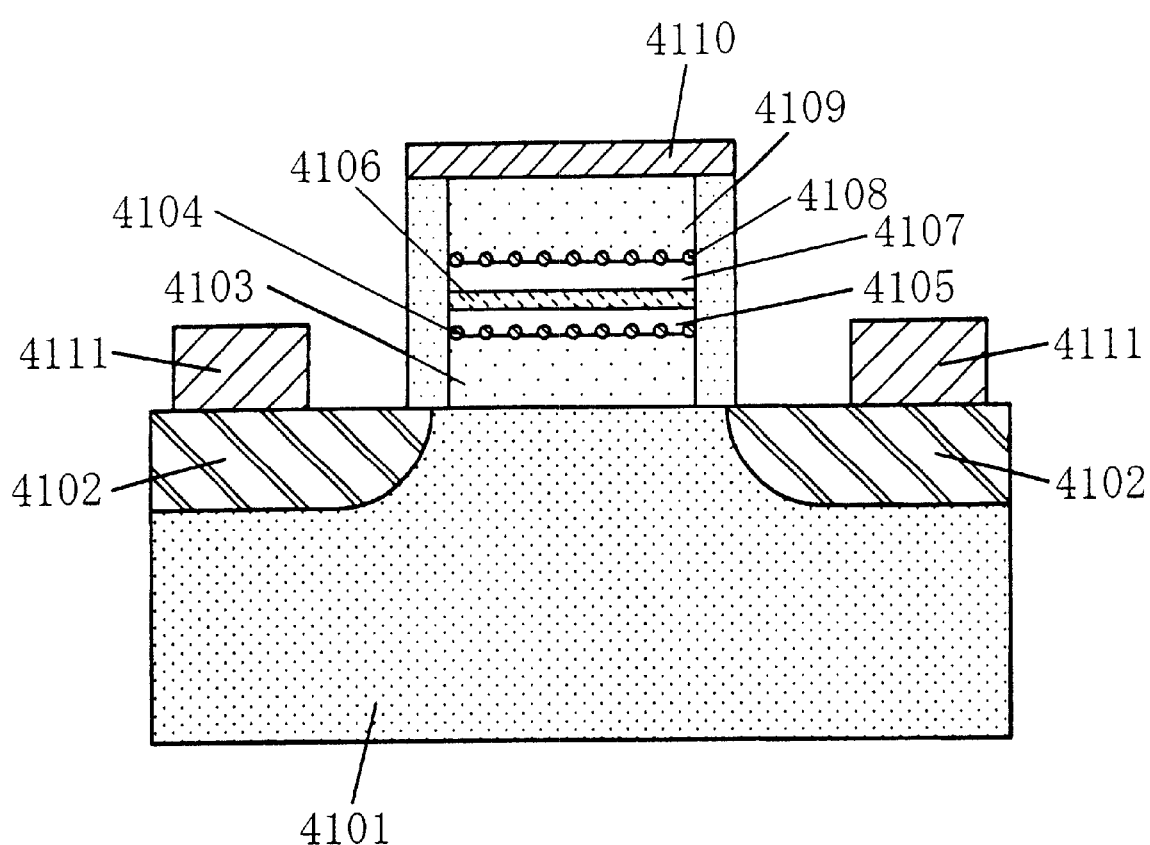
FIG. 50 is a cross-sectional view of a semiconductor memory device fabricated from the semiconductor device of EMBODIMENT 28.

FIG. 50 is a cross-sectional view of a semiconductor memory device formed using the semiconductor device of this embodiment. The semiconductor memory device includes: a p-type silicon substrate 4101 as the semiconductor substrate; n-type conductive regions 4102 as the source/drain regions; a $SiO_2$ film 4103 as the first insulating layer; silicon microparticles 4104 as the first microparticles; a $SiO_2$ film 4105 as the first $SiO_2$ layer; a $Si_3N_4$ layer 4106 as the $SiO_xN_y$ layer ($0 \leq x < 2$, $0 < y \leq 4/3$); a $SiO_2$ film 4107 as the second $SiO_2$ layer; silicon microparticles 4108 as the second microparticles; a $SiO_2$ film 4109 as the second insulating layer; and an n-type polysilicon electrode 4110 as the electrode layer. $SiO_2$ sidewalls are formed on the sides of the $SiO_2$ film 4103, the silicon microparticles 4104, the $SiO_2$ film 4105, the $Si_3N_4$ layer 4106, the second $SiO_2$ layer 4107, the silicon microparticles 4108, and the $SiO_2$ film 4109. Metal electrodes 4111 as the Source/drain electrodes are formed on the n-type conductive regions 4102, whereby a MIS transistor structure is formed as a whole.

With the above construction, the threshold voltage of the MIS transistor characteristic changes depending on the charge distribution in the first and second microparticles. The resultant device serves as a high-speed, reliable non-volatile semiconductor memory device.

In the semiconductor memory device of this embodiment, a region where at least the microparticle dispersion layer and the microparticles do not exist is provided in at least a portion of the gate region located above or in contact with the source region and/or a portion thereof located above or in contact with the drain region. This prevents a current short-circuited via the microparticles from flowing when a voltage is applied from the source region to the drain region.

In this embodiment, the microparticle region is surrounded by the insulator. This ensures that accumulated charges will not be lost due to a neighboring short circuit. Also, in the case of holding initial charge in the microparticles, the charge is prevented from being released outside.

Thus, the semiconductor device of this embodiment can provide a reliable charge injection, holding, and release means that can be fabricated easily and realize long-term charge holding compared with the conventional devices.

In EMBODIMENTS 24 to 28 above, the p-type silicon substrate was used as the semiconductor substrate. Alternatively, an n-type silicon substrate, or a substrate made of GaAs or any other semiconductor material may be used.

In EMBODIMENTS 24 to 28, $SiO_2$ was used as the material for the insulating layers. Alternatively, other insulating materials such as $Si_3N_4$, $Si_xO_yN_z$ ($4x=2y+3z$), $CeO_2$, ZnS, ZnO, and $Al_2O_3$ may be used as described above.

In EMBODIMENTS 24 to 28, silicon microparticles, gold microparticles, tungsten atoms, and the like were used. Alternatively, other semiconductor and metal materials may be used as the microparticles.

Embodiment 29

Figure 51:
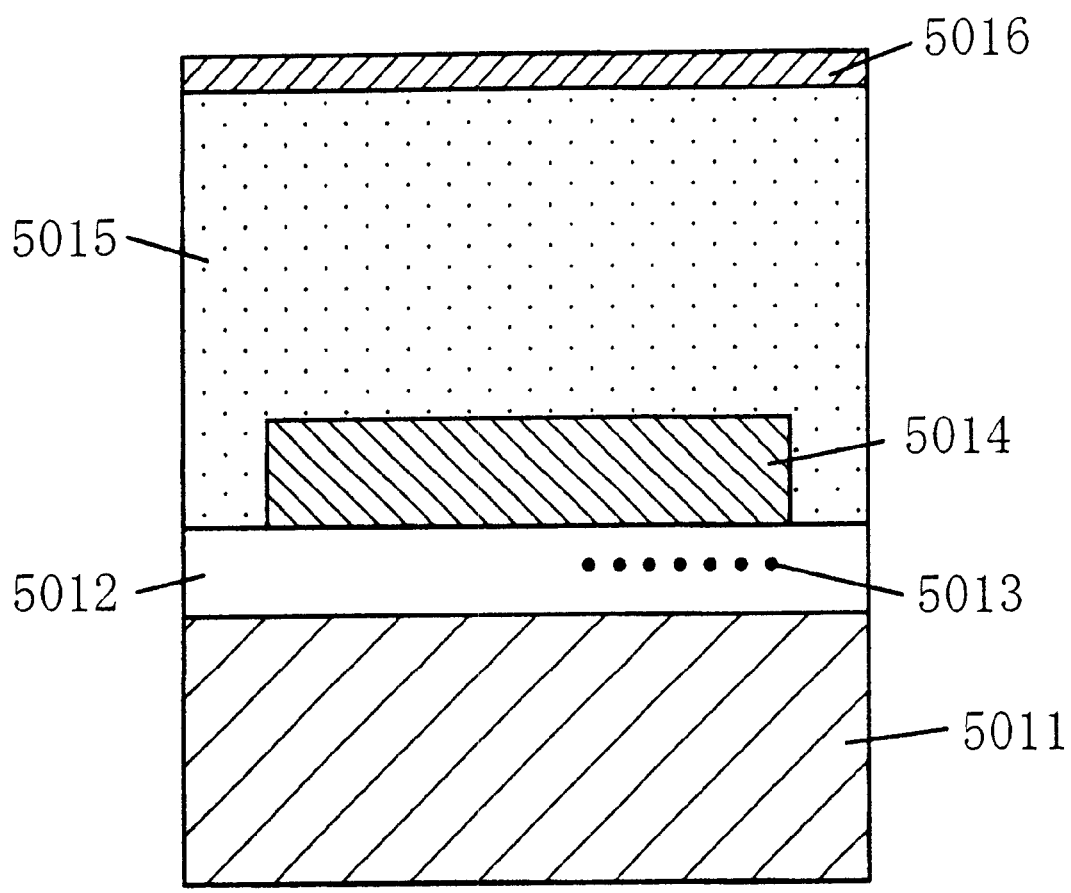
FIG. 51 is a cross-sectional view of a semiconductor device of EMBODIMENT 29 of the present invention.

FIG. 51 is a cross-sectional view of a semiconductor device of EMBODIMENT 29 of the present invention. The semiconductor device of this embodiment includes: a $SiO_2$ film 5012 having a thickness of about 4 nm as the barrier layer functioning as a barrier for charge transfer; a metal tungsten layer 5014 having a thickness of 9 nm as the charge holder; a $SiO_2$ film 5015 having a thickness of 10 nm as the insulating layer covering the charge holder; and at the top an n-type polysilicon electrode 5016 as the electrode layer. These layers are formed in this order on a p-type silicon layer 5011 as the semiconductor layer, which is formed on a substrate. In addition, silicon microparticles 5013 having a diameter of 2 nm are formed in the barrier layer between the semiconductor layer and the charge holder by CVD at a surface density of about $1\times10^{11}$ cm$^{-2}$ to $1\times10^{13}$ cm$^{-2}$. In this embodiment, the microparticles are formed only in a limited region of the barrier layer.

The function of the above structure of this embodiment will be described in comparison with the conventional semiconductor device.

Figure 52:
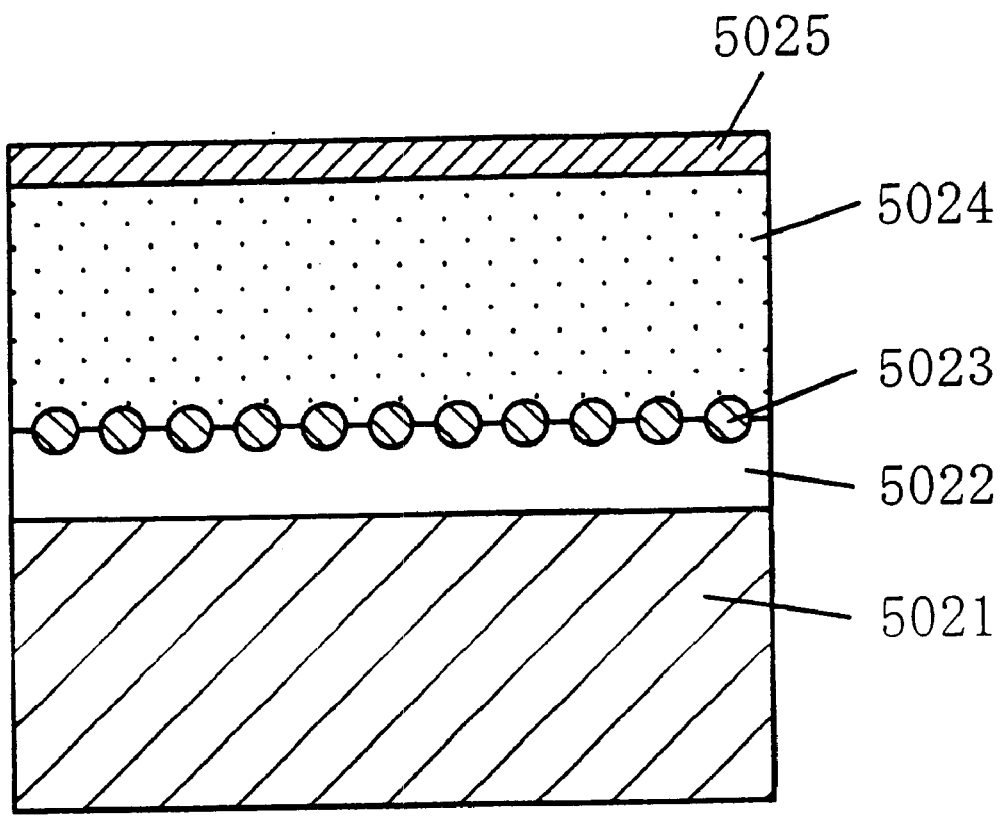
FIG. 52 is a cross-sectional view of a conventional semiconductor device using a plurality of silicon microparticles disclosed in prior art literature.

FIG. 52 is a cross-sectional view of the conventional semiconductor device using a plurality of silicon microparticles. The semiconductor device includes a tunnel oxide film 5022 made of a SiO$_2$ film, a SiO$_2$ film 5024, and an n-type silicon electrode 5025 formed in this order on a p-type silicon substrate 5021. Silicon microparticles 5023 are buried between the tunnel oxide film 5022 and the SiO$_2$ film 5024.

In the above conventional semiconductor device, by applying a positive voltage to the n-type polysilicon electrode 5025, electrons can be injected into the silicon microparticles 5023 via the tunnel oxide film 5022, and by applying a negative voltage to the n-type polysilicon electrode 5025, electrons in the silicon microparticles 5023 can be released. The threshold voltage of the semiconductor device changes depending on whether or not electrons exist in the silicon microparticles 5023. The levels (high or low) of the threshold voltage are associated with information H (high) and information L (low), respectively, to effect information writing/reading.

With the above conventional semiconductor device, it is difficult to obtain a practical semiconductor memory device that realizes high-speed charge injection and release and ensures long-term charge holding. More specifically, in this type of semiconductor device, the write/erase speeds and the charge holding characteristics are governed by the probability of tunnel transition between the microparticles and the semiconductor substrate via the barrier layer. In order to realize a high-speed and long-life device, therefore, it is necessary to sufficiently increase the ratio of the tunnel current during writing/erasing (write/erase currents) to the tunnel current during charge holding (leak current).

The conventional semiconductor device shown in FIG. 52 utilizes the tunnel phenomenon occurring within the same system, that is, the microparticles, the tunnel barrier, and the semiconductor substrate, for all of charge injection, holding, and release. The only differences are the number of charges in the microparticles and the potential at the microparticles with respect to the semiconductor substrate. Therefore, it is not easy to largely change the tunnel current within this system by applying a low external voltage (upper electrode voltage). For example, if the height and thickness of the tunnel barrier are increased in an attempt to suppress a leak current, write/erase currents are also reduced resulting in lowering the write/erase speeds.

The potential at the microparticles during writing (or erasing) is determined by the position of the microparticles in the device structure. If the position of the microparticles is made closer to the upper electrode (n-type polysilicon electrode 5025 in FIG. 52), potential rise at the microparticles during writing increases, which theoretically increases the write current. However, if the microparticles are too closer to the upper electrode, the gate voltage shift during reading becomes small whereby sensitivity lowers excessively.

Potential rise at the microparticles during charge holding can be suppressed by increasing the capacitance of the microparticles. This is therefore effective in suppressing the leak current. In reality, however, if the diameter of the microparticles is increased, or the distance between the microparticles and the semiconductor substrate is reduced for increasing the capacitance of the microparticles, the probability of tunnel transition between the microparticles and the semiconductor substrate increases, resulting in unintentionally increasing leak current. Theoretically, if both the diameter of the microparticles and the thickness of the tunnel barrier are increased simultaneously, the leak current alone may possibly be suppressed to some extent. However, if the size of the microparticles is too large, the surface density of the microparticles becomes too low to hold the amount of charge required to maintain the sensitivity of the device. If the barrier thickness is too large, the resultant construction is similar to a flash EEPROM, where a large voltage is applied to the barrier film. This may cause film degradation due to charge transfer. During fabrication, also, in order to obtain a long-life device, high precision is required in the control of the size and distribution of the microparticles and the thickness of the barrier.

It is therefore difficult for the conventional semiconductor device to realize high-speed write/erase operations and long-life recording. According to the present invention, however, leak current during charge holding can be greatly reduced without lowering the write/erase speeds.

Specific charge injection and holding operations of the device of this embodiment are as follows. In the write process during charge injection, a write voltage is applied externally to the upper electrode (n-type polysilicon electrode 5016), so that charge is released from the semiconductor substrate and transferred to the microparticles (silicon microparticles 5013) via a tunnel current through the barrier layer (SiO$_2$ film 5012). The potential at the microparticles and the relationship between the microparticles and the semiconductor substrate in this process are substantially the same as those in the conventional write process. Therefore, the charge transfer speed is substantially the same.

In this embodiment, the charge in the microparticles is further transferred to the charge holder (metal tungsten layer 5015) via the barrier layer. The tunnel transition between the microparticles and the charge holder is under substantially the same conditions as the tunnel transition between the microparticles and the semiconductor surface. Therefore, if the potential difference is the same, the charge transfer speed from the microparticles to the charge holder will be substantially the same as that from the semiconductor surface to the microparticles. In this embodiment, however, the potential at the microparticles having charge has risen ($\Delta V = \Delta q / C_{dot}$; q denotes the charge elementary quantity and $C_{dot}$ denotes the capacitance of the silicon microparticles 5013). Therefore, an electric field has been generated between the microparticles having charge and the charge holder having no charge due to this potential rise at the microparticles, in addition to the external write voltage. Since the effect of the potential rise due to charge injection is great for the microparticles having a small capacitance, the charge transfer from the microparticles to the charge holder is further accelerated. Thus, although the tunneling is required twice during the write process in this embodiment, the charge transfer from the microparticles to the charge holder is done at a speed equal to or higher than the charge transfer from the semiconductor substrate to the microparticles. The entire charge transfer speed, i.e., the write speed is therefore substantially the same as that of the conventional device. It would be understood that the above description on the write process is also applicable to the erase process where a negative voltage is applied to release accumulated charges from the microparticles.

Once the application of the write voltage to the upper electrode is discontinued to terminate the write operation, the microparticles and the charge holder are stabilized at respective potentials corresponding to the respective charges and capacitances. Some of the microparticles may have redundant charge. However, such redundant charge swiftly returns to the semiconductor substrate because the microparticles are located close to the semiconductor substrate and the capacitance of the microparticles is small providing a large potential rise per charge. As for the charge holder, since the capacitance is large, the potential rise is kept small. While the state density of the charge holder is high, the state density of the adjacent microparticles is low. Therefore, the charge transfer probability from the charge holder with a small potential rise to the microparticles is low. In addition, during charge transfer, the microparticles consume energy corresponding to a half of potential rise ($\Delta V/2$). If the microparticles are sufficiently small, therefore, transition of charges having an energy level lower than this value is suppressed. As a result, charges accumulated in the charge holder can be held therein for a prolonged period.

It has been described that substantially the same write and erase speeds as those of the conventional device are obtained in this embodiment. Moreover, higher write and erase speeds, as well as lower write and erase voltages, can be obtained in this embodiment by thinning the barrier layer. The barrier layer can be thinned because in this embodiment leak current is suppressed and thus charge holding is stabilized.

Accumulated electrons can further be stabilized if the electron affinity of the microparticles is smaller than that. of the charge holder.

Figure 27A:
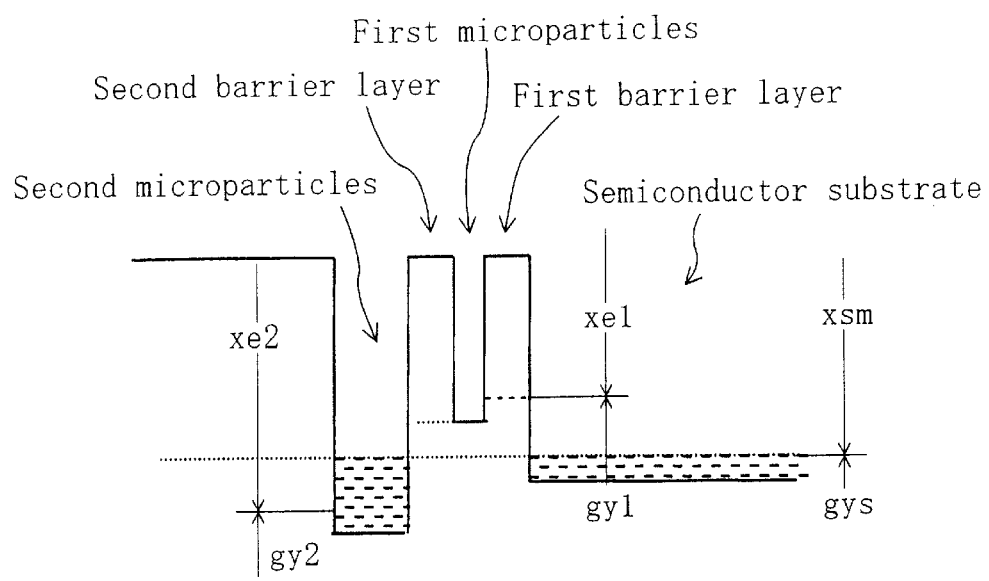
FIGS. 27(a), 27(b), and 27(c) are schematic band diagrams used to describe a preferable relationship between the voltage level and the charge transfer characteristic between a semiconductor substrate and second microparticles.
Figure 27B:
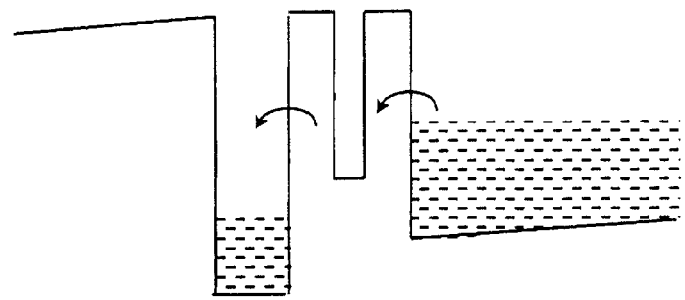
Figure 27C:
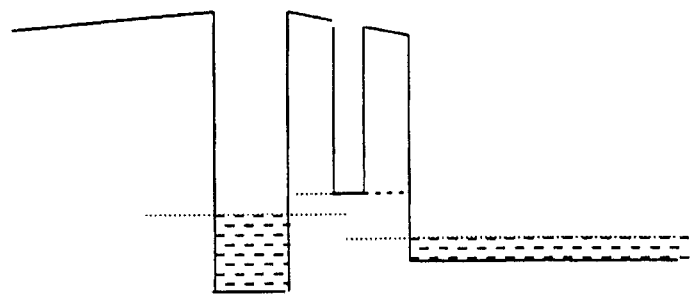

The band states at the conduction band edges of the semiconductor substrate, the first barrier layer, the first microparticles, the second barrier layer, and the second microparticles are as shown in FIGS. 27(a) to 27(c), which illustrate the state of the microparticles having no charge, the electron injecting state, and the charge holding state, respectively.

The Fermi level of the second microparticles in the charge holding state (see FIG. 27(c)) rises compared with that in the non-charge state (see FIG. 27(a)), but is lower in potential than the energy level at the conduction band edge of the microparticles. As a result, charge can be held stably for a prolonged period. When electrons are used as the charge, the electron affinity of the second microparticles is larger than that of the first microparticles. When holes are used as the charge, the sum of the forbidden bandwidth and the electron affinity of the second microparticles is smaller than that of the second microparticles. For the respective reasons, charge is stably held in the second microparticles. Likewise, when electrons are used as the charge, the electron affinity of the microparticles is smaller than that of the semiconductor substrate. When holes are used as the charge, the sum of the forbidden bandwidth and the electron affinity of the microparticles is larger than that of the semiconductor substrate. For the respective reasons, charge is stably held in the second microparticles.

Charge holding can also be stabilized by the quantum effect if the states of the microparticles are quantized and the energy distance between the quantum levels is large compared with the thermal energy at room temperature and the potential rise at the charge holder.

Figure 53A:
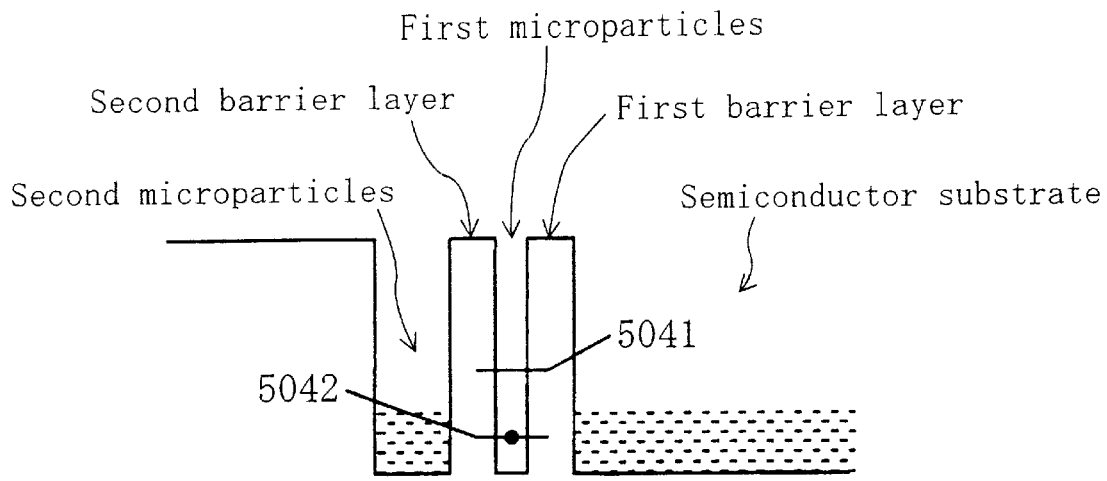
FIGS. 53(a), 53(b), and 53(c) are schematic band diagrams near the conduction band edge in the case of using electrons as injection charge.
Figure 53B:
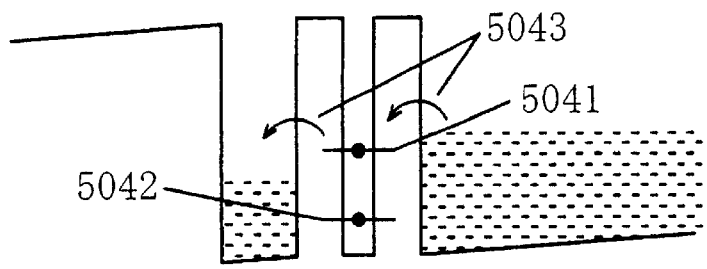
Figure 53C:
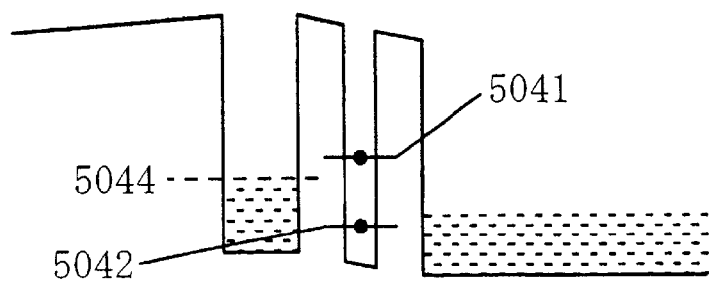

FIGS. 53(a) to 53(c) schematically illustrate the band structures in the vicinity of the conduction band edges when electrons are used as charge. Referring to FIG. 53(a), assume that, in the state of the first microparticles having no charge, the microparticles are quantized, the ground level 5042 is occupied by an electron, the first excited level 5041 is vacant, and the energy distance between the two levels is sufficiently larger than the thermal energy. Referring to FIG. 53(b), when an electric field for writing is applied externally, electrons are injected into the charge holder through tunneling 5043 from the semiconductor substrate via the first excited level 5041. Referring to FIG. 53(c), once the external electric field is removed, the Fermi level 5044 of the charge holder is lower than the first excited level 5041 when the particle diameter of the charge holder is large. If the difference between these levels is smaller than the thermal energy, the charge will not be easily released, resulting in the charge being held stably in the charge holder. It would be understood that substantially the same effect is obtained when holes are used as the injection charge.

As described above, in this embodiment, the charge holder is provided independently of the microparticles for controlling charge transfer. This provides a reliable charge injection, holding, and release means that realizes high-speed writing/erasing and long-term charge holding compared with the conventional devices.

Embodiment 30

Figure 54:
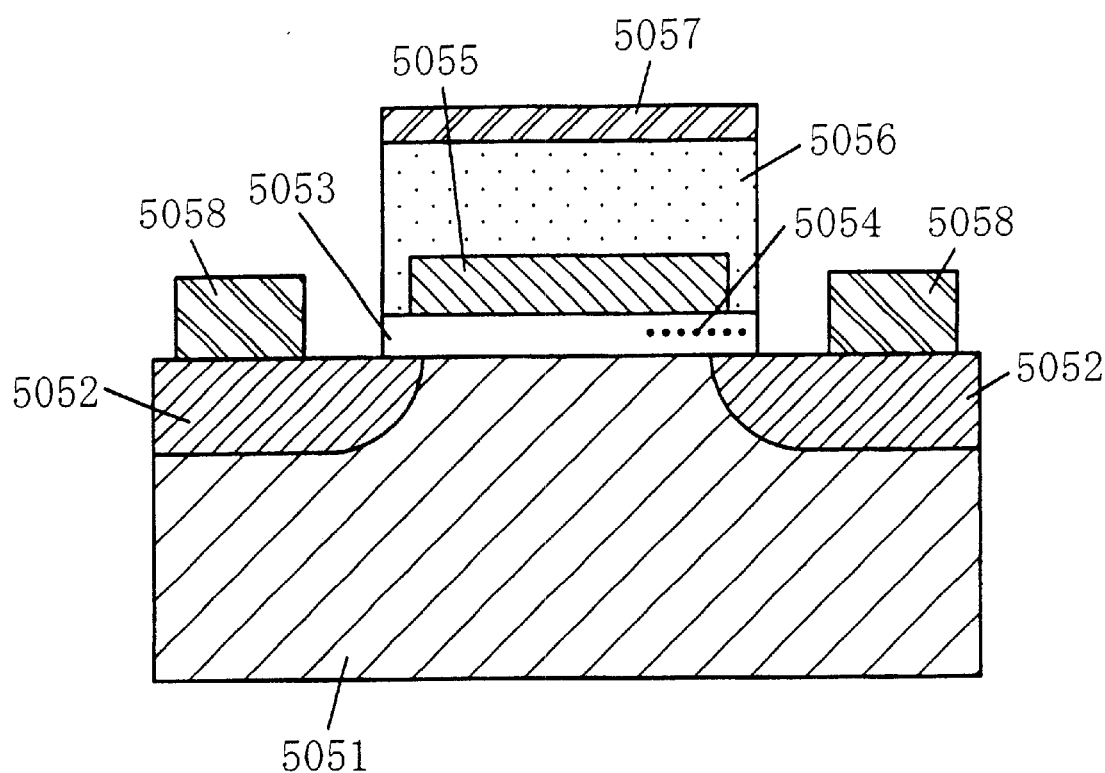
FIG. 54 is a cross-sectional view of a semiconductor memory device of EMBODIMENT 30 of the present invention.

FIG. 54 is a cross-sectional view of a semiconductor memory device of this embodiment. N-type conductive regions 5052 functioning as the source/drain regions are formed in a p-type silicon layer 5051 as the semiconductor layer, which constitute a MIS transistor structure together with metal electrodes 5058 as the source/drain electrodes, a $SiO_2$ gate insulating layer 5056, and an n-type polysilicon electrode 5057 as the gate electrode formed on the p-type silicon layer 5051.

Between the gate insulating layer 5056 and the p-type silicon layer 5051 of the MIS transistor structure, formed are a $SiO_2$ film 5053 having a thickness of 3.5 nm as the barrier layer functioning as a barrier for charge transfer, and a metal iron layer 5055 having a thickness of 8 nm as the charge holder.

Silicon microparticles 5054 having a diameter of 1 nm are formed inside the barrier layer between the semiconductor layer and the charge holder. The silicon microparticles 5054 are formed by CVD at a surface density of about $1\times10^{11}$ $cm^{-2}$ to $1\times10^{13}$ $cm^{-2}$. The formation of the microparticles is limited to the portion of the barrier layer above and in contact with the source region of the MIS transistor.

In this embodiment, also, electron injection into, holding in, and release from the charge holder can be controlled based on the principle described in EMBODIMENT 29. In addition, since the structure for holding charge is formed in the gate region of the MIS transistor, the threshold voltage of the MIS transistor characteristic changes depending on whether or not charge is held in the charge holder. The resultant device serves as a low-voltage, high-speed non-volatile semiconductor memory device allowing for long-term recording. Further, since the single device can realize basic memory operation, high-density integration is possible.

In this embodiment, formation of the microparticles is limited to the portion above and in contact with the source region of the MIS transistor. With this construction, even if the potentials at the drain region and the channel region vary during read operation of the device, charge transfer between the charge holder and the microparticles due to the read operation can be suppressed as long as the potential at the source region is fixed. During the write/erase operations of the device, charge injection and release can be controlled by generating a larger potential difference between the source electrode and the gate electrode than that during the read operation.

Depending on the circuit method for driving the semiconductor device, more suitable charge control may be accomplished by, for example, limiting formation of the microparticles to the portion above and in contact with the drain region of the MIS transistor, or to the portion in contact with the channel region of the MIS transistor.

Alternatively, formation of the microparticles may not be limited to a specific portion, but the microparticles may be formed over the entire region between the semiconductor layer and the charge holder. This simplifies the device fabrication process.

As described above, this embodiment provides a reliable charge injection, holding, and release means that is fabricated easily and realizes long-term charge holding compared with the conventional devices.

Embodiment 31

Figure 55:
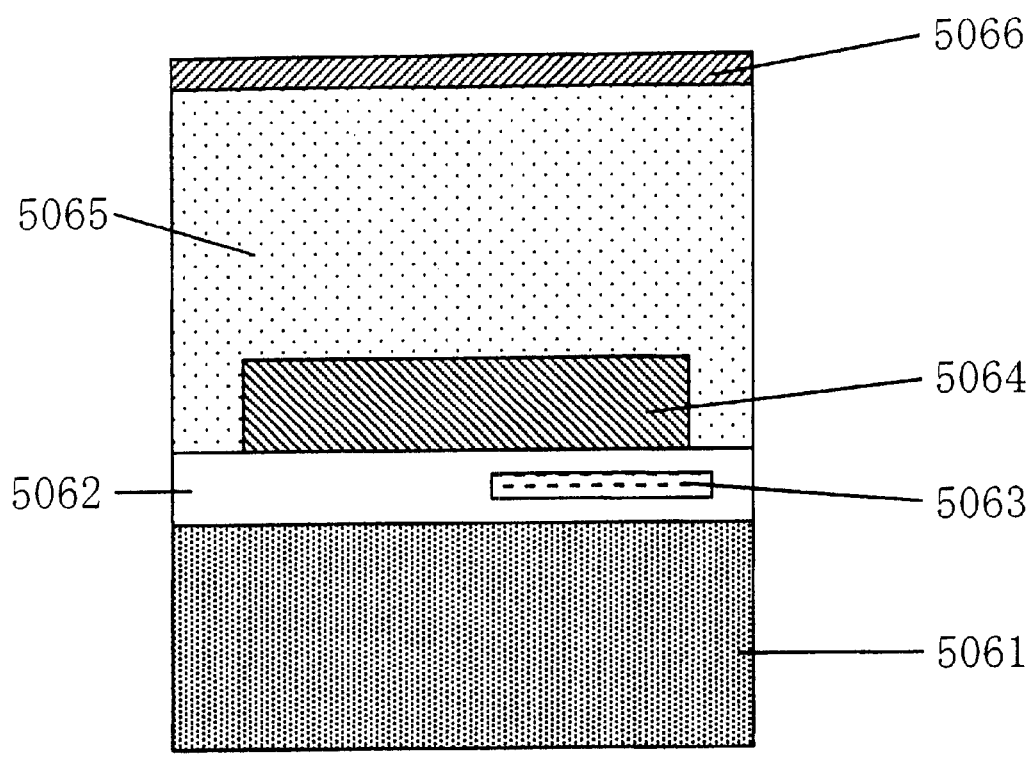
FIG. 55 is a cross-sectional view of a semiconductor device of EMBODIMENT 31 of the present invention.

FIG. 55 is a cross-sectional view of a semiconductor device of EMBODIMENT 31 of the present invention. The semiconductor device of this embodiment includes: a $SiO_2$ film 5062 having a thickness of about 4 nm as the barrier layer functioning as a barrier for charge transfer; a metal tungsten layer 5064 having a thickness of 9 nm as the charge holder: a $SiO_2$ film 5065 having a thickness of 10 nm as the insulating layer covering the charge holder; and at the top an n-type polysilicon electrode 5066 as the electrode layer. These layers are formed in this order on a p-type silicon layer 5061 as the semiconductor layer, which is formed on a substrate. In addition, a $SiO_xN_y$ layer 5063 ($0 \leq x < 2$, $0 < y \leq 4/3$) ($Si_3N_4$ film or SiON film) is formed between the semiconductor layer and the charge holder, in place of the microparticles in EMBODIMENT 29. In this embodiment, the $SiO_xN_y$ layer 5063 is formed by CVD easily in a limited region between the semiconductor layer and the charge holder.

In this embodiment, the interface states formed between the $SiO_xN_y$ layer 5063 and the $SiO_2$ layer 5065 and inside the $SiO_xN_y$ layer 5063 have the same charge exchange function as the microparticles in EMBODIMENT 29. Therefore, substantially the same effect as that in EMBODIMENT 29 is obtained.

The $SiO_xN_y$ layer 5063 can be easily formed by CVD compared with the formation of the silicon microparticles. This facilitates the fabrication of the device.

A semiconductor memory device having a construction similar to that of EMBODIMENT 29 can be fabricated using the structure of the semiconductor device of this embodiment.

Figure 56:
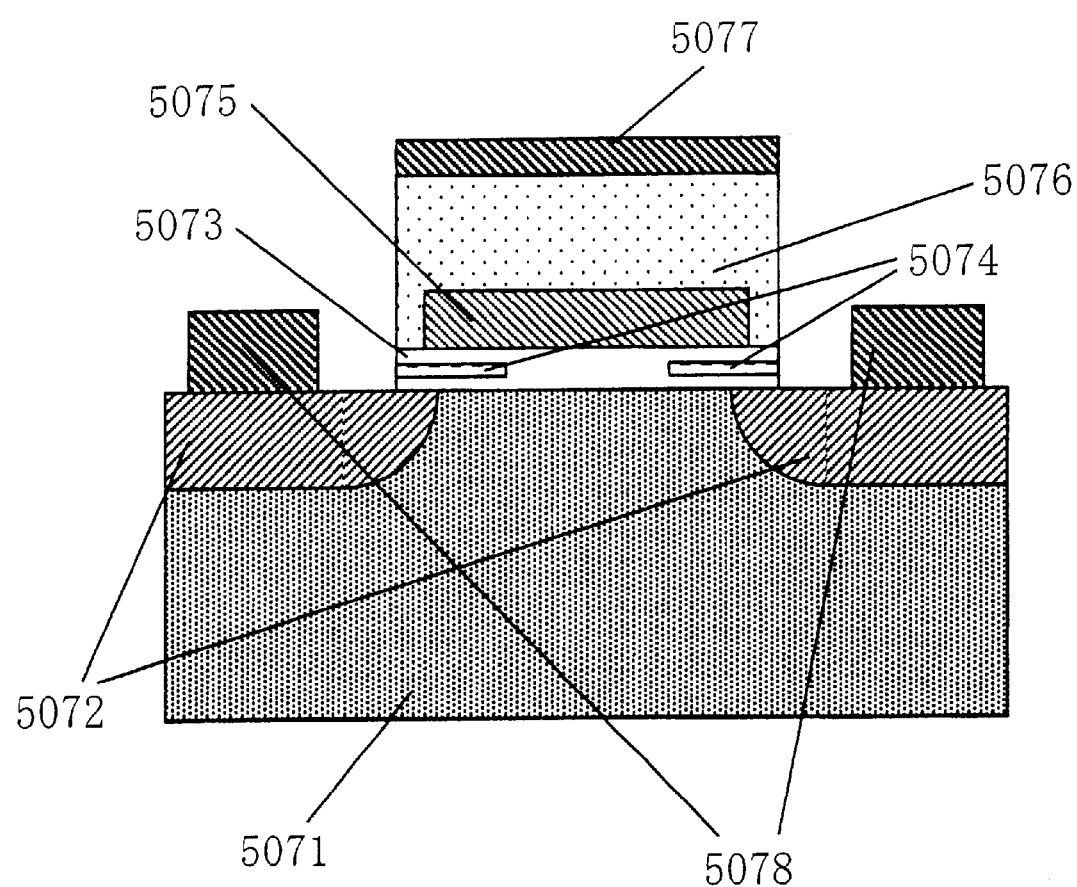
FIG. 56 is a cross-sectional view of a semiconductor memory device fabricated from the semiconductor device of EMBODIMENT 31.

FIG. 56 is a cross-sectional view of a semiconductor memory device formed using the semiconductor device of this embodiment. The semiconductor memory device includes: a p-type silicon substrate 5071 as the semiconductor substrate; n-type conductive regions 5072 functioning as the source/drain regions; a $SiO_2$ film 5073 as the insulating film; $SiO_xN_y$ layers 5074 ($0 \leq x < 2$, $0 < y \leq 4/3$); a metal tungsten layer 5075 as the charge holder; a $SiO_2$ film 5076, and an n-type polysilicon electrode 5077. Metal electrodes 5078 as the source/drain electrodes are formed on the n-type conductive regions 5072, thereby forming a MIS transistor structure as a whole.

The resultant device serves as a low-voltage, high-speed nonvolatile semiconductor memory device allowing for long-term recording. Further, since the single device can realize basic memory operation, high-density integration is possible.

In EMBODIMENTS 29 to 31 above, either electrons or holes can be used as the charge to be injected into and accumulated in the microparticles.

In EMBODIMENTS 29 to 31, the p-type silicon layer was used as the semiconductor layer. Alternatively, layers made of other semiconductor materials, such as an n-type silicon layer, a polysilicon thin film, and a GaAs layer, may be used.

In EMBODIMENTS 29 to 31, silicon microparticles were used. Alternatively, other semiconductor and metal materials may be used as the microparticles.

In EMBODIMENTS 29 to 31, tungsten and iron were used as the charge holder. Substantially the same effect can be obtained by using other metal and semiconductor materials.

In EMBODIMENTS 29 to 31, only one layer of microparticles is formed in the barrier layer between the charge holder and the semiconductor substrate. Alternatively, a plurality of layers of microparticles or a region with the microparticles dispersed therein may be formed.

In EMBODIMENTS 29 to 31, $SiO_2$ was used as the material for the insulating layers. Alternatively, other insulating materials such as $Si_3N_4$, $Si_xO_yN_z$ ($4x=2y+3z$), $CeO_2$, ZnS, ZnO, and $Al_2O_3$ may be used as described above.

In EMBODIMENTS 1 to 31, as the semiconductor substrate, an insulating substrate on which an epitaxial semiconductor layer is formed or a so-called SOI substrate where an insulating layer is buried in a semiconductor substrate may be used. By using these substrates, the effects described in the respective embodiments can be obtained.

In some of the above embodiments, the $SiO_2$ sidewalls were formed on the sides of the layer including microparticles. However, the sidewalls are not necessarily required. Other means can be adopted to prevent generation of leak current in the structure where the microparticles exist above either one or both of the source and drain regions.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor device comprising:
   a substrate having a conductive layer; and
   a charge holding region including a barrier layer formed directly on the conductive layer for functioning as a barrier for charge transfer and a plurality of particles dispersed in the barrier layer so that the particles have different distances from the conductive layer from each other,
   wherein the capacitance of the particles is larger as the distance from the conductive layer is smaller, and
   wherein the particles are dispersed-at a higher dispersion density as the distance from the conductive layer is smaller.

2. The semiconductor device of claim 1, wherein the plurality of particles are divided into a plurality of particle groups each composed of a plurality of particles common in distance from the conductive layer, and are deposited as a layer.

3. A semiconductor device comprising:
   a substrate having a conductive layer; and
   a charge holding region including a barrier layer formed on the conductive layer for functioning as a barrier for charge transfer and a plurality of particles dispersed in the barrier layer so that the particles have different distances from the conductive layer from each other, wherein the capacitance of the particles is larger as the distance from the conductive layer is smaller, and wherein the mean diameter of the particles is larger as the distance from the conductive layer is smaller.

4. The semiconductor device of claim 3, wherein the plurality of particles are divided into a plurality of particle groups each composed of a plurality of particles common in distance from the conductive layer, and are deposited as a layer.

5. A semiconductor device comprising:

a substrate having a conductive layer;

a first $SiO_2$ layer formed on the conductive layer;

a $SiO_xN_y$ layer ($0 \leq x < 2$, $0 < y \leq 4/3$) formed on the first $SiO_2$ layer;

a second $SiO_2$ layer formed on the $SiO_xN_y$ layer; and particles formed on the second $SiO_2$ layer.

6. The semiconductor device of claim 5, further comprising:

an insulating layer formed on the particles;

a gate electrode formed on the insulating layer; and source/drain regions formed in regions of the conductive layer located below both sides of the gate electrode, wherein the semiconductor device functions as a MIS transistor.

7. A semiconductor device comprising:

a substrate having a conductive layer;

an insulating layer formed on the conductive layer;

first particles formed on the insulating layer;

a first $SiO_2$ layer formed on the first particles;

a $SiO_xN_y$ layer ($0 \leq x < 2$, $0 < y \leq 4/3$) formed on the first $SiO_2$ layer;

a second $SiO_2$ layer formed on the $SiO_xN_y$ layer; and second particles formed on the second $SiO_2$ layer.

8. The semiconductor device of claim 7, further comprising:

a second insulating layer formed on the second particles;

a gate electrode formed on the second insulating layer; and source/drain regions formed in regions of the conductive layer located below both sides of the gate electrode, wherein the semiconductor device functions as a MIS transistor.

9. A semiconductor device comprising;

a substrate having a conductive layer;

a barrier layer formed directly on the conductive layer for functioning as a barrier for charge transfer;

a charge holder continuously formed on the barrier layer; and quantized particles buried in at least part of the barrier layer.

10. The semiconductor device of claim 9, further comprising:

an insulating layer formed on the particles;

a gate electrode formed on the insulating layer; and source/drain regions formed by introducing an impurity into regions of the conductive layer located below both sides of the gate electrode, wherein the semiconductor device functions as a nonvolatile memory cell.

11. A semiconductor device comprising:

a substrate having a conductive layer;

a first $SiO_2$ layer formed on the conductive layer;

a $SiO_xN_y$ layer ($0 \leq x < 2$, $0 < y \leq 4/3$) formed on the first $SiO_2$ layer;

a second $SiO_2$ layer formed on the $SiO_xN_y$ layer; and a charge holder formed on the second $SiO_2$ layer.

12. The semiconductor device of claim 11, further comprising:

an insulating layer formed on the charge holder;

a gate electrode formed on the insulating layer; and source/drain regions formed by introducing an impurity into regions of the conductive layer located below both sides of the gate electrode, wherein the semiconductor device functions as a nonvolatile memory cell.

13. A semiconductor device comprising:

a substrate having a conductive layer;

a first tunnel barrier film formed on the conductive layer;

a quantized semiconductor layer formed on the first tunnel barrier film;

a second tunnel barrier film formed on the first tunnel barrier film and the semiconductor layer;

quantized semiconductor particles formed on the second tunnel barrier film in a state of being isolated from one another; and an insulating film formed on the second tunnel barrier film and the semiconductor particles.

14. The semiconductor device of claim 13, wherein the discrete energy width of the semiconductor layer is smaller than the discrete energy width of the semiconductor particles.

15. The semiconductor device of claim 13, wherein the semiconductor layer comprises a particle group composed of particles in contact with one another.

16. The semiconductor device of claim 13, further comprising:

a gate electrode formed on the insulating film; and source/drain regions formed in regions of the substrate located below both sides of the gate electrode, wherein the semiconductor device functions as a MIS transistor.

17. A semiconductor device comprising:

a substrate having a conductive layer;

a first insulating layer formed on the conductive layer;

first particles formed on the first insulating layer;

a first barrier layer formed on the first particles for functioning as a barrier for charge transfer;

second particles formed on the first barrier layer;

a second barrier layer formed on the second particles for functioning as a barrier for charge transfer; and third particles formed on the second barrier layer, wherein the potential at each of the first and third particles against charge to be held or released is lower than the potential at the second particles.

18. The semiconductor device of claim 17, wherein the charge to be held or released is electrons, and the electron affinity of each of the first and third particles is larger than the electron affinity of the second particles.

19. The semiconductor device of claim 17, wherein the charge to be held or released is holes, and the sum of the electron affinity and the forbidden bandwidth of each of the first and third particles is smaller than the sum of the electron affinity and the forbidden bandwidth of the second particles.

20. The semiconductor device of claim 17, further comprising:
an insulating layer formed on the third particles;
a gate electrode formed on the insulating layer; and
source/drain regions formed in regions of the conductive layer located below both sides of the gate electrode,
wherein the semiconductor device functions as a MIS transistor.

21. A semiconductor device comprising:
a substrate having a conductive layer;
a first insulating layer formed on the conductive layer;
first particles formed on the first insulating layer;
a first barrier layer formed on the first particles for functioning as a barrier for charge transfer;
second particles formed on the first barrier layer;
a second barrier layer formed on the second particles for functioning as a barrier for charge transfer; and
third particles formed on the second barrier layer,
wherein the diameter of each of the first and third particles is larger than the diameter of the second particles.

22. The semiconductor device of claim 21, wherein a ratio of the diameter of each of the first and third particles to the second particles is not less than 1.8 and not more than 300.

23. The semiconductor device of claim 21, wherein the diameter of the second particles is not less than 0.1 nm and not more than 5 nm.

24. The semiconductor device of claim 21, wherein the diameter of each of the first and third particles is not less than 1 nm and not more than 30 nm.

25. The semiconductor device of claim 21, further comprising:
an insulating layer formed on the third particles;
a gate electrode formed on the insulating layer; and
source/drain regions formed in regions of the conductive layer located below both sides of the gate electrode,
wherein the semiconductor device functions as a MIS transistor.

26. A semiconductor device comprising:
a substrate having a conductive layer; and
a charge holding region including a barrier layer formed on the conductive layer for functioning as a barrier for charge transfer and a plurality of particles dispersed in the barrier layer so that the particles have different distances from the conductive layer from each other,
wherein a barrier height at portions among the particles in the charge holding region is smaller as the distance from the conductive layer is smaller.

27. The semiconductor device of claim 26, wherein the particles have a smaller electron affinity or a larger sum of the electron affinity and the forbidden bandwidth as the distance from the conductive layer is smaller.

28. The semiconductor device of claim 26, wherein the barrier layer has a larger electron affinity or a smaller sum of the electron affinity and the forbidden bandwidth as the distance from the conductive layer is smaller.

29. The semiconductor device of claim 26, wherein the particles are quantized.

30. The semiconductor device of claim 26, wherein the plurality of particles are divided into a plurality of particle groups each composed of a plurality of particles common in distance from the conductive layer.

31. The semiconductor device of claim 26, further comprising:
an insulating layer formed on the barrier layer;
a gate electrode formed on the insulating layer; and
source/drain regions formed by introducing an impurity into regions of the substrate located below both sides of the gate electrode,
wherein the semiconductor device functions as a MIS transistor.

32. A semiconductor device comprising:
a substrate having a conductive layer;
a first barrier layer formed on the conductive layer for functioning as a barrier for charge transfer;
first particles formed on the first barrier layer;
a second barrier layer formed on the first particles for functioning as a barrier for charge transfer; and
second particles formed on the second barrier layer;
wherein a potential at the second particles against charge to be held or released is lower than a potential at the first particles.

33. The semiconductor device of claim 32, further comprising:
an insulating layer formed on the second particles,
a gate electrode formed on the insulating layer; and
source/drain regions formed in regions of the conductive layer located below both sides of the gate electrode,
wherein the semiconductor device functions as a MIS transistor.

34. The semiconductor device of claim 32, wherein the charge to be held or released is electrons, and the electron affinity of the second particles is larger than the electron affinity of the first particles.

35. The semiconductor device of claim 34, wherein the conductive layer is a semiconductor layer, and the electron affinity of the second particles is larger than the electron affinity of the semiconductor layer.

36. The semiconductor device of claim 32, wherein the charge to be held or released is holes, and the sum of the electron affinity and the forbidden bandwidth of the second particles is smaller than the sum of the electron affinity and the forbidden bandwidth of the first particles.

37. The semiconductor device of claim 34, wherein the conductive layer is a semiconductor layer, and the sum of the electron affinity and the forbidden bandwidth of the second particles is smaller than the sum of the electron affinity and the forbidden bandwidth of the semiconductor layer.

* * * * *

UNITED STATES PATENT AND TRADEMARK OFFICE
CERTIFICATE OF CORRECTION

PATENT NO.    : 6,548,825 B1
DATED         : April 15, 2003
INVENTOR(S)   : Shigeo Yoshii et al.

It is certified that error appears in the above-identified patent and that said Letters Patent is hereby corrected as shown below:

<u>Column 76,</u>
Line 52, change "dispersed-at" to -- dispersed at --

Signed and Sealed this

Eighteenth Day of November, 2003

JAMES E. ROGAN
*Director of the United States Patent and Trademark Office*